(12) United States Patent
Seo et al.

(10) Patent No.: US 12,419,179 B2
(45) Date of Patent: Sep. 16, 2025

(54) COLOR CONVERSION PANEL AND DISPLAY DEVICE INCLUDING THE SAME

(71) Applicant: Samsung Display Co., LTD., Yongin-si (KR)

(72) Inventors: Seunghui Seo, Pyeongtaek-si (KR); Tae Woo Lim, Cheonan-si (KR); Moon-Keun Choi, Hwaseong-si (KR); Wal Jun Kim, Hwaseong-si (KR); Hyunbae Park, Seoul (KR); Hyelynn Song, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 462 days.

(21) Appl. No.: 18/166,593

(22) Filed: Feb. 9, 2023

(65) Prior Publication Data
US 2023/0363232 A1   Nov. 9, 2023

(30) Foreign Application Priority Data
May 3, 2022   (KR) ........................ 10-2022-0055034

(51) Int. Cl.
*H10K 59/38* (2023.01)
*G02B 5/20* (2006.01)
*H10K 59/122* (2023.01)

(52) U.S. Cl.
CPC ........... *H10K 59/38* (2023.02); *H10K 59/122* (2023.02); *G02B 5/201* (2013.01)

(58) Field of Classification Search
None
See application file for complete search history.

(56) References Cited

U.S. PATENT DOCUMENTS

| 11,222,560 | B2 | 1/2022 | Lee et al. |
| 2020/0020260 | A1* | 1/2020 | Lee ........................ G09G 3/006 |
| 2021/0273022 | A1* | 9/2021 | Park ........................ G02B 5/26 |

FOREIGN PATENT DOCUMENTS

| KR | 1020170121749 A | 11/2017 |
| KR | 1020180078409 A | 7/2018 |
| KR | 1020200008083 A | 1/2020 |

* cited by examiner

*Primary Examiner* — Nduka E Ojeh
(74) *Attorney, Agent, or Firm* — CANTOR COLBURN LLP

(57) ABSTRACT

A color conversion panel includes a substrate including a display area including a color conversion layer, a first pixel area, a second pixel area, and a non-pixel area, and a plurality of color filter layers on the substrate. The color filter layers include a first color filter layer in the first pixel area and defining in the non-pixel area, a first alignment pattern, and a first opening spaced from the first alignment pattern, the first pixel area and the second pixel area, and a second color filter layer in the second pixel area, covering the first alignment pattern of the first color filter layer and defining in the non-pixel area a second alignment pattern which overlaps the first opening of the first color filter layer and exposes a portion of the first color filter layer at the first opening, to outside the second color filter layer.

20 Claims, 35 Drawing Sheets

CF:CF1,CF2,CF3

COLOR CONVERSION PANEL AND DISPLAY DEVICE INCLUDING THE SAME

This application claims priority to Korean Patent Application No. 10-2022-0055034 filed on May 3, 2022, and all the benefits accruing therefrom under 35 U.S.C. § 119, the entire disclosure of which is incorporated by reference herein.

BACKGROUND

1. Field

Embodiments relate to a display device. More particularly, embodiments relate to a color conversion panel and a display device including the same.

2. Description of the Related Art

The display device is a device that displays an image for providing visual information to a user. The display device may include a display panel and a color conversion panel on the display panel.

The color conversion panel may be exposed with the plurality of shots (e.g., exposure process using light, developer, etc.) using a plurality of masks. As the size of the color conversion panel increases, the size of the mask may increase to expose the color conversion panel with one shot or in a single exposure process. When the size of the mask increases, cost of manufacturing or providing the color conversion panel may increase. Accordingly, when the color conversion panel is divided into a plurality of shot areas which are exposed to form layers of the color conversion panel, a relatively small mask can be used, thereby preventing an increase in the manufacturing cost of the color conversion panel.

SUMMARY

When a color conversion panel is exposed with a plurality of shots (e.g., a plurality exposure processes), stitch errors including shift, rotation, and distortion may occur at the boundary between the plurality of shot areas. When the stitch error occurs, electrical characteristics of the color conversion panel may be deteriorated, and a stitch stain may be visually recognized in the color conversion panel. Accordingly, by inspecting the stitch error using alignment patterns, it is possible to prevent deterioration of the electrical characteristics of the color conversion panel or the recognition of stitch stains.

Embodiments provide a color conversion panel that facilitates monitoring of stitch errors.

Other embodiments provide a display device including the color conversion panel.

A color conversion panel according to an embodiment may include a substrate including an active area including first pixel areas, second pixel areas, and a non-pixel area between the first pixel areas and the second pixel areas, a first color filter layer on the substrate, overlapping the first pixel areas, and including a first alignment pattern and a first opening pattern in the non-pixel area and a second color filter layer on the first color filter layer, overlapping the second pixel areas, covering the first alignment pattern, and including a second alignment pattern, where the second alignment pattern overlaps the first opening pattern and partially exposes the first color filter layer.

In an embodiment, a portion of the second color filter layer overlapping the first opening pattern may be on the same layer as the first color filter layer.

In an embodiment, the color conversion panel may further include a third color filter layer on the second color filter layer.

In an embodiment, the active area may further include third pixel areas, the first color filter layer may further include a second opening pattern disposed in the non-pixel area and spaced apart from the first to third pixel areas, the second color filter layer may further include a third opening pattern overlapping the second opening pattern and partially exposing the first color filter layer, and the third color filter layer may overlap the third pixel areas, covers the second alignment pattern, and include a third alignment pattern overlapping the second opening pattern and the third opening pattern and partially exposing the first color filter layer.

In an embodiment, a portion of the third color filter layer overlapping the second opening pattern and the third opening pattern may be on the same layer as the first color filter layer.

In an embodiment, the color conversion panel may further include a partition layer on the third color filter layer and covering the third alignment pattern.

In an embodiment, the color conversion panel may further include a spacer disposed in the non-pixel area on the partition layer.

In an embodiment, the spacer may have a quadrangular shape and a frame shape.

In an embodiment, the first alignment pattern may be symmetrical with respect to a first axis, each of the first opening pattern and the second alignment pattern may be symmetrical with respect to a second axis, and each of the second opening pattern, the third opening pattern, and the third alignment pattern may be symmetrical with respect to a third axis.

A color conversion panel according to an embodiment may include a substrate including an active area including first pixel areas, second pixel areas, and a non-pixel area between the first pixel areas and the second pixel areas, a first color filter layer on the substrate, overlapping the first pixel areas, and including a fourth opening pattern in the non-pixel area, a second color filter layer on the first color filter layer, overlapping the second pixel areas, and including a fifth opening pattern overlapping the fourth opening pattern, a low refractive index layer on the second color filter layer and a partition layer on the low refractive index layer and including a fourth alignment pattern, where the fourth alignment pattern overlaps the fourth opening pattern and the fifth opening pattern and exposes at least one of the first color filter layer and the second color filter layer.

In an embodiment, the low refractive index layer may include a first portion and a second portion, the first portion may overlap the fourth alignment pattern and overlap at least one of the first color filter layer and the second color filter layer, the second portion may overlap the fourth alignment pattern and may not overlap the first color filter layer and the second color filter layer, and a height of the first portion may be less than a height of the second portion.

In an embodiment, the color conversion panel may further include a third color filter layer between the second color filter layer and the low refractive index layer.

In an embodiment, the active area may further include third pixel areas, the third color filter layer may overlap the third pixel areas and include a sixth opening pattern overlapping the fourth opening pattern, the fifth opening pattern, and the fourth alignment pattern, and the fourth alignment pattern may expose at least one of the first color filter layer and the second color filter layer, and the third color filter layer.

In an embodiment, the color conversion panel may further include a spacer disposed in the non-pixel area on the partition layer and covering the fourth alignment pattern.

In an embodiment, the first color filter layer may further include a seventh opening pattern in the non-pixel area, the second color filter layer may further include an eighth opening pattern overlapping the seventh opening pattern, the third color filter layer may further include a ninth opening pattern overlapping the seventh opening pattern and the eighth opening pattern, the partition layer may include a tenth opening pattern overlapping the seventh opening pattern, the eighth opening pattern, and the ninth opening pattern, and the spacer may include a fifth alignment pattern overlapping the seventh opening pattern, the eighth opening pattern, the ninth opening pattern, and the tenth opening pattern and exposing at least one of the first color filter layer, and the second color filter layer, and the third color filter layer.

In an embodiment, the low refractive index layer may include a third portion and a fourth portion, the third portion may overlap the fifth alignment pattern and overlap at least one of the first color filter layer, the second color filter layer, and the third color filter layer, the fourth portion may overlap the fifth alignment pattern and may not overlap the first color filter layer, the second color filter layer, and the third color filter layer, and a height of the third portion may be less than a height of the fourth portion.

In an embodiment, each of the fourth opening pattern, the fifth opening pattern, the sixth opening pattern, and the fourth alignment pattern may be symmetrical with respect to a fourth axis, and each of the seventh opening pattern, the eighth opening pattern, the ninth opening pattern, and the fifth alignment pattern may be symmetrical with respect to a fifth axis.

A display device according to an embodiment may include a display panel and a color conversion panel on the display panel, the color conversion panel may include a first substrate including an active area including first pixel areas, second pixel areas, third pixel areas and a non-pixel area between the first pixel areas, the second pixel areas, and the third pixel areas, a first color filter layer under the first substrate, overlapping the first pixel areas, and including a first alignment pattern, a first opening pattern, and a second opening pattern in the non-display area, a second color filter layer under the first color filter layer, overlapping the second pixel areas, covering the first alignment pattern, and including a second alignment pattern and a third opening pattern, where the second alignment pattern overlaps the first opening pattern and partially exposes the first color filter layer, and the third opening pattern overlaps the second opening pattern and partially exposes the first color filter layer and a third color filter layer under the second color filter layer, overlapping the third pixel areas, covering the second alignment pattern, and including a third alignment pattern overlapping the second opening pattern and the third opening pattern and partially exposing the first color filter layer.

In an embodiment, the display panel may include a light emitting diode disposed in each of the first pixel areas, the second pixel areas, and the third pixel areas.

In an embodiment, the color conversion panel may further include transmission parts, first color conversion parts, and second color conversion parts, the transmission parts may be disposed under the third color filter layer and overlap the first pixel areas, respectively, the first color conversion parts may be disposed under the third color filter layer and overlap the second pixel areas, respectively, and the second color conversion parts may be disposed under the third color filter layer and overlap the third pixel areas, respectively.

In the color conversion panel according to embodiments of the present disclosure, since the color conversion panel includes the alignment patterns and the opening patterns in the active area, the stitch error between the shot areas may be measured. Accordingly, monitoring during the manufacturing process of the color conversion panel may be facilitated.

In addition, a portion of the second color filter layer overlapping the first opening pattern may be disposed on the same layer as the first color filter layer, and a portion of the third color filter layer overlapping the second opening pattern and the third opening pattern may be disposed on the same layer as the first color filter layer, so that the first color filter layer and the second color filter layer or the third color filter layer may have a similar height to each other. Accordingly, the step difference between the color filter layers may be minimized, and thus the gray scale difference may be minimized. By minimizing the gray scale difference, it is possible to simultaneously focus the alignment patterns, and the measurement of the stitch error between the shot areas may be facilitated.

In addition, since the low refractive index layer on the color filter layers may include a portion overlapping the color filter layers, and a height of a portion overlapping the color filter layers among the low refractive index layer may be less than a height of a non-overlapping portion, a height of the portion overlapping the color filter layers among the low refractive index layer may be minimized. Accordingly, a fringing phenomenon caused by the low refractive index layer may be prevented. The first to third color filter layers under the low refractive index layer may be visually recognized. Accordingly, due to the opening patterns included in each of the first to third color filter layers, each of the partition layer and the spacer may be aligned with respect to at least one of the first to third color filter layers.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
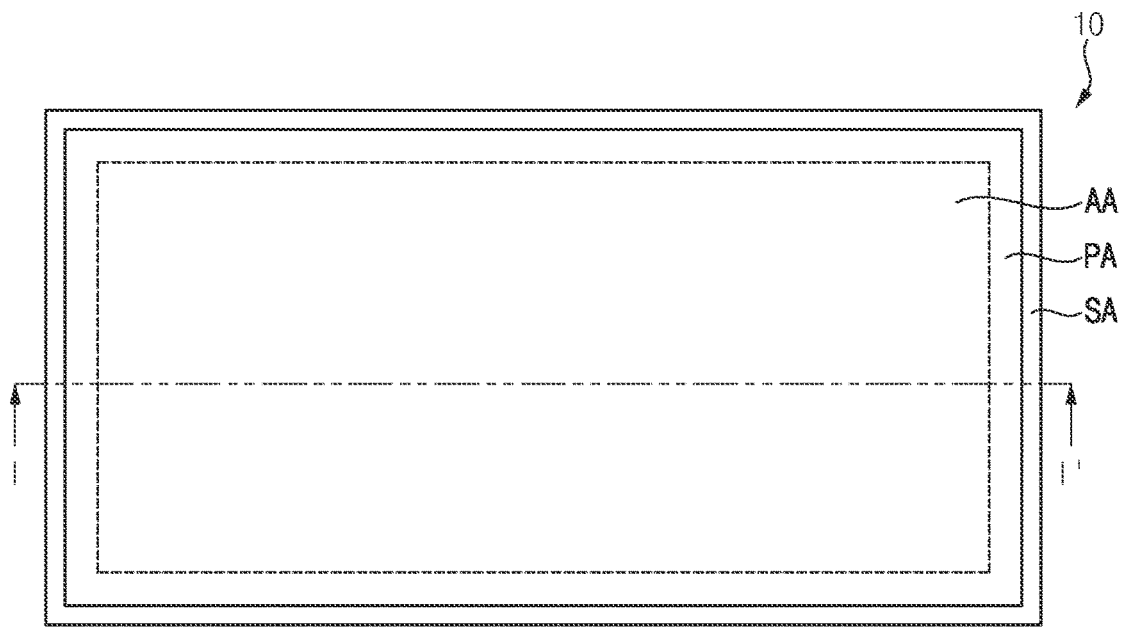
FIG. 1 is a plan view illustrating a display device according to an embodiment.
Figure 1:
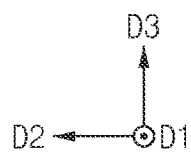

Hereinafter, display devices in accordance with embodiments will be described in more detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. The same reference numerals are used for the same components in the drawings, and redundant descriptions of the same components will be omitted.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, a reference number labeling a singular form of an element within the drawing figures may be used to reference a plurality of the singular element within the text of specification.

As used herein, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
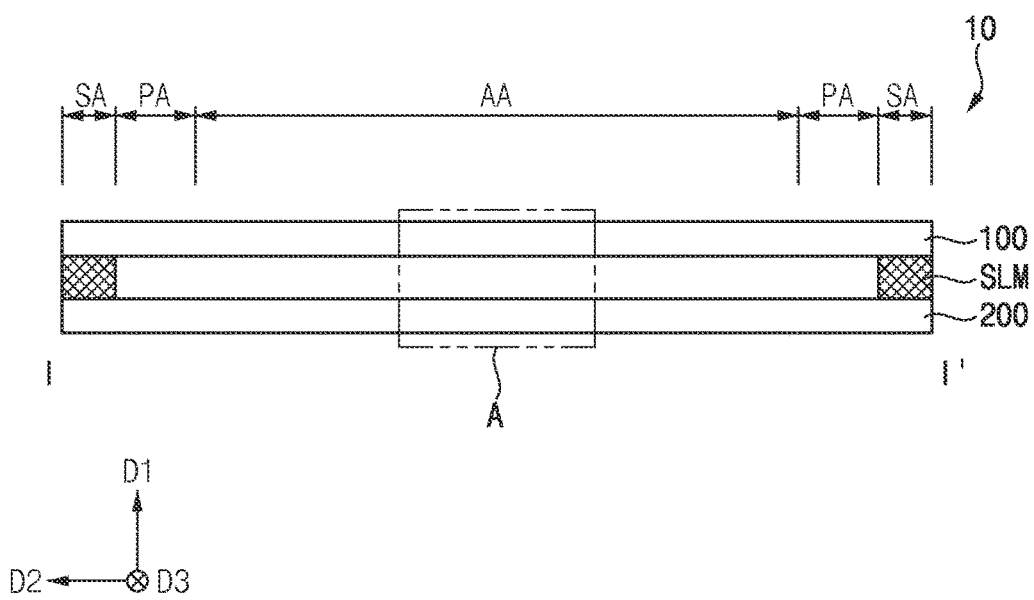
FIG. 2 is a cross-sectional view taken along line I-I' of FIG. 1.

FIG. 1 is a plan view illustrating a display device 10 according to an embodiment. FIG. 2 is a cross-sectional view taken along line I-I' of FIG. 1.

Referring to FIGS. 1 and 2, a display device 10 may include a color conversion panel 100, a display panel 200, and a sealing member SLM. The color conversion panel 100 may be disposed on the display panel 200 and face the display panel 200. The color conversion panel 100 may be disposed in a first direction D1 from the display panel 200, such as along a thickness direction of the display device 10. For example, the first direction D1 may be a front direction of the display device 10 from the display panel 200. The sealing member SLM may be disposed between the display panel 200 and the color conversion panel 100. The sealing member SLM may couple the display panel 200 and the color conversion panel 100 to each other.

The display device 10 may have a long rectangular shape in the second direction D2, that is, a major dimension in the second direction D2. The second direction D2 crosses the first direction D1, and may be perpendicular to the first direction D1. However, embodiments according to the present disclosure are not limited thereto. The display device 10 may be disposed in a plane defined by a second direction D2 and a third direction D3 which cross each other.

The display device 10 may include an active area AA at which an image is displayed, a peripheral area PA disposed outside the active area AA, and a sealing area SA disposed outside the peripheral area PA. As being outside, an area may be closer to an end or outer edge of the display device 10. For example, the active area AA may be a display area, the peripheral area PA may be a non-display area, and the sealing area SA may be an area in which the color conversion panel 100 and the display panel 200 included in the display device 10 is coupled to each other. The peripheral area PA may be adjacent to the active area AA in a plan view (e.g., view along the thickness direction, or a view of the plane defined by the second direction D2 and the third direction D3 crossing each other), and the sealing area SA may be adjacent to the peripheral area PA in a plan view. In an embodiment, the peripheral area PA may surround the active area AA in a plan view, and the sealing area SA may surround the peripheral area PA in a plan view.

The display panel 200 may include a plurality of pixels which emit light, generate an image, etc., and be referred to as a display substrate. The pixels may be disposed in the active area AA of the display panel 200. Each of the pixels may include a driving element and a light emitting diode which is connected to the driving element and driven thereby. The driving element may include at least one thin film transistor. The light emitting diode may generate light according to a driving signal. For example, the light emitting diode may be an inorganic light emitting diode or an organic light emitting diode.

The color conversion panel 100 may include a color conversion layer and be referred to as a color conversion substrate. The color conversion layer may be disposed in the active area AA and convert a wavelength of light generated from the light emitting diode of the display panel 200. The color conversion panel 100 may further include a color filter layer that transmits light of a specific color.

The sealing member SLM may couple the display panel 200 and the color conversion panel 100 to each other. The sealing member SLM may be disposed between the display panel 200 and the color conversion panel 100, and may be disposed in the sealing area SA. For example, the sealing member SLM may be disposed in the sealing area SA between the display panel 200 and the color conversion panel 100 to be adjacent to or surround the peripheral area PA in the plan view. For example, the sealing member SLM may have an enclosed planar shape of a hollow quadrangle. However, embodiments of the present disclosure are not limited thereto, and the sealing member SLM may have various planar shapes depending on the planar shape of the lower display panel 200 or the color conversion panel 100. For example, when the display panel 200 or the color conversion panel 100 has a planar shape such as a triangle, a rhombus, a polygon, a circle, or an oval, the sealing member SLM may have a planar shape such as a hollow triangle, a hollow rhombus, a hollow polygon, a hollow circle, or a hollow oval as the enclosed shape.

In an embodiment, a filling layer (not shown) may be disposed between the display panel 200 and the color conversion panel 100. For example, the filling layer may act as a buffer against external pressure applied to the display device 10. For example, the filling layer may maintain a gap along the thickness direction, between the display panel 200 and the color conversion panel 100.

Figure 3:
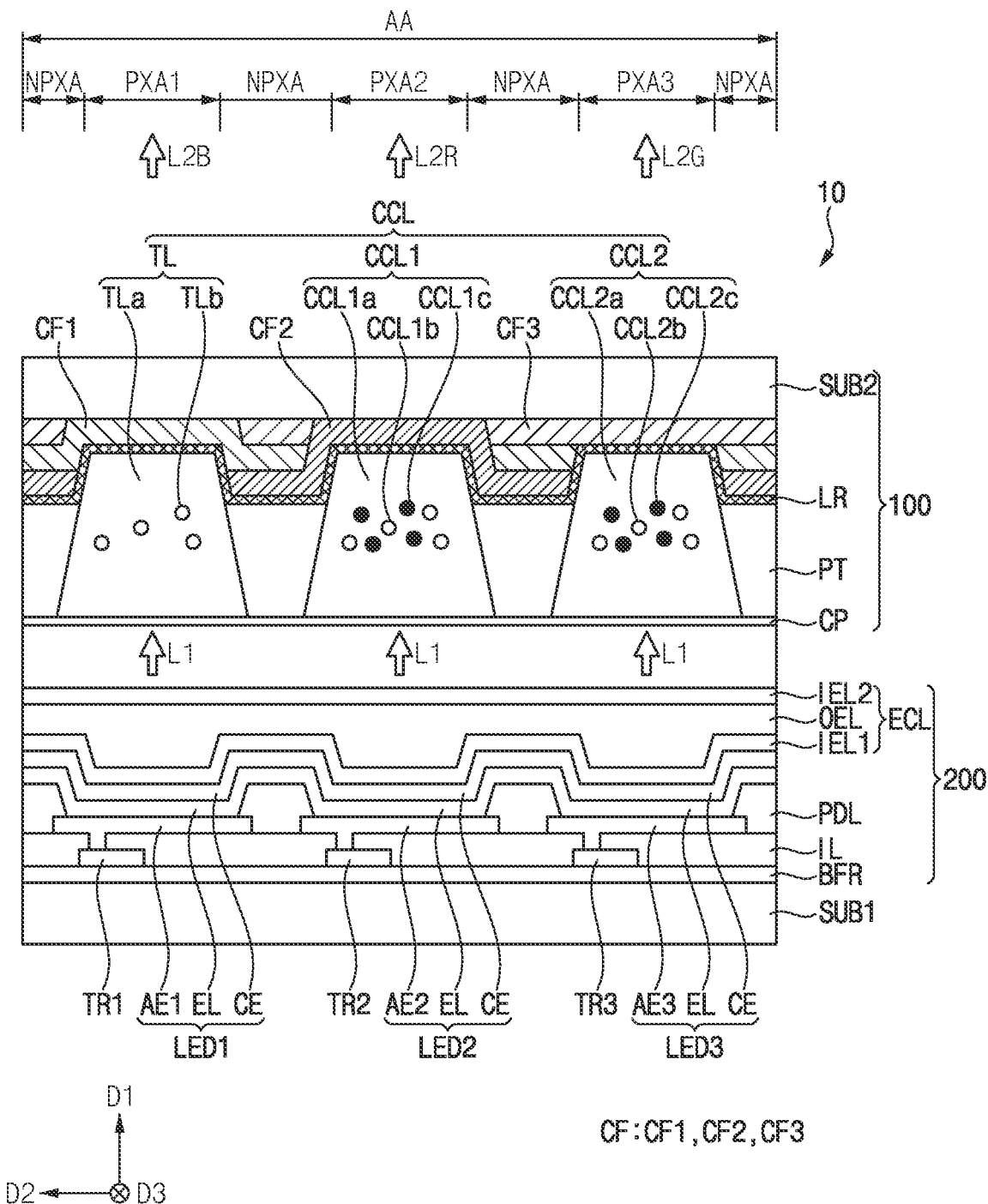
FIG. 3 is an enlarged cross-sectional view of area A of FIG. 2.

FIG. 3 is an enlarged cross-sectional view of area A of FIG. 2.

Referring to FIGS. 1 to 3, the active area AA may include a pixel area and a non-pixel area NPXA. The pixel area together with the non-pixel area NPXA may define the pixels of the display device 10. Light (hereinafter, incident light) L1 generated by the display panel 200 and incident to the color conversion panel 100 may be emitted to the outside of the display device 10, through the pixel area. The pixel area may be provided in plural having a plurality of pixel areas including first to third pixel areas PXA1, PXA2, and PXA3 for emitting light of different colors. For example, a first transmitted light L2B having a blue color may be emitted from the first pixel area PXA1, a second transmitted light L2R having a red color may be emitted from the second pixel area PXA2, and a third transmitted light L2G having a green color may be emitted from the third pixel area PXA3.

In an embodiment, the first to third pixel areas PXA1, PXA2, and PXA3 may be spaced apart from each other along the display panel 200, in the plan view and arranged to repeat each other. The non-pixel area NPXA may be disposed between the first to third pixel areas PXA1, PXA2, and PXA3 in the plan view. The non-pixel are NPXA may surround the first to third pixel areas PXA1, PXA2, and PXA3. For example, the non-pixel area NPXA may have a grid shape in the plan view.

In an embodiment, the display panel 200 may include a first substrate SUB1, a buffer layer BFR, first to third driving elements TR1, TR2, TR3, an insulation layer IL, a pixel defining layer PDL, first to third light emitting diodes LED1, LED2, LED3, and an encapsulation layer ECL.

The first substrate SUB1 may have the active area AA, the peripheral area PA, and the sealing area SA, as the display device 10 includes the active area AA, the peripheral area PA, and the sealing area SA. That is, various components or layers of the display device 10 may have an active area AA, a peripheral area PA and a sealing area SA respectively corresponding to those described above.

The first substrate SUB1 may be an insulating substrate formed of (or including) a transparent or opaque material. In an embodiment, the first substrate SUB1 may include glass. In this case, the display panel 200 may be a rigid display substrate. In another embodiment, the first substrate SUB1 may include plastic. In this case, the display panel 200 may be a flexible display substrate.

The buffer layer BFR may be disposed on the first substrate SUB1. The buffer layer BFR may prevent impurities such as oxygen and moisture from diffusing onto the first substrate SUB1 through the first substrate SUB1.

The first to third driving elements TR1, TR2, and TR3 may be disposed in the active area AA, on the buffer layer BFR. Each of the first to third driving elements TR1, TR2, and TR3 may include at least one thin film transistor. The channel layer of the thin film transistor may include an oxide semiconductor, a silicon semiconductor, an organic semiconductor, or the like.

The insulation layer IL may cover the first to third driving elements TR1, TR2, and TR3. The insulation layer IL may include a combination of an inorganic insulation layer and an organic insulation layer.

The first to third light emitting diodes LED1, LED2, and LED3 may be disposed on the insulation layer IL. For example, first to third pixel electrodes AE1, AE2, and AE3 may be disposed on the insulation layer IL. Each of the first to third pixel electrodes AE1, AE2, and AE3 may include a conductive material such as a metal, an alloy, a conductive metal nitride, a conductive metal oxide, or a transparent conductive material. Each of the first to third pixel electrodes AE1, AE2, and AE3 may have a single-layer structure or a multi-layer structure including a plurality of conductive layers.

The first to third light emitting diodes LED1, LED2, and LED3 may be respectively disposed in the first to third pixel areas PXA1, PXA2, and PXA3. The first to third pixel electrodes AE1, AE2, and AE3 may be electrically connected to the first to third driving elements TR1, TR2, and TR3, through contact holes formed in (or provided in) the insulation layer IL, respectively.

The pixel defining layer PDL may be disposed on the first to third pixel electrodes AE1, AE2, and AE3. The pixel defining layer PDL may include an organic material. The pixel defining layer PDL may define a pixel opening exposing at least a portion of each of the first to third pixel electrodes AE1, AE2, and AE3 to outside the pixel defining layer PDL.

A emission layer EL may be disposed on the first to third pixel electrodes AE1, AE2, and AE3 which are exposed by the pixel opening of the pixel defining layer PDL to outside thereof. In an embodiment, the emission layer EL may extend continuously on the active area AA across a plurality of pixels, such as to define a single layer. In another embodiment, the emission layer EL may be separated from the emission layer of an adjacent pixel, that is, may be defined by a collection of patterns or discrete patterns along the first substrate SUB1.

The emission layer EL may include at least one of an organic light emitting material and quantum dots. In an embodiment, the emission layer EL may generate blue light. However, embodiments of the present disclosure are not limited thereto. In another embodiment, the emission layer EL may generate red light or green light, or may generate lights having different colors according to pixels.

For example, all of the emission layers EL may include an organic material for emitting blue light. In this case, the emission layer EL may be formed in multiple layers, and may have a structure in which a plurality of blue organic emission layers are stacked, such as along the thickness direction. For example, the emission layer EL may have a structure in which three blue organic emission layers are stacked.

However, embodiments according to the present disclosure are not limited thereto, and the emission layer EL may have a structure in which a plurality of blue organic emission layers and an organic emission layer emitting light of different colors are stacked. For example, the emission layer EL may have a structure in which three blue organic emission layers and one green organic emission layer are stacked. In an embodiment, functional layers such as a hole injection layer, a hole transport layer, an electron transport layer, and an electron injection layer may be disposed on the upper and/or lower portions of the emission layer EL.

A common electrode CE may be disposed on the emission layer EL. The common electrode CE may include a conductive material such as a metal, an alloy, a conductive metal nitride, a conductive metal oxide, or a transparent conductive material. The common electrode CE may have a single-layer structure or a multi-layer structure including a plurality of conductive layers. In an embodiment, the common electrode CE may extend continuously on the active area AA across a plurality of pixels.

The first pixel electrode AE1, the emission layer EL and the common electrode CE may together form the first light emitting diode LED1, and the second pixel electrode AE2, the emission layer EL and the common electrode CE may together form the second light emitting diode LED2, and the third pixel electrode AE3, the emission layer EL and the common electrode CE may together form the third light emitting element LED3.

The encapsulation layer ECL may be disposed on the common electrode CE. The encapsulation layer ECL may include at least one inorganic encapsulation layer and at least one organic encapsulation layer. In an embodiment, the encapsulation layer ECL may include a first inorganic encapsulation layer IEL1 disposed on the common electrode CE, and an organic encapsulation layer OEL disposed on the first inorganic encapsulation layer IEL1 and a second inorganic encapsulation layer IEL2 disposed on the organic encapsulation layer OEL.

The color conversion panel 100 may be disposed in the first direction D1 from the encapsulation layer ECL. Hereinafter, the first direction D1 may be referred to as a front direction, a thickness direction or a light emitting direction.

In an embodiment, the color conversion panel 100 may include a second substrate SUB2, a color filter layer CF, a low refractive index layer LR, a partition layer PT, a spacer CS, a color conversion layer CCL, a protective layer PL, and a capping layer CP.

The second substrate SUB2 may include the active area AA, the peripheral area PA, and the sealing area SA, as the first substrate SUB1 includes the active area AA, the peripheral area PA, and the sealing area SA described above.

The second substrate SUB2 may be an insulating substrate formed of a transparent material. The second substrate SUB2 may include glass or plastic.

The color filter layer CF may be disposed under the second substrate SUB2. For example, the color filter layer CF may be disposed under the second substrate SUB2 and overlap the active area AA. The color filter layer CF may include a plurality of color filter patterns such as a first color filter layer CF1 (e.g., first color filter pattern), a second color filter layer CF2 (e.g., a second color filter pattern), and a third color filter layer CF3 (e.g., a third color filter pattern). For example, the first color filter layer CF1 may be a blue color filter layer, the second color filter layer CF2 may be a red color filter layer, and the third color filter layer CF3 may be a green color filter layer. However, embodiments according to the present disclosure are not limited thereto.

The first color filter layer CF1 may overlap (or correspond to) the first pixel areas PXA1 and selectively transmit a first color light (e.g., blue light). The second color filter layer CF2 may overlap the second pixel areas PXA2 and selectively transmit a second color light (e.g., red light). The third color filter layer CF3 may overlap the third pixel areas PXA3 and selectively transmit a third color light (e.g., green light).

In an embodiment, each of the first color filter layer CF1, the second color filter layer CF2, and the third color filter layer CF3 may extend from the pixel area to further overlap the non-pixel area NPXA. That is, as shown in FIG. 3, the first color filter layer CF1 may overlap the first pixel area PXA1 and the non-pixel area NPXA, and may not overlap the second and third pixel areas PXA2 and PXA3. The second color filter layer CF2 may overlap the second pixel area PXA2 and the non-pixel area NPXA and may not overlap the first and third pixel areas PXA1 and PXA3. The third color filter layer CF3 may overlap the third pixel area PXA3 and the non-pixel area NPXA and may not overlap the first and second pixel areas PXA1 and PXA2. In this case, in the non-pixel area NPXA, the first to third color filter layers CF1, CF2, and CF3 may partially overlap each other. Accordingly, color mixing between the adjacent first to third pixel areas PXA1, PXA2, and PXA3 may be prevented.

The color filter layer CF in the active area AA may extend to the peripheral area PA and/or the sealing area SA. A portion of the color filter layer CF overlapping the peripheral area PA and the sealing area SA may serve as a light blocking member. In the peripheral area PA and the sealing area SA, patterns among the third color filter layer CF3, the second color filter layer CF2, and the first color filter layer CF1 may overlap in the first direction D1 to define the light blocking member. Accordingly, in the peripheral area PA and the sealing area SA, the color filter layer CF may effectively block light traveling in the first direction D1.

For example, the first color filter layer CF1 may be disposed on a bottom surface of the second substrate SUB2 in the peripheral area PA and the sealing area SA, and the second color filter layer CF2 may be disposed under the first color filter layer CF1, and the third color filter layer CF3 may be disposed under the second color filter layer CF2.

That is, the first color filter layer CF1, the second color filter layer CF2 and the third color filter layer CF3 in the peripheral area PA and/or the sealing area SA, may be in order from the second substrate SUB2, in a direction opposite to the first direction D1. However, the arrangement order in the embodiments according to the present disclosure is not limited thereto.

In the peripheral area PA and the sealing area SA, the color filter layer CF may prevent circuit structures such as wirings and a driving circuit disposed in the peripheral area PA of the first substrate SUB1 from being visually recognized from the outside of the display device 10. In addition, the color filter layer CF may prevent a light leakage phenomenon in which light reflected from the circuit structure or light emitted from the active area AA is emitted through the peripheral area PA and the sealing area SA of the second substrate SUB2.

The partition layer PT may be disposed in the active area AA under the third color filter layer CF3. The partition layer PT may include a plurality of banks or partition patterns spaced apart from each other along the display panel 200. A plurality of openings may be formed in the partition layer PT, such as respectively between the banks or the partition patterns. For example, as shown in FIG. 3, the openings of the partition layer PT may expose the first to third pixel areas PXA1, PXA2, and PXA3, respectively, to outside the partition layer PT. The partition layer PT may form a space for accommodating the ink composition for forming color-conversion patterns, in the process of forming the color conversion layer CCL. For example, the partition layer PT may entirely overlap the non-pixel area NPXA (e.g., may overlap an entirety of the non-pixel area NPXA) and may have a grid shape in the plan view.

In an embodiment, the partition layer PT may include an organic material. In an embodiment, the partition layer PT may further include a light blocking material. For example, at least a portion of the partition layer PT may include a light blocking material such as a black pigment, a dye, or carbon black.

In an embodiment, the low refractive index layer LR may be disposed under the color filter layer CF. The low refractive index layer LR may overlap the active area AA. For example, the low refractive index layer LR may cover the color filter layer CF overlapping the active area AA and the peripheral area PA under the second substrate SUB2. However, even after the low refractive index layer LR is formed, the first to third color filter layers CF1, CF2, and CF3 which are under the low refractive index layer LR may be visually recognizable, owing to characteristics of the low refractive index layer LR (e.g., material, thickness, etc.).

The low refractive index layer LR may have a smaller refractive index than a refractive index of the color conversion layer CCL. The low refractive index layer LR may improve light extraction efficiency to increase luminance and lifetime of the display device 10.

The color conversion layer CCL may be disposed under the low refractive index layer LR and may overlap the active area AA. The color conversion layer CCL may include color conversion parts or patterns disposed on a bottom surface of the low refractive index layer LR, to be spaced apart from each other along the color conversion layer CCL. In an embodiment, the color conversion layer CCL may include a plurality of patterns such as a transmission part TL provided in plural including transmission parts TL, a first color conversion part CCL1 provided in plural including first color conversion parts CCL1, and a second color conversion part CCL2 provided in plural including second color conversion parts CCL2. The transmission parts TL, the first color conversion parts CCL1, and the second color conversion parts CCL2 may be disposed in the active area AA, under the color filter layer CF, and may overlap the first to third pixel areas PXA1, PXA2, and PXA3, respectively. For example, the transmission parts TL, the first color conversion parts CCL1, and the second color conversion parts CCL2 may be respectively disposed in the openings of the partition layer PT.

The first color conversion parts CCL1 may overlap the second pixel areas PXA2, respectively. The first color conversion part CCL1 may convert the incident light L1 into a first transmitted light L2R having a red color. For example, the first color conversion part CCL1 may include a resin part CCL1$a$, a scatterer CCL1$b$ (e.g., a light scatterer), and wavelength conversion particles CCL1$c$.

The scatterer CCL1$b$ may scatter the incident light L1 to increase a light path, without substantially changing the wavelength of the incident light L1 incident on the first color conversion part CCL1. The scatterer CCL1$b$ may include a metal oxide or an organic material. Optionally, the scatterer CCL1$b$ may be omitted.

In an embodiment, the wavelength conversion particles CCL1$c$ may include quantum dots. The quantum dots may be defined as semiconductor materials having nanocrystals. The quantum dots may absorb the incident light L1 and emit light having a wavelength different from that of the incident light L1. For example, the wavelength conversion particles CCL1$c$ of the first color conversion part CCL1 may include quantum dots that absorb the incident light L1 and emit first color light.

The scatterer CCL1$b$ and the wavelength conversion particles CCL1$c$ may be disposed in the resin part CCL1$a$. For example, the resin part CCL1$a$ may include an epoxy-based resin, an acrylic resin, a phenol-based resin, a melamine-based resin, a cardo-based resin, or an imide-based resin.

The first color conversion part CCL1 may convert the incident light L1 to emit the second transmitted light L2R having the second color. The incident light L1 that is not converted by the second color conversion part CCL1 may be blocked by the second color filter layer CF2. Accordingly, in the first pixel area PXA1, the first transmitted light L2R having the second color may be emitted to the outside (e.g., in the first direction D1) passing through the second substrate SUB2.

The second color conversion parts CCL2 may overlap the third pixel areas PXA3, respectively. The second color conversion part CCL2 may convert the incident light L1 into a third transmitted light L2G having the third color. For example, the second color conversion part CCL2 may include a resin part CCL2$a$, a scatterer CCL2$b$, and wavelength conversion particles CCL2$c$. The resin part CCL2$a$ and the scatterer CCL2$b$ of the second color conversion part CCL2 may be substantially the same as or similar to the resin part CCL1$a$ and the scatterer CCL1$b$ of the first color conversion part CCL1.

For example, the wavelength conversion particle CCL2$c$ of the second color conversion part CCL2 may include quantum dots that absorb the incident light L1 and emit green light. Accordingly, the second color conversion part CCL2 may convert the incident light L1 to emit the third transmitted light L2G having the third color. The incident light L1 that is not converted by the second color conversion part CCL2 may be blocked by the third color filter layer CF3. Accordingly, in the second pixel area PXA2, the third transmitted light L2G having the third color may be emitted to the outside (e.g., in the first direction D1) passing through the second substrate SUB2.

The transmission parts TL may overlap the first pixel areas PXA1, respectively. The transmission part TL may transmit the incident light L1 to emit the first transmitted light L2B. For example, the transmission part TL may include a resin part TL$a$ and a scatterer TL$b$. The resin part TL$a$ and the scatterer TL$b$ of the transmission part TL may be substantially the same as or similar to the resin part CCL1$a$ and the scatterer CCL1$b$ of the first color conversion part CCL1.

A portion of the incident light L1 may be blocked by the first color filter layer CF1. Accordingly, in the third pixel area PXA3, the third transmitted light L2B having a blue color may be emitted to the outside (e.g., in the first direction D1) passing through the second substrate SUB2. The third transmitted light L2B may be the incident light L1 which is not color-converted by passing through the transmission part TL.

In the first to third pixel areas PXA1, PXA2, and PXA3, as the first to third transmitted lights L2B, L2R, and L2G emitted to the outside through the second substrate SUB2 are combined, the image may be displayed in the active area AA, by the display device 10.

The capping layer CP may be disposed under the passivation layer PL. The capping layer CP may protect the color conversion layer CCL from oxygen, moisture, foreign substances, and the like. The capping layer CP may be disposed in an entirety of the active area AA, the peripheral area PA, and the sealing area SA That is, similar to the description above, the capping layer CP may be disposed in an entirety of the active area AA, the peripheral area PA, and the sealing area SA.

Hereinafter, the color conversion panel 100 will be described in detail.

Figure 4:
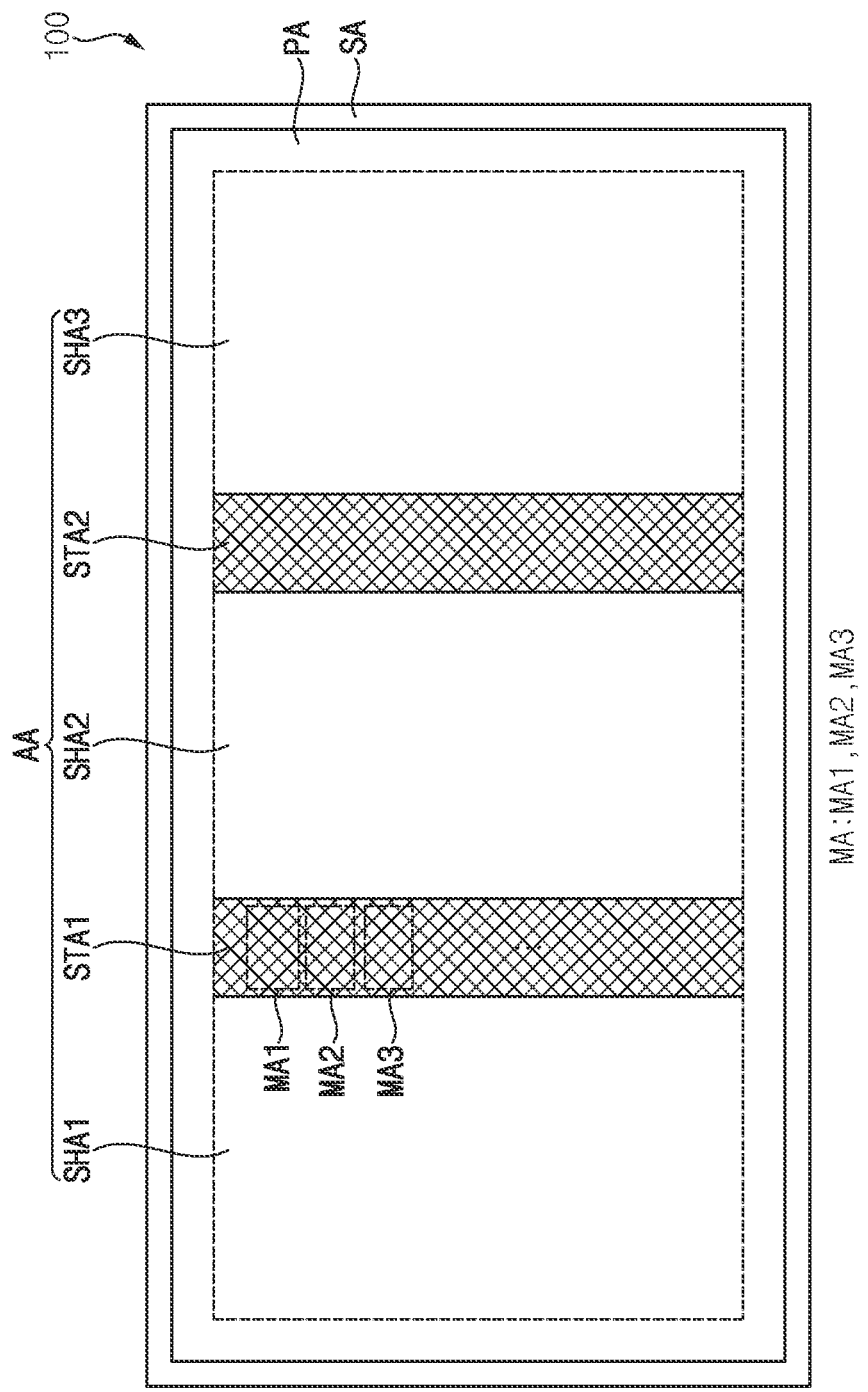
FIG. 4 is a plan view illustrating a color conversion panel according to an embodiment of the present disclosure.
Figure 5A:
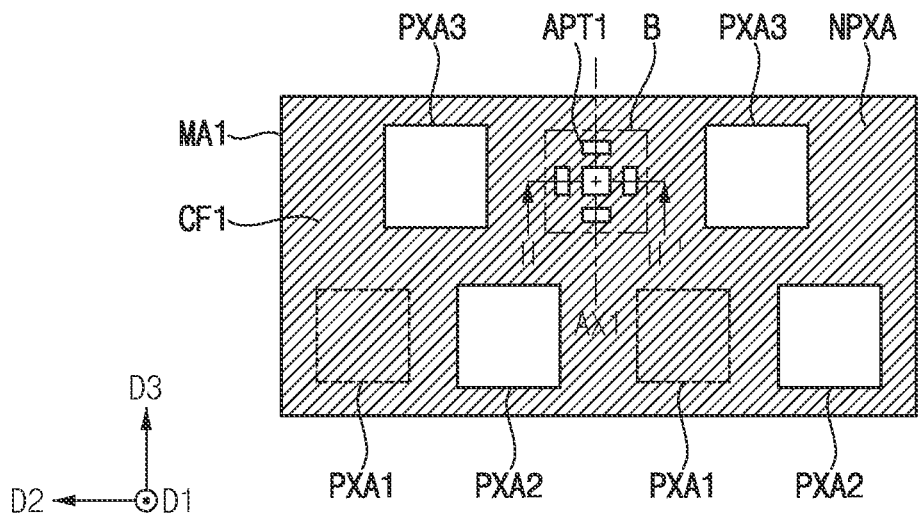
FIGS. 5A, 5B and 5C are enlarged plan views of a first measurement area, a second measurement area, and a third measurement area of the first color filter layer included in the color conversion panel of FIG. 4, respectively.
Figure 5B:
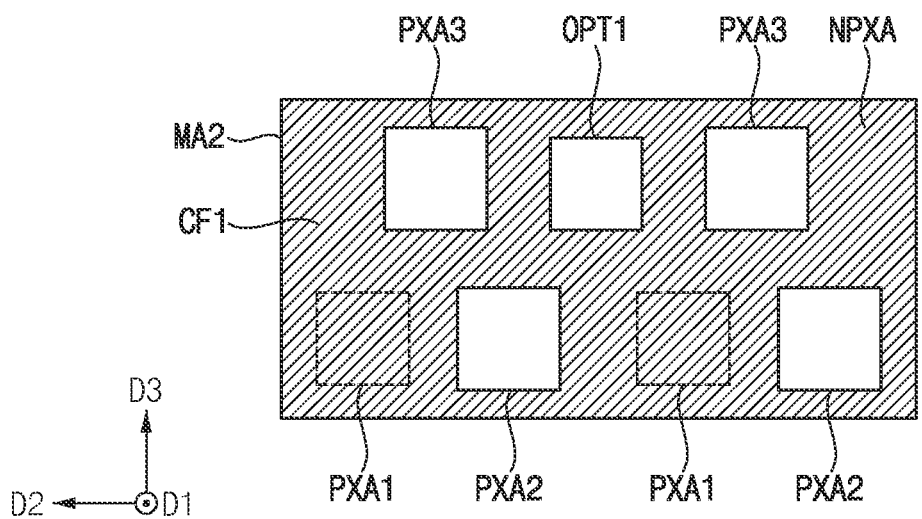
Figure 5C:
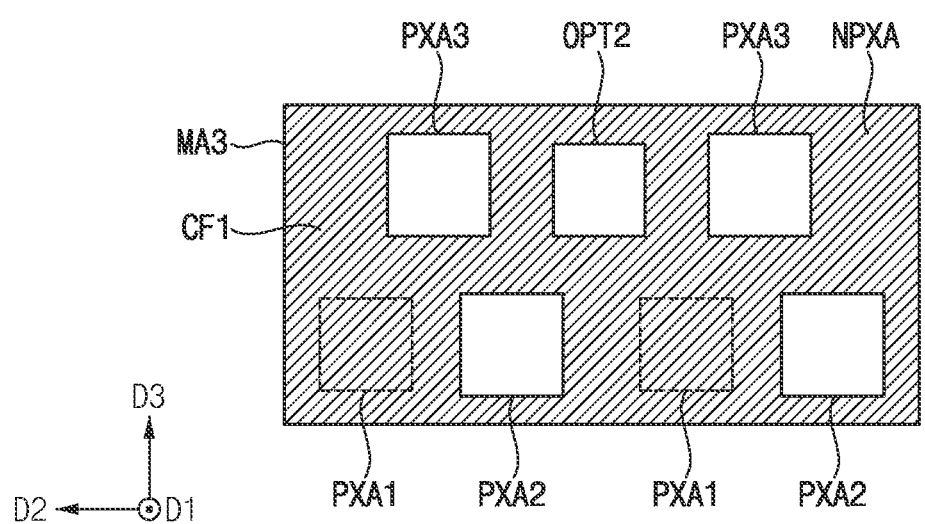
Figure 6:
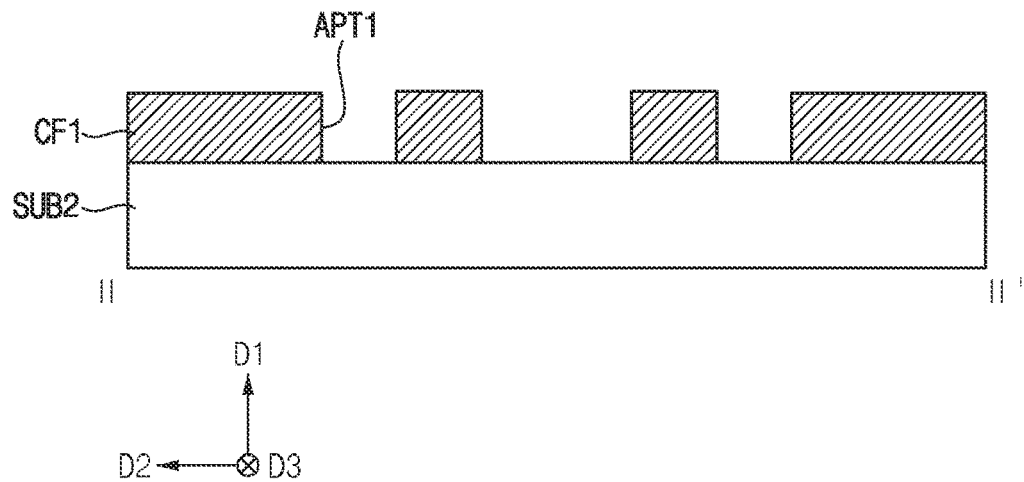
FIG. 6 is a cross-sectional view taken along line II-II' of FIG. 5.

FIG. 4 is a plan view illustrating a color conversion panel 100 according to an embodiment of the present disclosure. FIGS. 5A, 5B and 5C (otherwise referred to as FIG. 5) are enlarged plan views of a first measurement area MA1 (e.g., a first color filter measuring area), a second measurement area MA2 (e.g., a second color filter measuring area), and a third measurement area MA3 (e.g., a third color filter measuring area) of the first color filter layer CF1 included in the color conversion panel 100 of FIG. 4, respectively. FIG. 6 is a cross-sectional view taken along line II-II' of FIG. 5.

Referring to FIG. 4, the color conversion panel 100 may be formed of a plurality of shots or processes (e.g., exposure processes, development processes, etc.). Specifically, a material for a layer or film may be deposited to form a structure on the second substrate SUB2. For example, the film may include a semiconductor film, a conductive film, or the like. A photoresist may be applied on the film. The color conversion panel 100 to which the photoresist is applied may be divided into a plurality of pattern areas or shot areas. Referring to FIG. 4, for example, within a same color conversion panel, the shot areas may correspond to the various pixel areas, while stitch areas between the shot areas may correspond to non-pixel areas.

In an embodiment of manufacturing or providing the color conversion panel 100, the color conversion panel 100 may be exposed (e.g., visually exposed, exposed to light, exposed to developer, etc.) with the plurality of shots, using a plurality of masks. As the size of the color conversion panel 100 increases, the size of the mask should increase in order to expose the color conversion panel 100 with one shot or within one exposure process. When the size of the mask increases, the cost of manufacturing or providing the color conversion panel 100 may increase.

However, as described above, when the color conversion panel 100 is divided into a plurality of shot areas and such shot areas are exposed, a mask having a relatively small size may be used, thereby increasing the manufacturing cost of the color conversion panel 100 may be prevented. In an embodiment, the smaller mask may correspond to less than all the shot areas of a color conversion panel, such as corresponding to one shot area, without being limited thereto.

For example, the color conversion panel 100 may be divided into three shot areas SHA1, SHA2, and SHA3 each having a planar area, and exposed in three shots. In an embodiment, for example, the three shot areas may be exposed using three smaller masks, for providing the color conversion panel 100. For example, as shown in FIG. 4, the color conversion panel 100 may be divided into three shot areas SHA1, SHA2, and SHA3 defining one row and three columns of shot areas, for exposure. However, the present disclosure is not limited thereto, and the color conversion panel 100 may be divided into four or more shot areas, composed of two or more rows and two or more columns, and exposed.

Adjacent shot areas among the three shot areas SHA1, SHA2, and SHA3 may overlap each other. Stitch areas STA1 and STA2 as a plurality of overlapping areas, may be formed in portions where the three shot areas SHA1, SHA2, and SHA3 overlap each other. For example, a first stitch area STA1 may be formed in a portion where the first shot area SHA1 and the second shot area SHA2 overlap. A second stitch area STA2 may be formed in a portion where the second shot area SHA2 and the third shot area SHA3 overlap. The first stitch area STA1 and the second stitch area STA2 may extend in a third direction D3, such as to have a major dimension along the third direction D3. The third direction D3 may cross the first direction D1 and the second direction D2, such as to be perpendicular to the first direction D1 and the second direction D2, without being limited thereto.

Measurement areas MA for measuring an alignment error between respective shot areas among the shot areas SHA1, SHA2, and SHA3 may be positioned in each of the first stitch area STA1 and the second stitch area STA2. The measurement areas MA may include a first measurement area MA1, a second measurement area MA2, and a third measurement area MA3. The first measurement area MA1 may be an area for measurement of a position or location of the first color filter layer CF1, and the second measurement area MA2 may be an area for measurement of a position or location of the second color filter layer CF2. In addition, the third measurement area MA3 may be an area for measurement of a position or location of the third color filter layer CF3.

Each of the first stitch area STA1 and the second stitch area STA2 may include a plurality of the first measurement areas MA1, a plurality of the second measurement areas MA2, and a plurality of the third measurement areas MA3. For example, each of the first stitch area STA1 and the second stitch area STA2 may include five first measurement areas MA1, five second measurement areas MA2, and five third measurement areas MA3. However, the present disclosure is not limited thereto.

Alignment patterns may be positioned in each of the measurement areas MA1, MA2, and MA3. For example, the alignment patterns may be alignment keys. That is, the alignment patterns may mean openings defined in the non-pixel area NPXA of each of the first to third color filter layers CF1 to CF3. Accordingly, a stitch error between the shot areas SHA1, SHA2, and SHA3 may be measured through a measurement process using the alignment patterns. Specifically, the stitch error between the shot areas SHA1, SHA2, and SHA3 may be measured through measuring gaps between the solid portions exposed to outside one of the first to third color filter layers CF1 to CF3 and the alignment patterns overlapping the solid portions in a plan view, in the second direction D2 (selectively, in third direction D3).

However, embodiments according to the present disclosure are not limited thereto. In another embodiment, the alignment patterns may be used to detect an ink ejection point, a laser irradiation point, etc. during the process of manufacturing (or providing) the display device 10. Also, the alignment patterns may be used to align a component in a component area where a component such as a sensor or a camera is disposed. That is, the alignment patterns may be used where alignment is required when manufacturing (or providing) the display device 10.

Referring to FIGS. 4 to 6, the first color filter layer CF1 may be disposed in an entirety of the active area AA, on the second substrate SUB2. The first color filter layer CF1 may overlap the first pixel areas PXA1 and may not overlap the second pixel areas PXA2 and the third pixel areas PXA3. That is, openings overlapping the second pixel areas PXA2 and the third pixel areas PXA3 may be included in (or defined in) the first color filter layer CF1.

In an embodiment, the first color filter layer CF1 may include a first alignment pattern APT1 as solid portions (e.g., a plurality of first solid portions) spaced apart from each other within a first color filter opening in the first measurement area MA1, together with one or more opening defined by the solid portions and extended through a thickness of the first color filter layer CF1 (e.g., a first alignment opening extended between the portions labeled CF1), a first opening pattern OPT1, and a second opening pattern OPT2. The first alignment pattern APT1 may be disposed in the first measurement area MA1, the first opening pattern OPT1 may be disposed in the second measurement area MA2, and the second opening pattern OPT2 may be disposed in the third measurement area MA3.

Also, the first alignment pattern APT1, the first opening pattern OPT1, and the second opening pattern OPT2 may be disposed in the non-pixel area NPXA. That is, each of the first alignment pattern APT1, the first opening pattern OPT1, and the second opening pattern OPT2 may be spaced apart from the first to third pixel areas PXA1, PXA2, and PXA3 (e.g., non-overlapping or adjacent to).

The first alignment pattern APT1 may be symmetrical with respect to a first axis AX1. The first axis AX1 may extend in the third direction D3. However, the present disclosure is not limited thereto, and the first axis AX1 may extend in the second direction D2 or a diagonal direction. The first axis AX1 may be a virtual line to which the plurality of first alignment openings are symmetrical.

Figure 7:
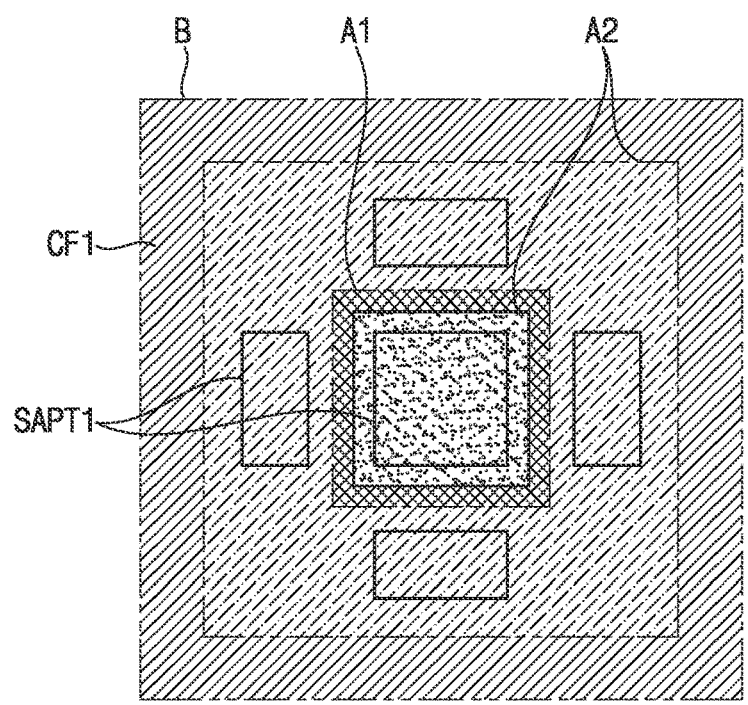
FIG. 7 is an enlarged plan view of area B of FIG. 5.

FIG. 7 is an enlarged plan view of area B of FIG. 5.

Referring further to FIG. 7, the first area A1 included in the first measurement area MA1 may be exposed by about 50% when the first shot area SHA1 is exposed. For example, the first area A1 may have a rectangular shape. About 50% of the second area A2 included in the first measurement area MA1 may be exposed when the second shot area SHA2 is exposed. For example, the second area A2 may have a frame shape. As the planar area where the first area A1 and the second area A2 overlap may be exposed to about 50% when the first shot area SHA1 is exposed, and when the second shot area SHA2 is exposed, respectively, finally about 100% exposure may be achieved.

The first alignment pattern APT1 may include a plurality of first sub-alignment patterns SAPT1. The first sub-alignment patterns SAPT1 may be spaced apart from each other, and the stitch error between the adjacent shot areas SHA1, SHA2, and SHA3 may be determined by measuring a distance between the first sub-alignment patterns SAPT1. Accordingly, the first color filter layer CF1 may be aligned through the first alignment pattern APT1 disposed in the first measurement area MA1.

Figure 8A:
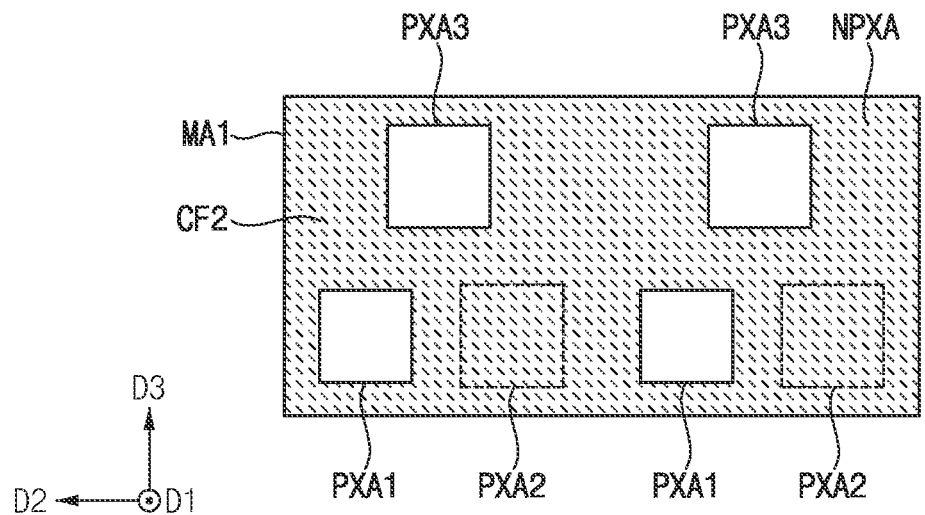
FIGS. 8A, 8B and 8C are enlarged plan views of a first measurement area, a second measurement area, and a third measurement area of a second color filter layer included in the color conversion panel of FIG. 4, respectively.
Figure 8B:
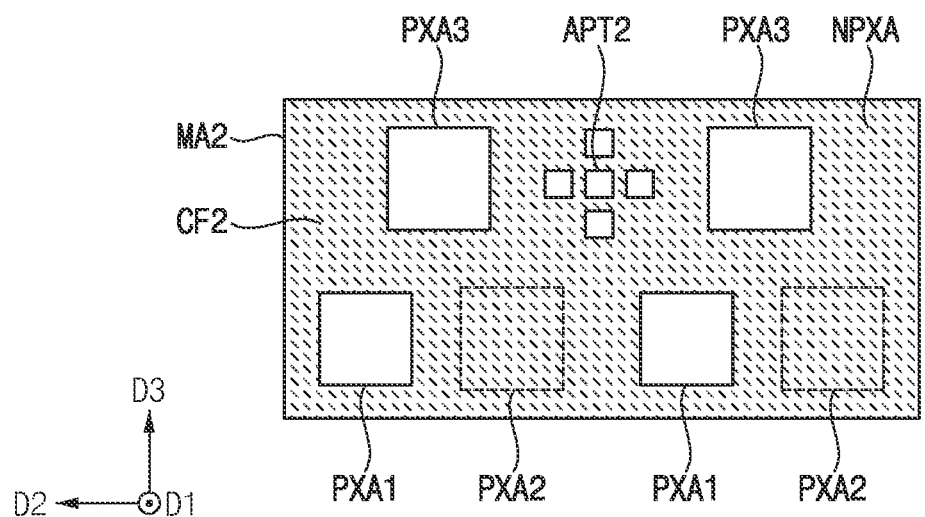
Figure 8C:
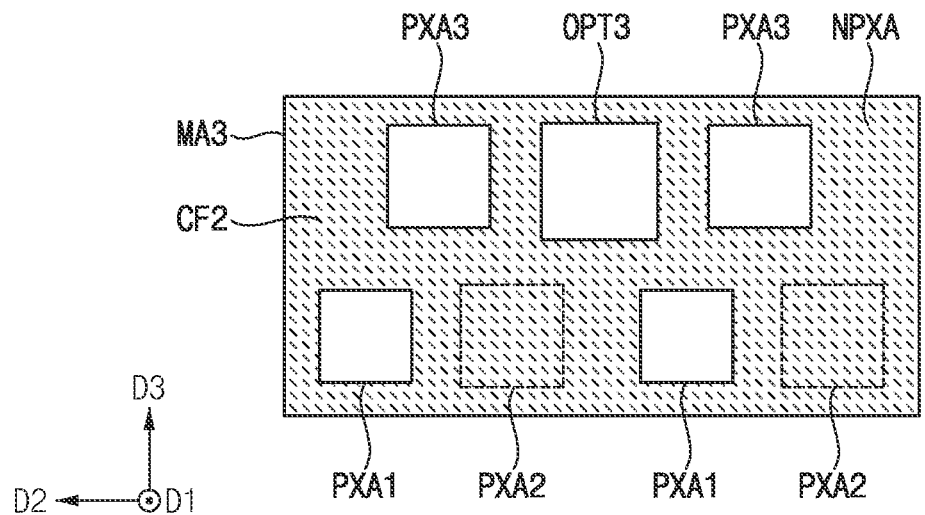
Figure 9A:
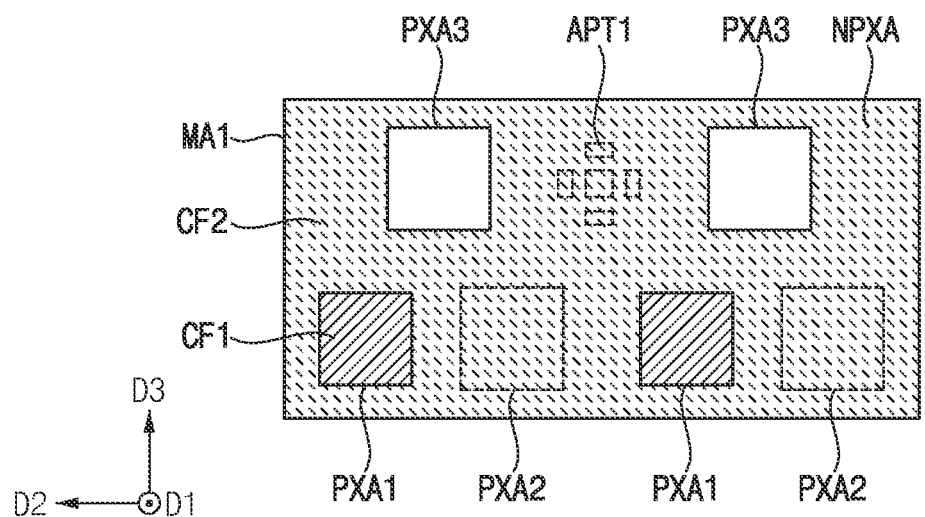
FIGS. 9A, 9B and 9C are plan views illustrating the first color filter layer of FIG. 5 together with the second color filter layer of FIG. 8.
Figure 9B:
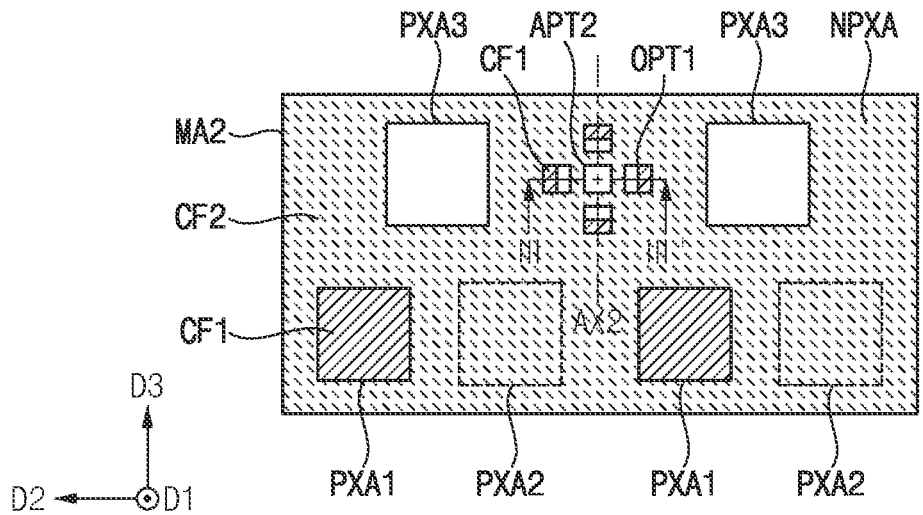
Figure 9C:
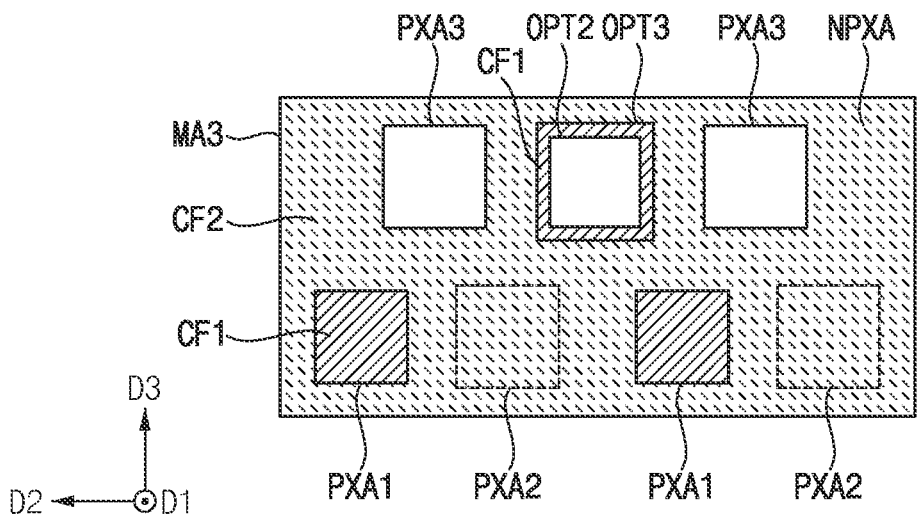

FIGS. 8A, 8B and 8C (otherwise referred to as FIG. 8) are enlarged plan views of a first measurement area MA1, a second measurement area MA2, and a third measurement area MA3 of a second color filter layer CF2 included in the color conversion panel 100 of FIG. 4, respectively. FIGS. 9A, 9B and 9C (otherwise referred to as FIG. 9) are plan views illustrating the first color filter layer CF1 of FIG. 5 overlaid with (or together with) the second color filter layer of FIG. 8.

Referring to FIGS. 8 and 9, the second color filter layer CF2 may be disposed in an entirety of the active area AA, on the first color filter layer CF1. The second color filter layer CF2 may overlap the second pixel areas PXA2 and may not overlap the first pixel areas PXA1 and the third pixel areas PXA3. That is, openings overlapping the first pixel areas PXA1 and the third pixel areas PXA3 may be included in the second color filter layer CF2.

In an embodiment, the second color filter layer CF2 may cover the first alignment pattern APT1 in the first color filter layer CF1 (the first alignment pattern APT1 shown in dotted line in FIG. 9). In addition, the second color filter layer CF2 may include a second alignment pattern APT2 as solid portions (e.g., a plurality of second solid portions) spaced apart from each other within the first opening pattern OPT1, together with one or more opening defined by the solid portions and extended through a thickness of the second color filter layer CF2 (e.g., a second alignment opening), and a third opening pattern OPT3. The second alignment pattern APT2 may be disposed in the second measurement area MA2 and may overlap (or correspond to) the first opening pattern OPT1. The third opening pattern OPT3 may be disposed in the third measurement area MA3 and may overlap the second opening pattern OPT2.

The second alignment pattern APT2 and the third opening pattern OPT3 may be disposed in the non-pixel area NPXA. That is, each of the second alignment pattern APT2 and the third opening pattern OPT3 may be spaced apart from the first to third pixel areas PXA1, PXA2, and PXA3.

Each of the first opening pattern OPT1 and the second alignment pattern APT2 may be symmetrical with respect to a second axis AX2. The second axis AX2 may extend in the third direction D3. However, the present disclosure is not limited thereto, and the second axis AX2 may extend in the second direction D2 or a diagonal direction. The second axis AX2 may be a virtual line to which the plurality of second alignment openings are symmetrical.

The second alignment pattern APT2 may partially expose the first color filter layer CF1. A portion of the first color filter layer CF1 adjacent to the first opening pattern OPT1 may be exposed by the second alignment pattern APT2. Such exposure may indicate a physical exposure of an underlying layer, to outside an overlying layer, owing to an opening in the overlying layer, without being limited thereto.

The third opening pattern OPT3 may partially expose the first color filter layer CF1. A portion of the first color filter layer CF1 adjacent to the second opening pattern OPT2 may be exposed by the third opening pattern OPT3.

Figure 10:
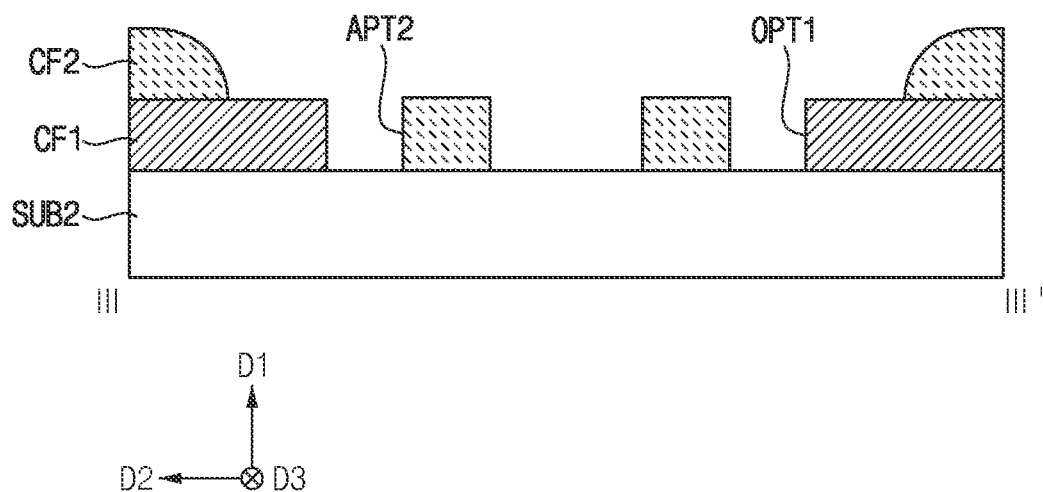
FIG. 10 is a cross-sectional view taken along line III-III' of FIG. 9.

FIG. 10 is a cross-sectional view taken along line III-III' of FIG. 9.

Referring further to FIG. 10, a portion of the second color filter layer CF2 overlapping the first opening pattern OPT1 may be disposed on the same layer as the first color filter layer CF1. That is, a portion of the second color filter layer CF2 overlapping the first opening pattern OPT1 may be disposed on the second substrate SUB2, such as to be coplanar with portions of the first color filter layer CF1. Accordingly, portions of the first color filter layer CF1 and the second color filter layer CF2 overlapping the first opening pattern OPT1 may have similar heights in the first direction D1, where heights (or thicknesses) are taken from a common reference, such as a surface of the second substrate SUB2. As being on a same layer, elements may form an interface with a same underlying or overlying layer, may be coplanar with each other, etc., without being limited thereto.

Figure 13:
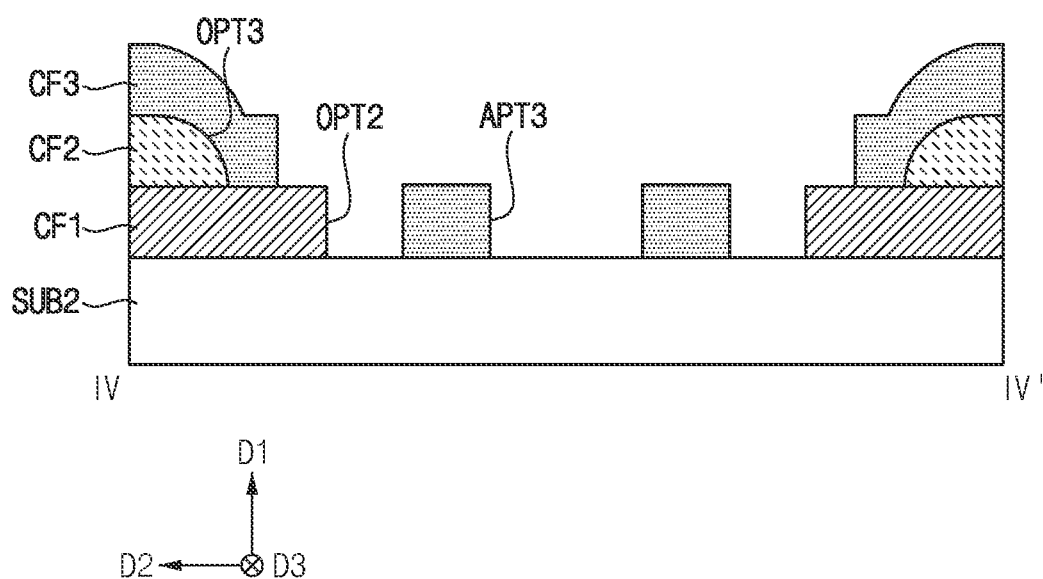
FIG. 13 is a cross-sectional view taken along line IV-IV' of FIG. 12.

Referring to FIGS. 6, 10 and 13, at each of the measurement areas MA, solid portions of a respective color filter layer, have a substantially same thickness relative to the second substrate SUB2, as the first color filter layer CF1. A single color filter opening or a single measurement area opening may be defined by the color filter opening closest to the first substrate SUB, or by more than one individual color filter opening which are aligned with each other. In each of the measurement areas MA, the solid portions disposed in a respective single measurement area opening, may be exposed to outside the color filter layer CF.

Figure 11A:
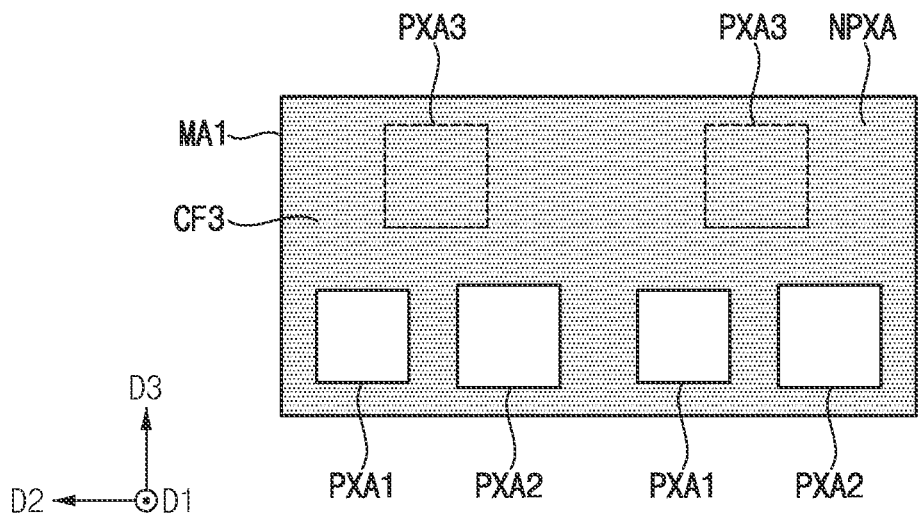
FIGS. 11A, 11B and 11C are enlarged plan views of a first measurement area, a second measurement area, and a third measurement area of a third color filter layer included in the color conversion panel of FIG. 4, respectively.
Figure 11B:
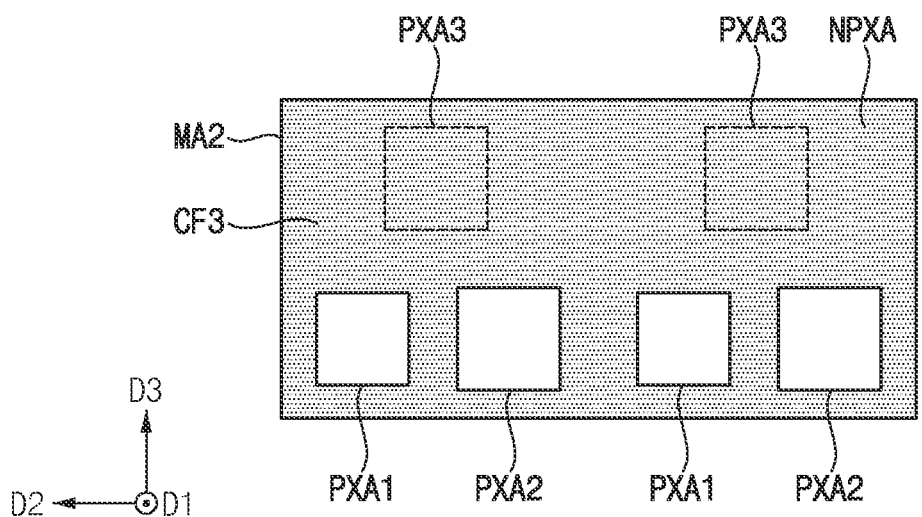
Figure 11C:
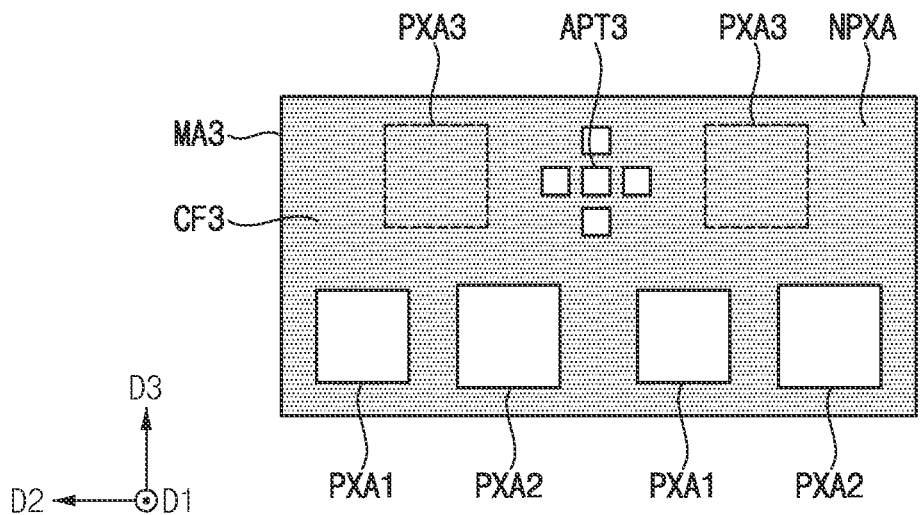
Figure 12A:
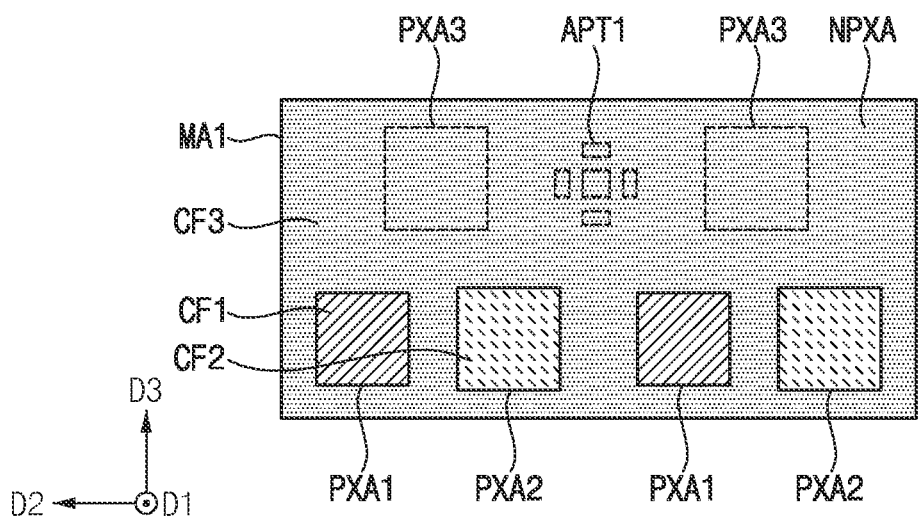
FIGS. 12A, 12B and 12C are plan views illustrating the first color filter layer of FIG. together with the second color filter layer of FIG. 8 and the third color filter layer of FIG. 11.
Figure 12B:
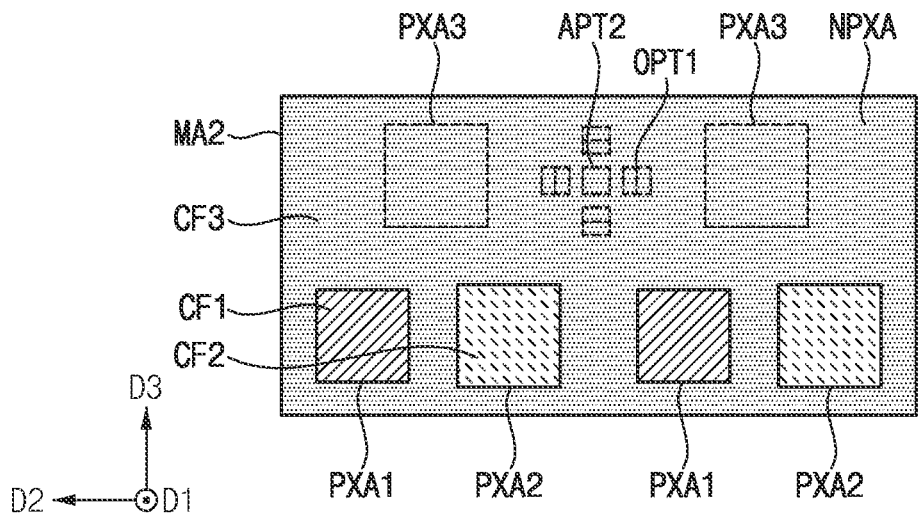
Figure 12C:
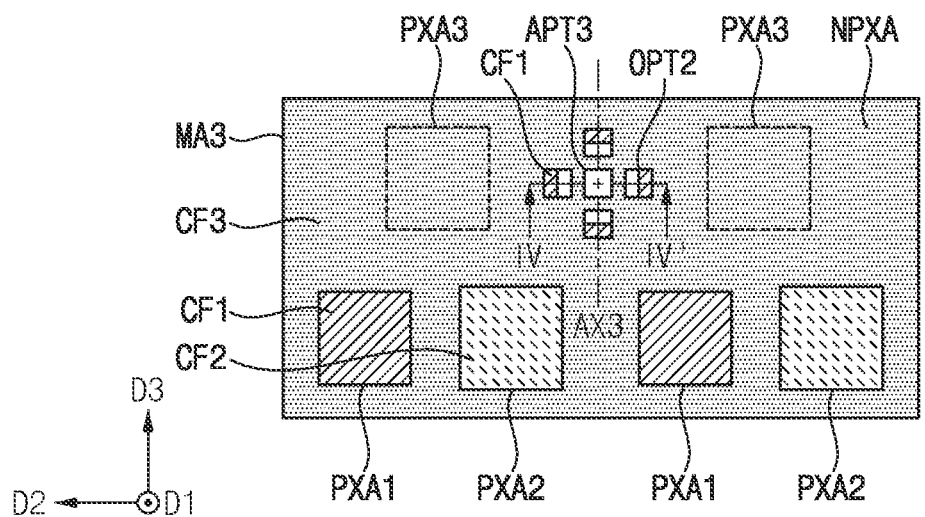

FIGS. 11A, 11B and 11C (otherwise referred to as FIG. 11) are enlarged plan views of a first measurement area MA1, a second measurement area MA2, and a third measurement area MA3 of a third color filter layer CF3 included in the color conversion panel 100 of FIG. 4, respectively. FIGS. 12A, 12B and 12C (otherwise referred to as FIG. 12) are plan views illustrating the first color filter layer CF1 of FIG. 5, overlaid with (or together with) the second color filter layer CF2 of FIG. 8 and the third color filter layer CF3 of FIG. 11.

Referring to FIGS. 11 and 12, the third color filter layer CF3 may be disposed in an entirety of the active area AA, on the second color filter layer CF2. The third color filter layer CF3 may overlap the third pixel areas PXA3 and may not overlap the first pixel areas PXA1 and the second pixel areas PXA2. That is, the third color filter layer CF3 may include openings overlapping the first pixel areas PXA1 and the second pixel areas PXA2.

In an embodiment, the third color filter layer CF3 may cover the second alignment pattern APT2. Also, the third color filter layer CF3 may include a third alignment pattern APT3 as solid portions (e.g., a plurality of third solid portions) spaced apart from each other within the second opening pattern OPT2, together with one or more opening defined by the solid portions and extended through a thickness of the third color filter layer CF3 (e.g., a third alignment opening). The third alignment pattern APT3 may be disposed in the third measurement area MA3 and may overlap the second opening pattern OPT2 and the third opening pattern OPT3.

The third alignment pattern APT3 may be disposed in the non-pixel area NPXA. That is, the third alignment pattern APT3 may be spaced apart from the first to third pixel areas PXA1, PXA2, and PXA3.

Each of the second opening pattern OPT2, the third opening pattern OPT3, and the third alignment pattern APT3 may be symmetrical with respect to a third axis AX3. The third axis AX3 may extend in the third direction D3. However, the present disclosure is not limited thereto, and the third axis AX3 may extend in the second direction D2 or a diagonal direction. The third axis AX32 may be a virtual line to which the plurality of third alignment openings are symmetrical The third alignment pattern APT3 may partially expose the first color filter layer CF1. A portion of the first color filter layer CF1 adjacent to the second opening pattern OPT2 may be exposed by the third opening pattern OPT3 and the third alignment pattern APT3. Portions of the second substrate SUB2 are exposed to outside the color filter layers CF, between solid portions of the various color filter layers CF.

FIG. 13 is a cross-sectional view taken along line IV-IV' of FIG. 12.

Referring to FIG. 13, a portion of the third color filter layer CF3 overlapping the second opening pattern OPT2 and the third opening pattern OPT3 may be disposed on the same layer as the first color filter layer CF1, such as to be coplanar with portions of the first color filter layer CF1. That is, a portion of the third color filter layer CF3 overlapping the second opening pattern OPT2 and the third opening pattern OPT3 may be disposed on the second substrate SUB2. Accordingly, a portion of each of the first color filter layer CF1, and the third color filter layer CF3 overlapping the second opening pattern OPT2 and the third opening pattern OPT3, may have similar heights in the first direction D1.

The first alignment opening in the first measurement area MA1 may have solid portions of only one of the color filter layers CF (e.g., the first color filter layer CF1). The second alignment opening in the second measurement area MA2 may have solid portions of only one of the color filter layers CF (e.g., the second color filter layer CF2). The third alignment opening in the third measurement area MA3 may have solid portions of only one of the color filter layers CF (e.g., the third color filter layer CF3). That is, the various color filter openings respectively corresponding to the measurement areas MA, may respectively correspond to one color filter layer among the various color filter layers CF. Referring again to FIGS. 6, 10 and 13, portions of the second substrate SUB2 are exposed to outside the color filter layers CF, to define exposed portions of the second substrate SUB2 between solid portions of the various color filter layers CF.

Figure 14:
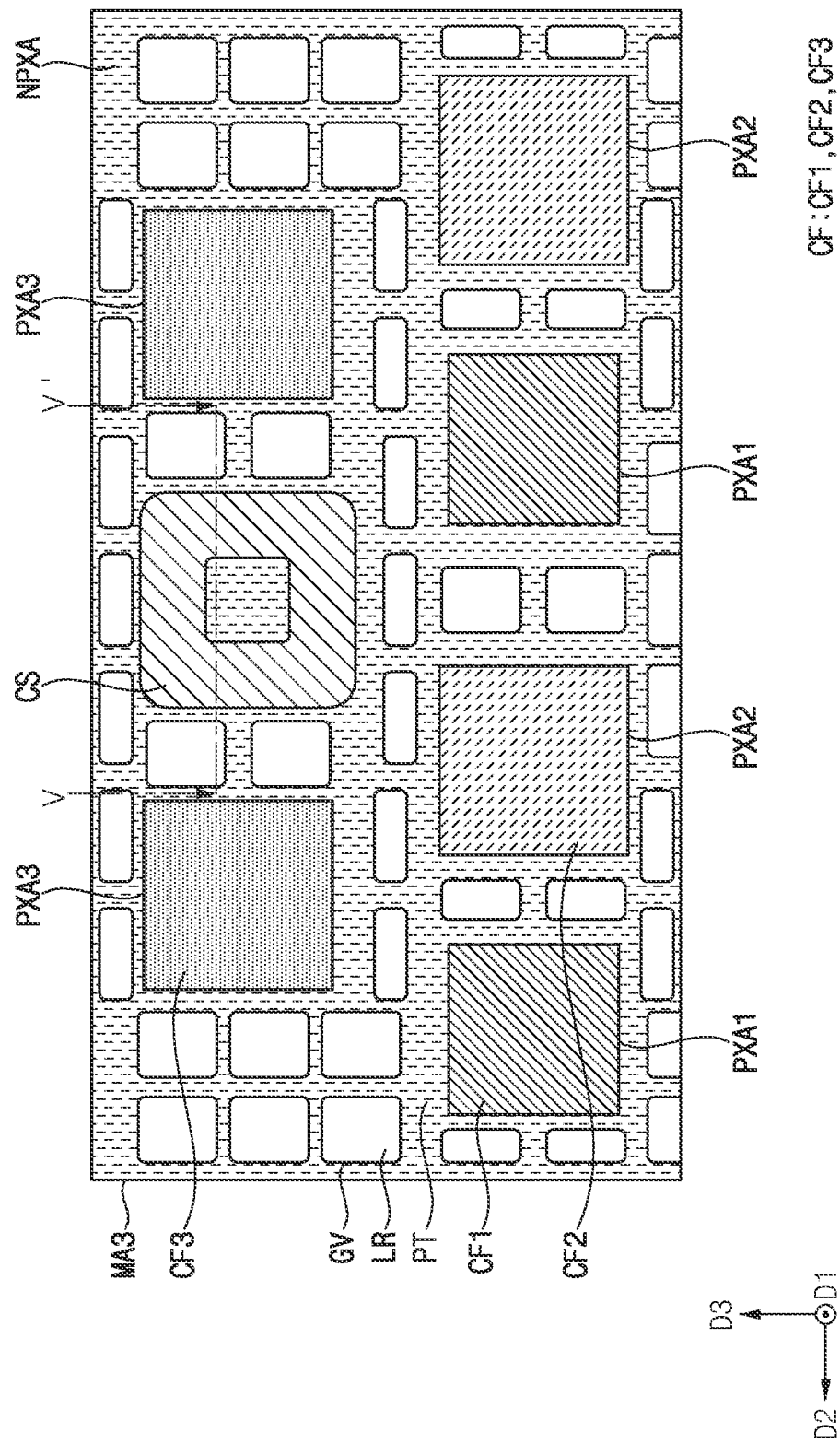
FIG. 14 is a plan view illustrating the color conversion panel of FIG. 4.

Referring to FIGS. 10, 13 and 14, the color filter openings within the third measurement area MA3, may define different planar areas, by dimensions along the second direction D2 and/or the third direction D3. In an embodiment of the third measurement area MA3, referring to FIG. 13, the second color filter opening (e.g., the third opening pattern OPT3) may have the largest planar area or size, while the first color filter opening (e.g., the second opening pattern OPT2) may have the smallest planar area or size. The planar area of the third color filter opening (e.g., represented by a distance between solid portions of third color filter layer CF3 on the solid portions of second color filter layer CF2), may be between the first and second color filter openings. The first color filter opening may be aligned with the second color filter opening (FIGS. 10 and 13), and the second color filter opening may be aligned with the third color filter opening (FIG. 13).

Figure 15:
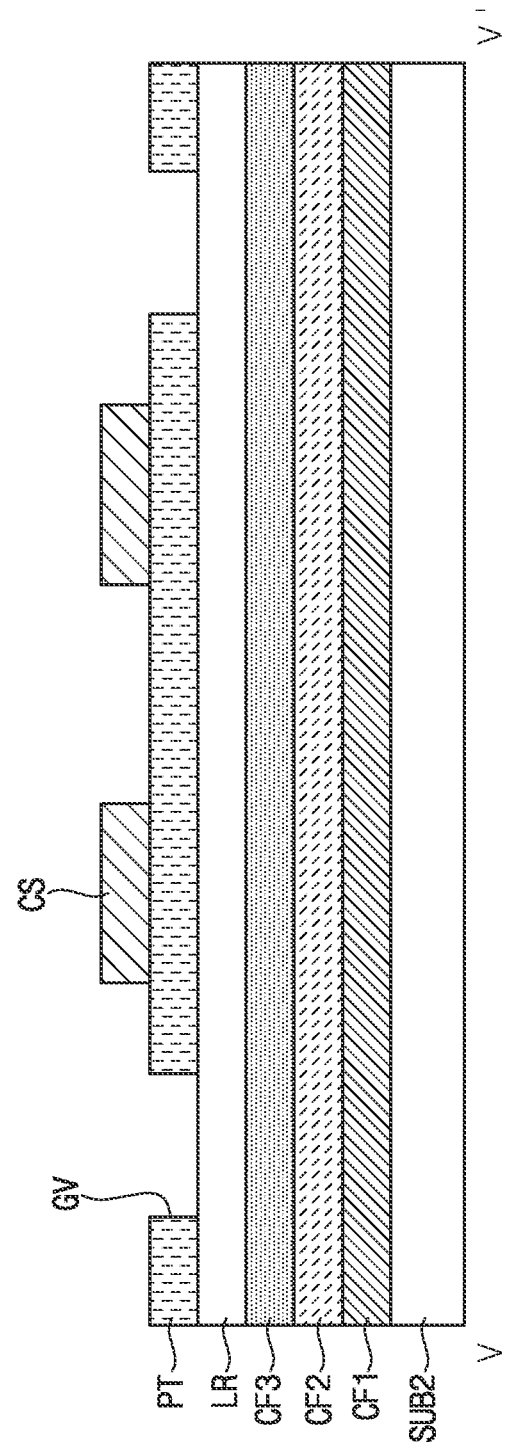
FIG. 15 is a cross-sectional view taken along line V-V' of FIG. 13.

FIG. 14 is a plan view illustrating the color conversion panel 100 of FIG. 4. FIG. 15 is a cross-sectional view taken along line V-V' of FIG. 13.

Referring to FIGS. 4, 14, and 15, the low refractive index layer LR may be disposed in the active area AA, on the third color filter layer CF3, and cover the color filter layer CF.

The partition layer PT may be disposed on the low refractive index layer LR and cover the third alignment pattern APT3. The partition layer PT may cover an entirety of the non-pixel area NPXA, except for the first to third pixel areas PXA1, PXA2, and PXA3.

The partition layer PT may include (or define) a groove GV provided in plural including a plurality of grooves GV. The grooves GV may be disposed in the non-pixel area NPXA and may be arranged spaced apart from each other to surround the first to third pixel areas PXA1, PXA2, and PXA3, in the plan view. The grooves GV may expose the low refractive index layer LR to outside the partition layer PT.

Openings (e.g., the opening patterns and the alignment patterns) formed by the first color filter layer CF1, the second color filter layer CF2, and the third color filter layer CF3 and overlapping the non-pixel area NPXA may be covered by the low refractive index layer LR and the partition layer PT. Accordingly, reflection of external light by the openings may be prevented. Although not shown in FIGS. 14 and 15, referring to FIGS. 12 and 13, for example, the low refractive index layer LR and the partition layer PT may extend from being on solid portions of the various color filter layers, and into the second opening pattern OPT2 and into the third opening pattern OPT3, to cover the third alignment pattern APT3.

The spacer CS may be disposed on the partition layer PT. The spacer CS may be disposed in the non-pixel area NPXA. The spacer CS may overlap the first alignment pattern APT1, overlap the second alignment pattern APT2, and overlap the third alignment pattern APT3 of the measurement areas MA. However, embodiments according to the present disclosure are not limited thereto.

In an embodiment, the spacer CS may have a closed shape other than a circular shape. For example, the spacer CS may have a rectangular shape and a frame shape. The spacer CS may be used to measure the stitch error between the shot areas SHA1, SHA2, and SHA3, through the shape of the spacer CS. Specifically, the spacer CS may measure the stitch error through a gap between the spacer CS and the groove GV in a plan view, in the second direction D2 (selectively, in third direction D3). In an embodiment, the closed shape of the spacer CS may respectively surround the first alignment pattern APT1, the second alignment pattern APT2, and the third alignment pattern APT3 of the measurement areas MA in a plan view.

In one embodiment, as the color conversion panel 100 includes the alignment patterns APT1, APT2, and APT3 and the opening patterns OPT1, OPT2, and OPT3 disposed in the active area AA, the stitch error between the shot areas SHA1, SHA2, and SHA3 may be measured. Accordingly, monitoring during the manufacturing process of the color conversion panel 100 may be facilitated.

In addition, as a portion of the second color filter layer CF2 overlapping with the first opening pattern OPT1 is disposed on the same layer as the first color filter layer CF1 (FIG. 10), and as a portion of the third color filter layer CF3 overlapping the second opening pattern OPT2 and the third opening pattern OPT3 is disposed on the same layer as the first color filter layer CF1 (FIG. 13), the first color filter layer CF1, and the portion of the second color filter layer CF2 or the portion of the third color filter layer CF3, respectively, may have a similar height to each other. Accordingly, the step difference between the color filter layers CF1, CF2, and CF3 may be minimized, and thus the gray scale difference may be minimized. By minimizing the gray scale difference, it is possible to simultaneously focus the alignment patterns APT1, APT2, and APT3, and it is possible to easily measure the stitch error between the shot areas SHA1, SHA2, and SHA3.

Figure 16:
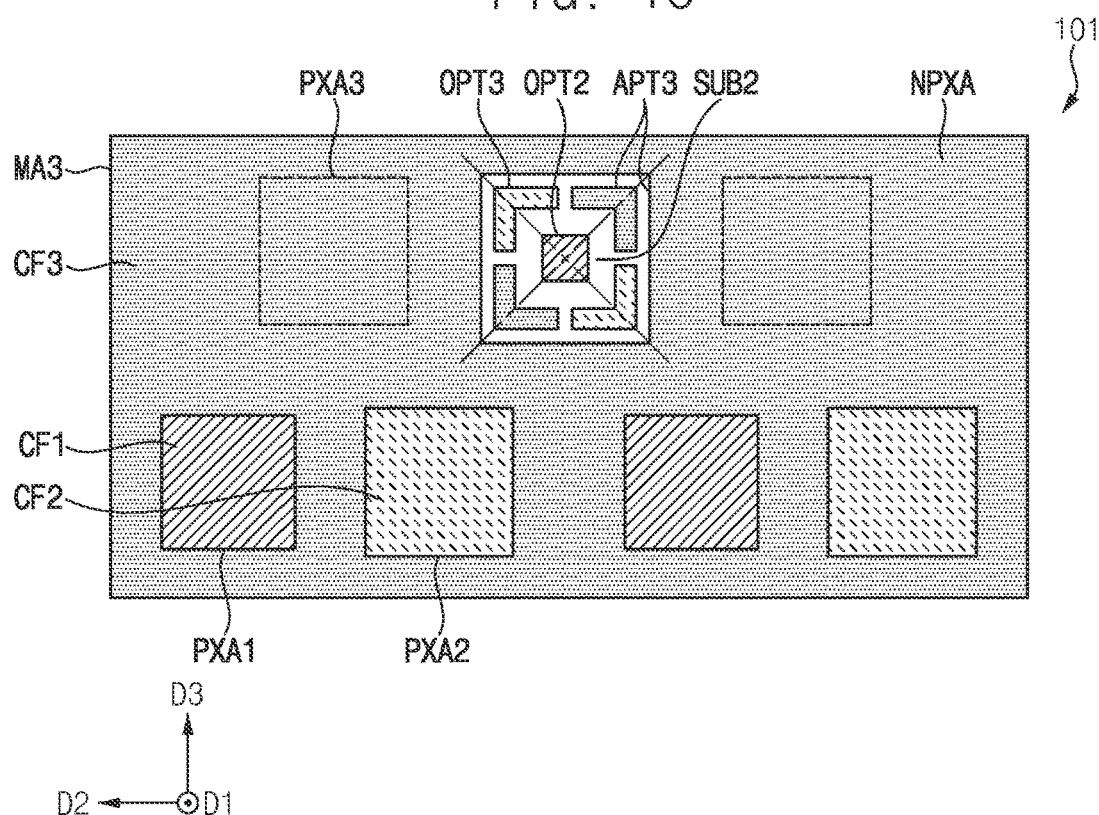
FIGS. 16 to 18 are plan views illustrating another example of the third measurement area of FIG. 11.
Figure 17:
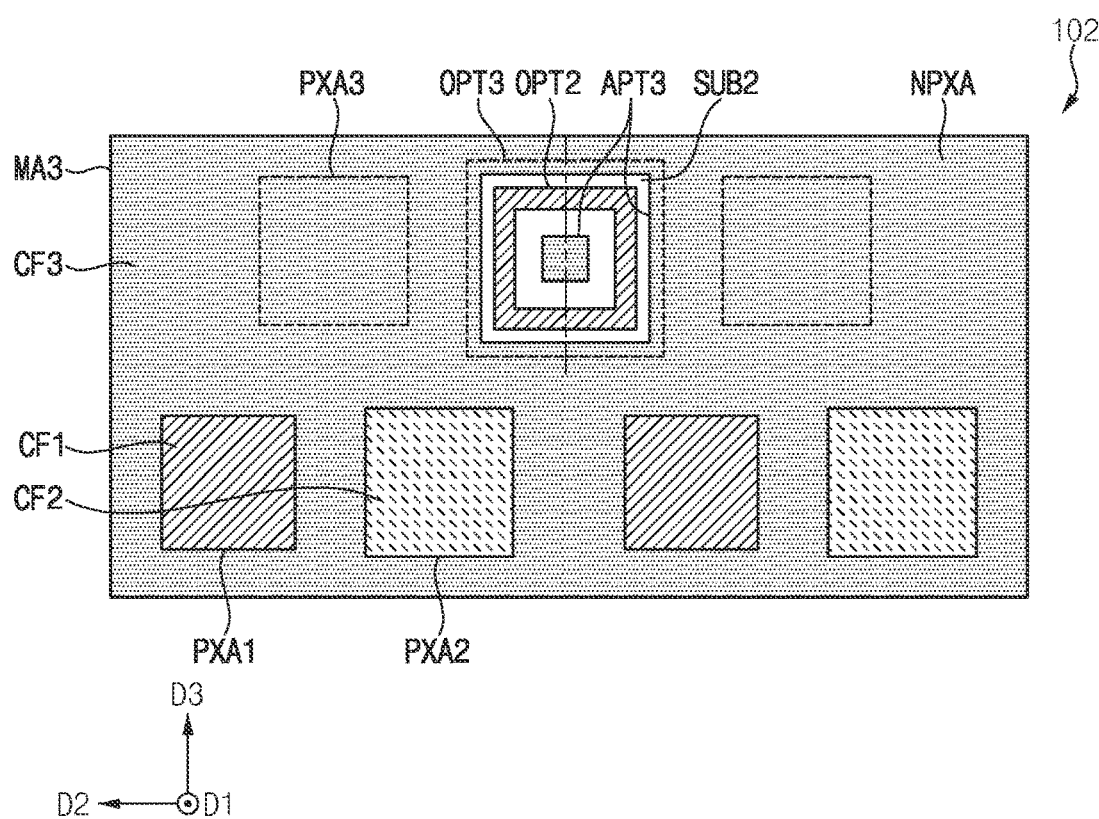
Figure 18:
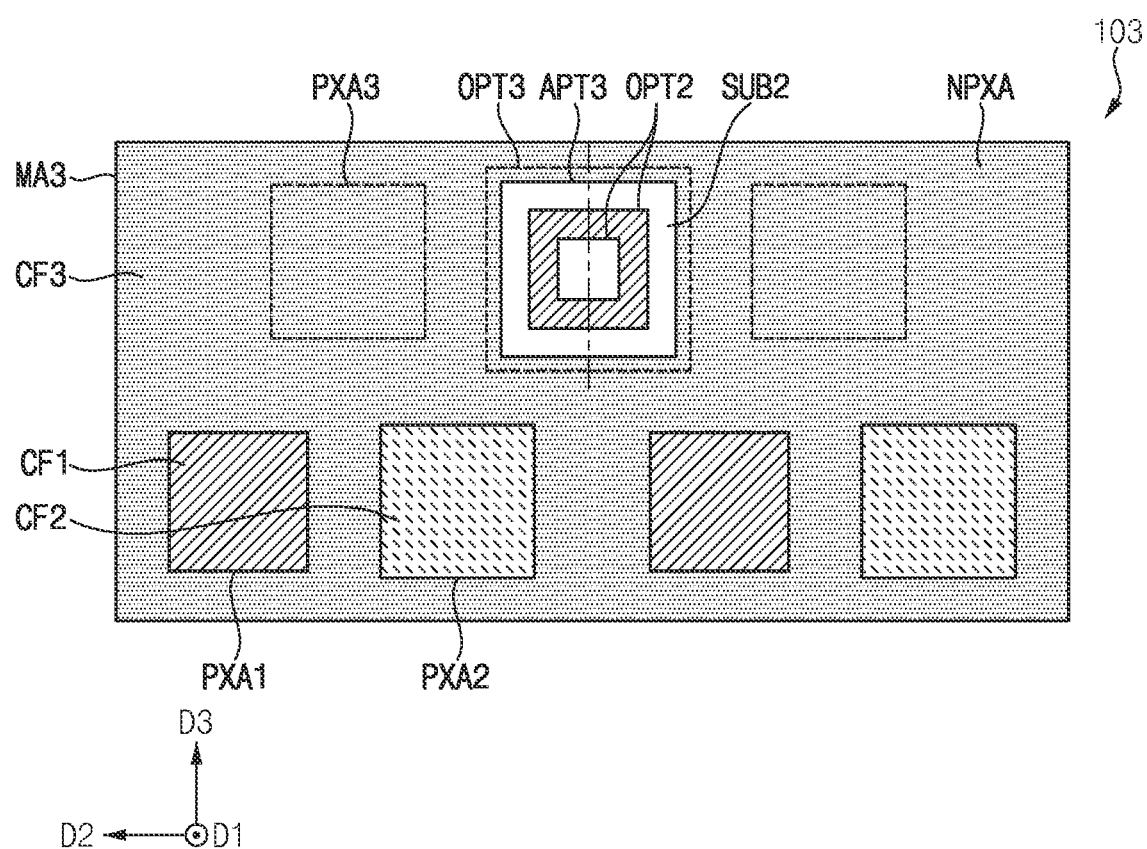

FIGS. 16 to 18 are plan views illustrating another example of the third measurement area MA3 of FIG. 11. The various opening patterns (OPT2 and OPT3 and APT3) in FIGS. 16 to 18 may as solid portions (e.g., a plurality of first solid portions) spaced apart from each other within a first color filter opening in the first measurement area MA1, together with one or more opening defined by the solid portions and extended through a thickness of the first color filter layer CF1 (e.g., a first alignment opening extended between the portions labeled CF1), In the color conversion panels described with reference to FIGS. 16 to 18, a portion overlapping with the color conversion panel 100 described with reference to FIGS. 1 to 15 may be omitted.

Referring to FIG. 16, the color conversion panel 101 may include a first color filter layer CF1, a second color filter layer CF2, and a third color filter layer CF3. The third color filter layer CF3 within shot areas, may be measured or represented by a color filter structure within the third measurement area MA3 included in each of the stitch areas STA1 and STA2.

The first color filter layer CF1 may include a second opening pattern OPT2 disposed in the non-pixel area NPXA of the third measurement area MA3. The second color filter layer CF2 may include a third opening pattern OPT3 overlapping the second opening pattern OPT2. The third color filter layer CF3 may include a third alignment pattern APT3 overlapping the second opening pattern OPT2 and the third opening pattern OPT3.

Each of the second opening pattern OPT2, the third opening pattern OPT3, and the third alignment pattern APT3 may be symmetrical with respect to a diagonal axis. The diagonal axis may extend in a diagonal direction across the center of the third alignment pattern APT3, that is, across a center of a single planar area corresponding to (or defined by) the third alignment pattern APT3.

For example, the second opening pattern OPT2 may have a frame shape symmetrical with respect to the diagonal axis. The third opening pattern OPT3 may define island patterns of the second color filter layer CF2 having a ┌ shape and a ┘ shape with respect to the diagonal axis. The third alignment pattern APT3 may define island patterns of the third color filter layer CF3 having a ┐ shape and a └ shape with respect to the diagonal axis.

In detail, the second opening pattern OPT2 may have a frame shape opening symmetrical with respect to the diagonal axis, owing to a single solid portion of the first color filter layer CF1 at the center (labeled as OPT2 in FIG. 16) together with edges of the first color filter layer CF1. The third opening pattern OPT3 may be defined with island patterns as solid portions of the second color filter layer CF2 having a ┌ shape and a ┘ shape with respect to the diagonal axis, at opposing corners of the third alignment opening, together with edges of the second color filter layer CF2, and a continuous opening between the island shapes and the edges. The third alignment pattern APT3 may be defined with island patterns of the third color filter layer CF3 having a ┐ shape and a └ shape with respect to the diagonal axis, together with edges of the third color filter layer CF3, and a continuous opening between the island shapes and the edges. That is, the third alignment opening in the third measurement area MA3 may include solid portions of more than one color filter layer, and such solid portions are spaced apart from each other and from various color filter edges, within the third alignment opening. In an embodiment, the edges of the first, second and third color filter layers CF1, CF2 and CF3 may be aligned with each other at the third alignment opening, such as corresponding to the solid line around the collection of island patterns, but are not limited thereto. In embodiments, edges of color filter layers may be spaced apart from each other, such that one color filter layer may extend further toward the center than another color filter layer.

At the third measurement area MA3, the third alignment pattern APT3 and the third opening pattern OPT3 may partially expose the first color filter layer CF1. A portion of the first color filter layer CF1 which has the edge which defines the second opening pattern OPT2 may be exposed by the third opening pattern OPT3 and the third alignment pattern APT3.

A portion of the third color filter layer CF3 within the second opening pattern OPT2 and within the third opening pattern OPT3 (e.g., at a space between the island patterns of the third color filter layer CF3 having the ┐ shape and the └ shape) may be disposed on the same layer as the first color filter layer CF1. That is, the portion of the third color filter layer CF3 overlapping the second opening pattern OPT2 and the third opening pattern OPT3 may be disposed on the second substrate SUB2. Accordingly, a portion of each of the first color filter layer CF1 and the third color filter layer CF3 overlapping the second opening pattern OPT2 and the third opening pattern OPT3 may have similar heights in the first direction D1.

Although the description is based on the third measurement area MA3, when the second measurement area MA2 is measured, the second color filter layer CF2 may be measured using the same patterns (e.g., the island patterns of the second color filter layer CF2 having the ┌ shape and the ┘ shape). That is, the second color filter layer CF2 within shot areas, may be measured or represented by a color filter structure within the second measurement area MA2 included in each of the stitch areas STA1 and STA2.

Referring to FIG. 17, a color conversion panel 102 may include a first color filter layer CF1, a second color filter layer CF2, and a third color filter layer CF3. The third color filter layer CF3 may be measured by a third measurement area MA3 included in each of the stitch areas STA1 and STA2.

The first color filter layer CF1 may include a second opening pattern OPT2 disposed in the non-pixel area NPXA of the third measurement area MA3. The second color filter layer CF2 may include a third opening pattern OPT3 overlapping the second opening pattern OPT2. The third color filter layer CF3 may include a third alignment pattern APT3 overlapping the second opening pattern OPT2 and the third opening pattern OPT3.

Each of the second opening pattern OPT2, the third opening pattern OPT3, and the third alignment pattern APT3 may be symmetrical with respect to an axis. The axis may extend in the third direction D3. However, the present disclosure is not limited thereto, and the axis may extend in the second direction D2 or a diagonal direction.

For example, the second opening pattern OPT2 may have a frame shape symmetrical with respect to the axis and a rectangular shape disposed in the frame shape. The third opening pattern OPT3 may be an opening having a rectangular shape. The third alignment pattern APT3 may be an opening having a frame shape. An area of the third opening pattern OPT3 may be greater than an area of the third alignment pattern APT3. Accordingly, the third color filter layer CF3 overlapping the third opening pattern OPT3 may be disposed on the second substrate SUB2.

In detail, the second opening pattern OPT2 may have a frame shape opening defined between a frame shaped solid portion of the first color filter CF1, and edges of the first color filter CF1 which surround the frame shaped solid portion, the frame shape opening being symmetrical with respect to the axis, together with a rectangular shape opening disposed within the frame shaped solid portion. The third opening pattern OPT3 may have edges (dotted line) defining an opening having a rectangular shape, and no solid portion of the second color filter CF2 may be in the rectangular opening. The third alignment pattern APT3 may having a frame shape opening defined by a square shaped solid portion of the third color filter layer CF3 and edges of the third color filter CF3 which surround the square shaped solid portion. A total area (e.g., a total planar area defined by a shape of the dotted line) of the third opening pattern OPT3 may be greater than a total area (e.g., a total planar area defined by a shape of the edges of the third color filter layer CF3) of the third alignment pattern APT3. Accordingly, a solid portion of the third color filter layer CF3 may extend further than the edges of the second color filter layer CF2 which define the third opening pattern OPT3, to overlap the edge of the third opening pattern OPT3, and be disposed on the second substrate SUB2. Referring to FIG. 17, the third color filter layer CF3 may extend further than the edges (dotted line) of the second color filter layer CF2 to contact or be directly on the second substrate SUB2, without being limited thereto.

The third alignment pattern APT3 may expose a portion of the first color filter layer CF1 overlapping the third alignment pattern APT3. That is, the solid portion of the first color filter layer CF1 may overlap the opening portion of the third alignment pattern APT3 and be spaced apart from solid portions of the third color filter layer CF3. A frame-shaped island pattern defining the opening of the second opening pattern OPT2 among solid portions of the first color filter layer CF1, may be exposed by the third opening pattern OPT3 and the third alignment pattern APT3. Also, a rectangular island pattern defined by the third alignment pattern APT3 may be disposed inside the island pattern included in the first color filter layer CF1.

A portion of the third color filter layer CF3 overlapping the second opening pattern OPT2 and the third opening pattern OPT3 (e.g., a portion of the third color filter layer CF3 adjacent to the second opening pattern OPT2 and the island pattern of the third color filter layer CF3) may be disposed on the same layer as the first color filter layer CF1. That is, the portion of the third color filter layer CF3 overlapping the second opening pattern OPT2 and the third opening pattern OPT3 may be disposed on the second substrate SUB2. Accordingly, a portion of each of the first color filter layer CF1 and the third color filter layer CF3 overlapping the second opening pattern OPT2 and the third opening pattern OPT3 may have similar heights in the first direction D1.

Although the third measurement area MA3 has been described as a reference, when the second measurement area MA2 is measured, the second color filter layer CF2 may be measured using the same patterns.

Referring to FIG. 18, the color conversion panel 103 may include a first color filter layer CF1, a second color filter layer CF2, and a third color filter layer CF3. The third color filter layer CF3 may be measured by a third measurement area MA3 included in each of the stitch areas STA1 and STA2.

The first color filter layer CF1 may include a second opening pattern OPT2 disposed in the non-pixel area NPXA of the third measurement area MA3. The second color filter layer CF2 may include a third opening pattern OPT3 overlapping the second opening pattern OPT2. The third color filter layer CF3 may include a third alignment pattern APT3 overlapping the second opening pattern OPT2 and the third opening pattern OPT3.

Each of the second opening pattern OPT2, the third opening pattern OPT3, and the third alignment pattern APT3 may be symmetrical with respect to an axis. The axis may extend in the third direction D3. However, the present disclosure is not limited thereto, and the axis may extend in the second direction D2 or a diagonal direction.

For example, the second opening pattern OPT2 may have a frame shape symmetrical with respect to the axis and a rectangular shape disposed in the frame shape. The third opening pattern OPT3 may be an opening having a rectangular shape. The third alignment pattern APT3 may be an opening having a rectangular shape. An area of the third opening pattern OPT3 may be greater than an area of the third alignment pattern APT3. Accordingly, the third color filter layer CF3 overlapping the third opening pattern OPT3 may be disposed on the second substrate SUB2.

In detail, the second opening pattern OPT2 may have a frame shape opening defined between a frame shaped solid portion of the first color filter CF1, and edges of the first color filter CF1 which surround the frame shaped solid portion, the frame shape opening being symmetrical with respect to the axis, together with a rectangular shape opening disposed within the frame shaped solid portion. The third opening pattern OPT3 and the third alignment pattern APT3 may have edges (dotted line) defining an opening having a rectangular shape, and no solid portion of the second color filter CF2 or the third color filter CF3 may be in the rectangular opening. A total area (e.g., a total planar area defined by a shape of the dotted line) of the third opening pattern OPT3 may be greater than a total area (e.g., a total planar area defined by a shape of the edges of the third color filter layer CF3) of the third alignment pattern APT3. Accordingly, a solid portion of the third color filter layer CF3 may extend further than the edges of the second color filter layer CF2 which define the third opening pattern OPT3, to overlap the edge of the third opening pattern OPT3, and be disposed on the second substrate SUB2. Referring to FIG. 18, the third color filter layer CF3 may extend further than the edges (dotted line) of the second color filter layer CF2 to contact or be directly on the second substrate SUB2, without being limited thereto The third alignment pattern APT3 may expose a portion of the first color filter layer CF1 overlapping the third alignment pattern APT3. A frame-shaped island pattern defined by the second opening pattern OPT2 among the first color filter layer CF1 may be exposed by the third opening pattern OPT3 and the third alignment pattern APT3.

A portion of the third color filter layer CF3 overlapping the second opening pattern OPT2 and the third opening pattern OPT3 may be disposed on the same layer as the first color filter layer CF1. That is, the portion of the third color filter layer CF3 overlapping the second opening pattern OPT2 and the third opening pattern OPT3 may be disposed on the second substrate SUB2. Accordingly, a portion of each of the first color filter layer CF1 and the third color filter layer CF3 overlapping the second opening pattern OPT2 and the third opening pattern OPT3 may have similar heights in the first direction D1.

Although the third measurement area MA3 has been described as a reference, when the second measurement area MA2 is measured, the second color filter layer CF2 may be measured using the same patterns.

Figure 19:
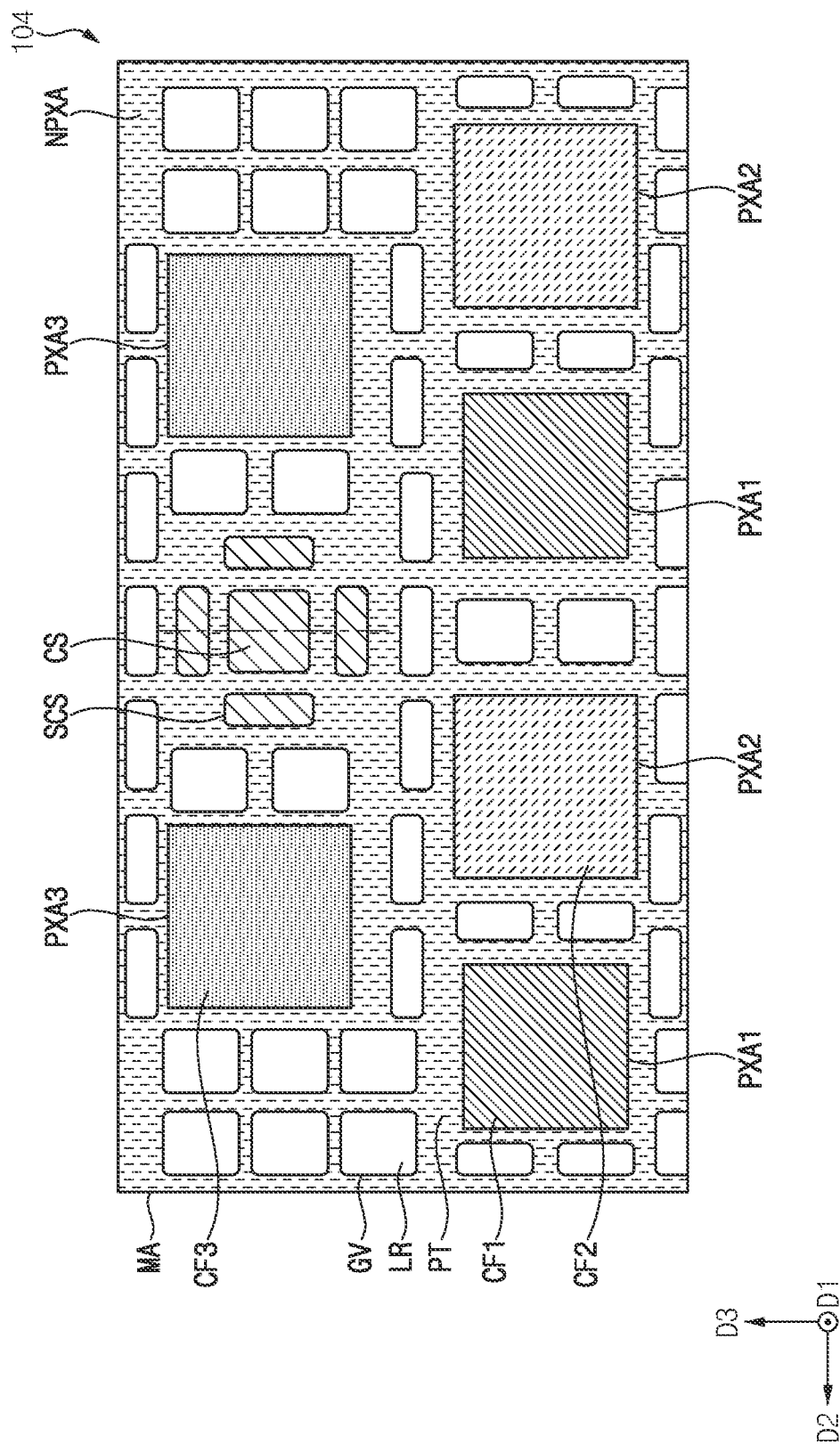
FIG. 19 is a plan view illustrating another example of FIG. 14.

FIG. 19 is a plan view illustrating another example of FIG. 14.

In a color conversion panel 104 described with reference to FIG. 19, a portion overlapping with the color conversion panel 100 described with reference to FIG. 14 may be omitted.

Referring to FIG. 19, a color conversion panel 104 may include a second substrate SUB2, first to third color filter layers CF1, CF2, and CF3, a low refractive index layer, a partition layer PT, and a spacer CS.

The low refractive index layer (e.g., the low refractive index layer LR of FIG. 15) may be disposed in an active area, on the third color filter layer CF3, and cover the color filter layer CF.

The partition layer PT may be disposed on the low refractive index layer LR and cover the third alignment pattern APT3. The partition layer PT may cover an entirety of the non-pixel area NPXA except for the first to third pixel areas PXA1, PXA2, and PXA3.

The spacer CS may be disposed on the partition layer PT. The spacer CS may be disposed in the non-pixel area NPXA.

In an embodiment, the spacer CS may have a shape other than an enclosed shape, like a circular shape. The spacer CS may have an overall shape which is symmetrical with respect to an axis, at a measurement area MA. For example, the spacer CS may include a plurality of sub-patterns SCS spaced apart from each other and arranged to define an overall shape or planar area of the spacer CS. The sub-patterns SCS may have a symmetrical shape with respect to the axis. However, the present disclosure is not limited thereto.

The spacer CS may serve as an alignment key for aligning the spacer CS. That is, the spacer CS may measure the stitch error between the shot areas SHA1, SHA2, and SHA3 through the shape of the spacer CS. Specifically, the spacer CS may measure the stitch error through a gap between the spacer CS and the groove GV in a plan view, in the second direction D2 (selectively, in third direction D3).

Figure 20:
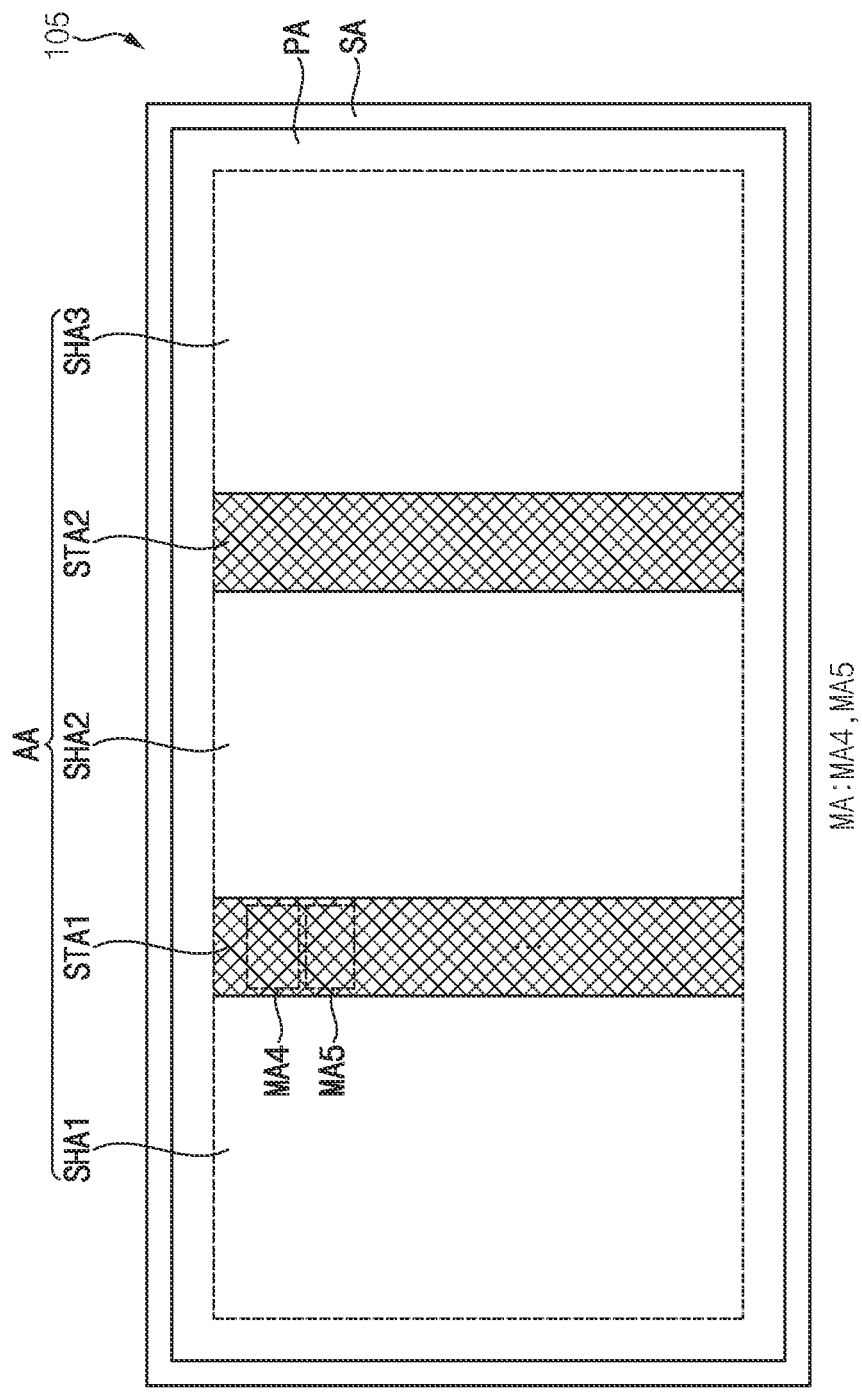
FIG. 20 is a plan view illustrating a color conversion panel according to another embodiment of the present disclosure.

FIG. 20 is a plan view illustrating a color conversion panel 105 according to another embodiment of the present disclosure.

In a color conversion panel 105 described with reference to FIG. 20, a portion overlapping with the color conversion panel 100 described with reference to FIGS. 1 to 4 may be omitted.

Referring to FIG. 20, a color conversion panel 105 may include a second substrate SUB2, first to third color filter layers CF1, CF2, CF3, a low refractive index layer LR, a partition layer PT, and a spacer CS.

Measurement areas MA with which an alignment error between the shot areas SHA1, SHA2, and SHA3 is measured, may be disposed in each of the first stitch area STA1 and the second stitch area STA2. The measurement areas MA may include a fourth measurement area MA4 and a fifth measurement area MA5. The fourth measurement area MA4 may be an area for measuring the partition layer PT (e.g., partition layer measuring area), and the fifth measurement area MA5 may be an area for measuring the spacer CS (e.g., spacer measuring are).

Each of the first stitch area STA1 and the second stitch area STA2 may include a plurality of the fourth measurement areas MA4 and a plurality of the fifth measurement areas MA5. For example, each of the first stitch area STA1 and the second stitch area STA2 may include five fourth measurement areas MA4 and five fifth measurement areas MA5. However, the present disclosure is not limited thereto.

Alignment patterns may be disposed in each of the measurement areas MA. For example, the alignment patterns may be alignment keys. Accordingly, the stitch error between the shot areas SHA1, SHA2, and SHA3 may be measured through the alignment patterns. Specifically, the stitch error between the shot areas SHA1, SHA2, and SHA3 may be measured through measuring gaps between the solid portions exposed to outside one of the first to third color filter layers CF1 to CF3 and the alignment patterns overlapping the solid portions in a plan view, in the second direction D2 (selectively, in third direction D3).

Figure 21A:
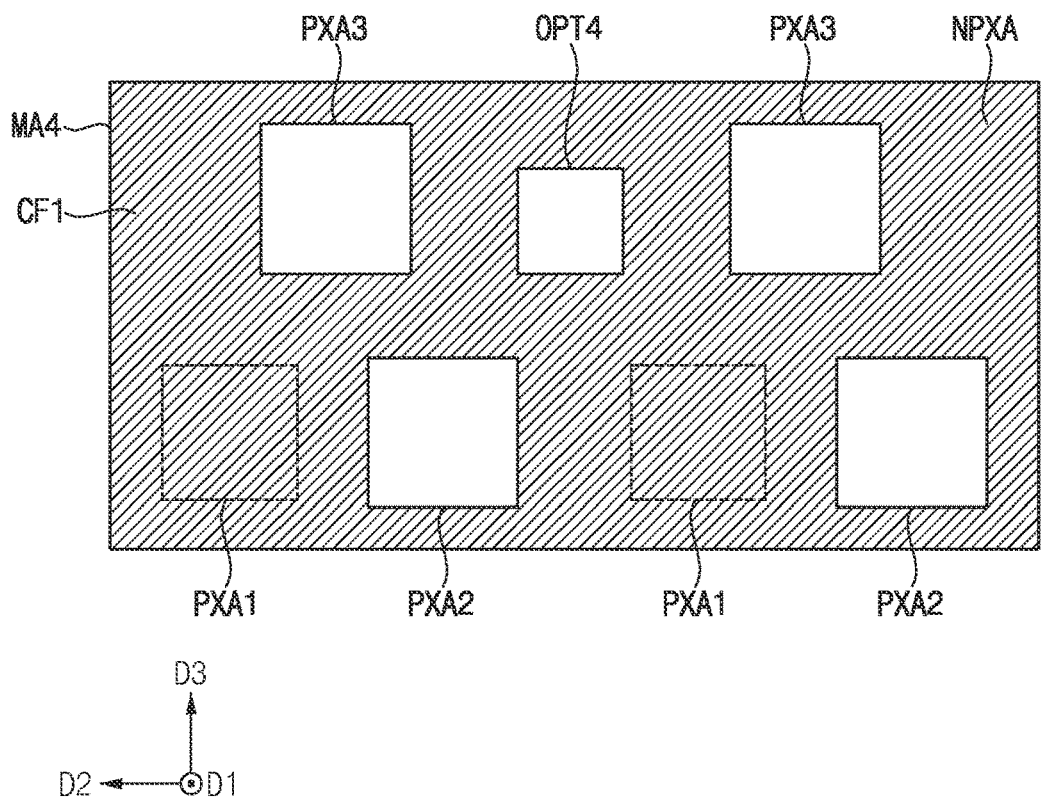
FIGS. 21A and 21B are enlarged plan view sofa fourth measurement area and a fifth measurement area of the first color filter layer included in the color conversion panel of FIG. 20, respectively.
Figure 21B:
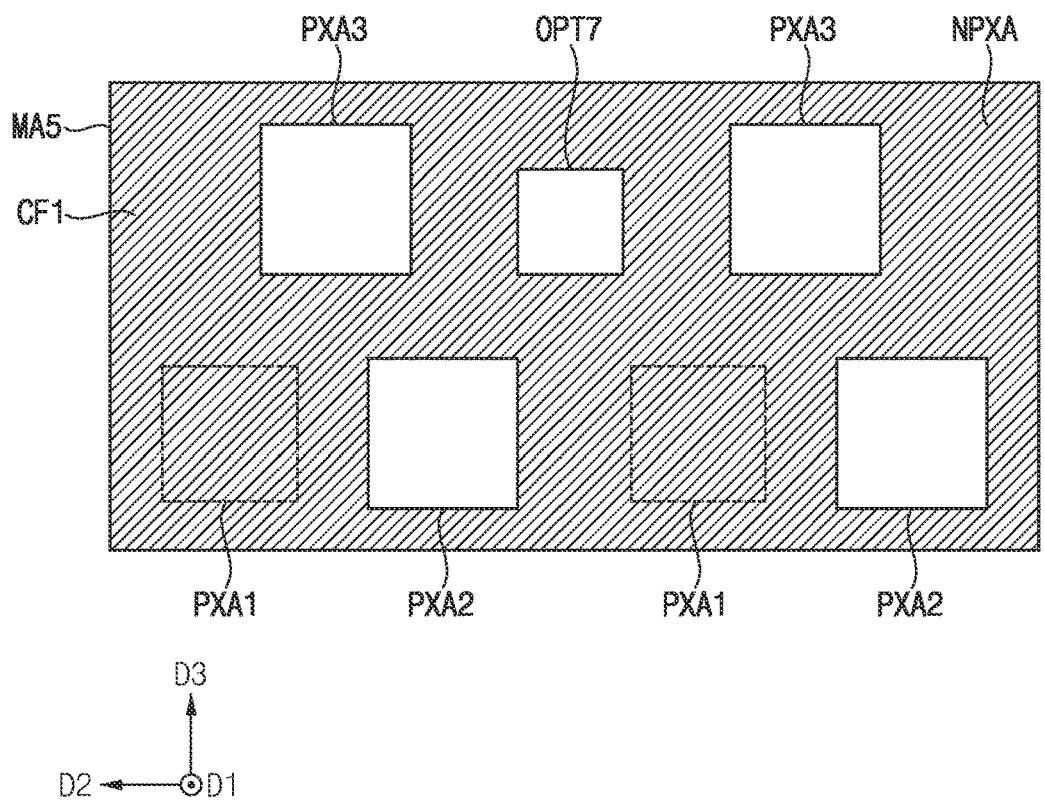

FIG. 21 is an enlarged plan view of a fourth measurement area MA4 and a fifth measurement area MA5 of the first color filter layer CF1 included in the color conversion panel of FIG. 20. FIGS. 21A and 21B may otherwise be referred to as FIG. 21.

Referring to FIGS. 20 and 21, the first color filter layer CF1 may be disposed in an entirety of the active area AA. The first color filter layer CF1 may overlap the first pixel areas PXA1 and may not overlap the second pixel areas PXA2 and the third pixel areas PXA3.

In an embodiment, the first color filter layer CF1 may include a fourth opening pattern OPT4 and a seventh opening pattern OPT7. The fourth opening pattern OPT4 may be disposed in the fourth measurement area MA4, and the seventh opening pattern OPT7 may be disposed in the fifth measurement area MA5.

Also, the fourth opening pattern OPT4 and the seventh opening pattern OPT7 may be disposed in the non-pixel area NPXA. That is, each of the fourth opening pattern OPT4 and the seventh opening pattern OPT7 may be spaced apart from the first to third pixel areas PXA1, PXA2, and PXA3.

Figure 22A:
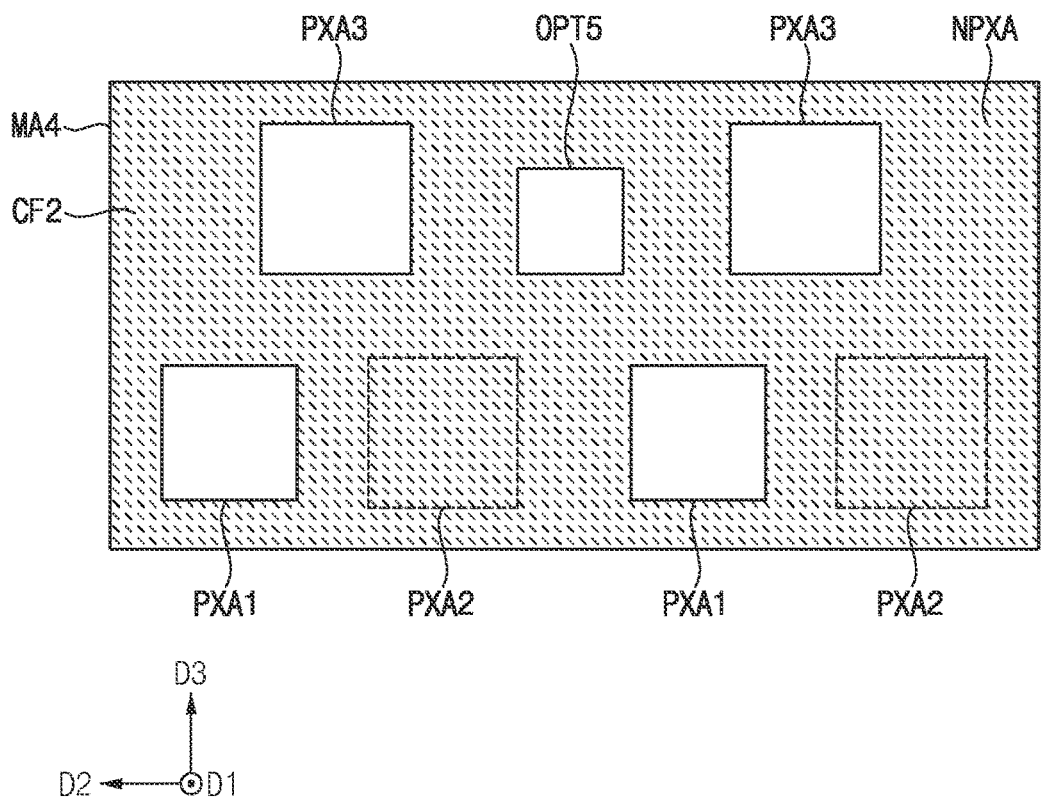
FIGS. 22A and 22B are enlarged plan views of a fourth measurement area and a fifth measurement area of the second color filter layer included in the color conversion panel of FIG. 20, respectively.
Figure 22B:
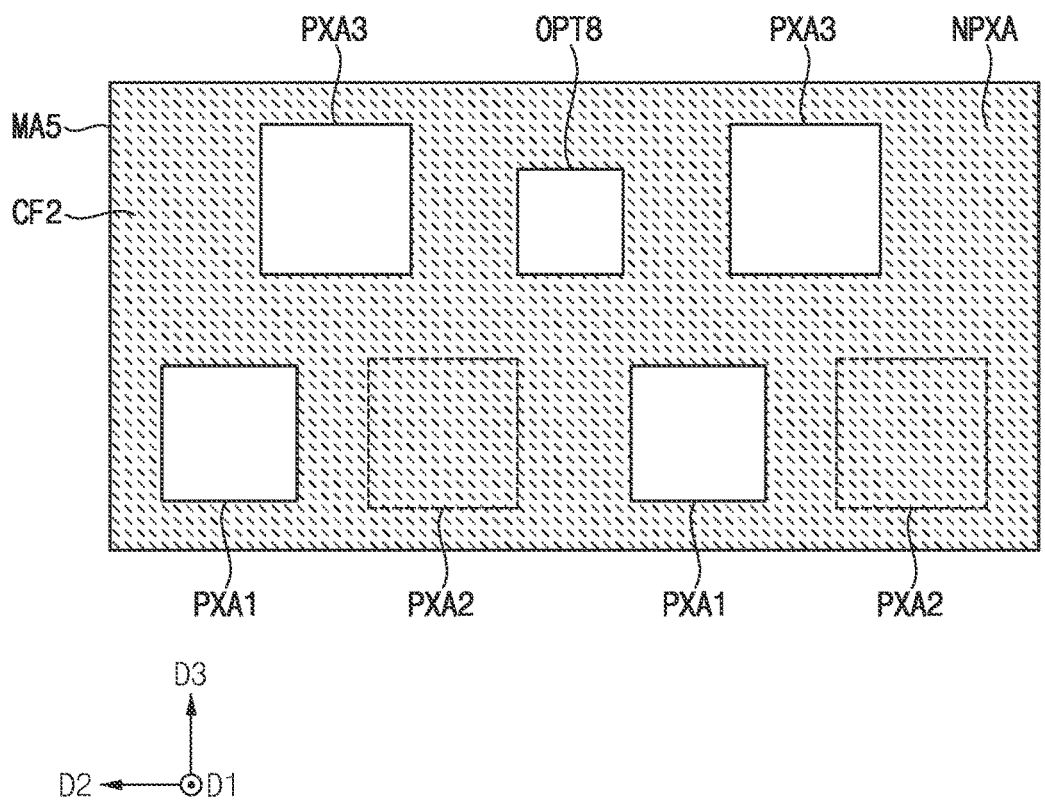
Figure 23A:
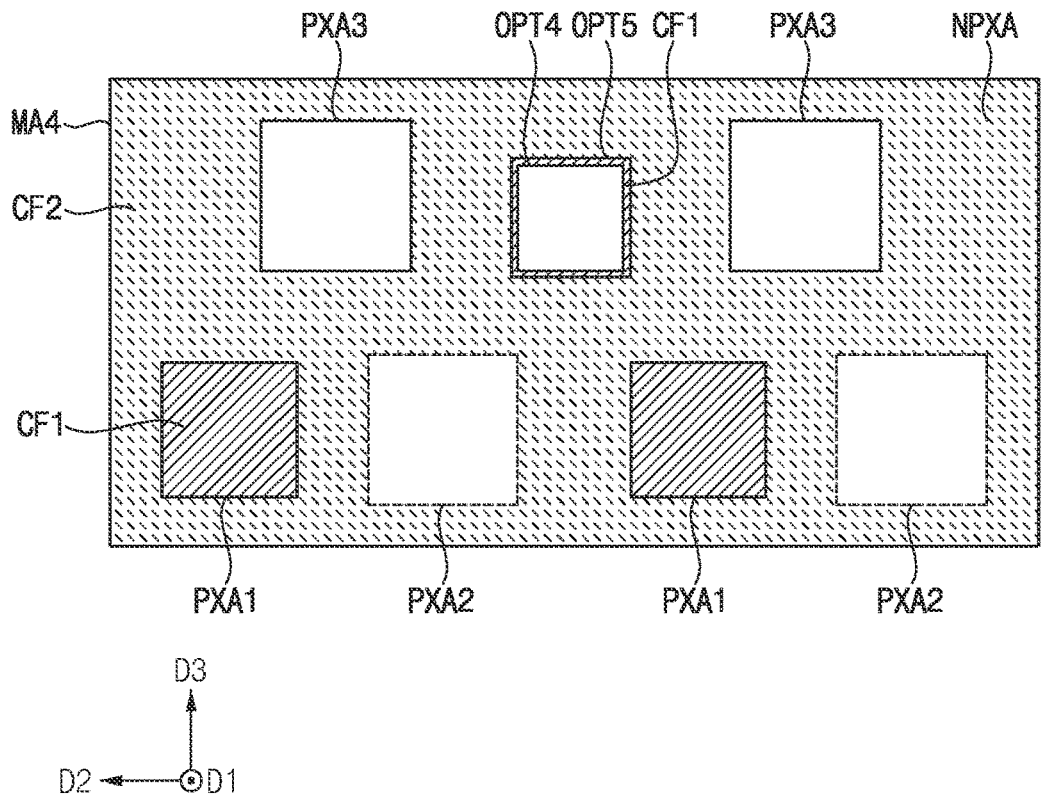
FIGS. 23A and 23B are plan views illustrating the first color filter layer of FIG. 21 together with the second color filter layer of FIG. 22.
Figure 23B:
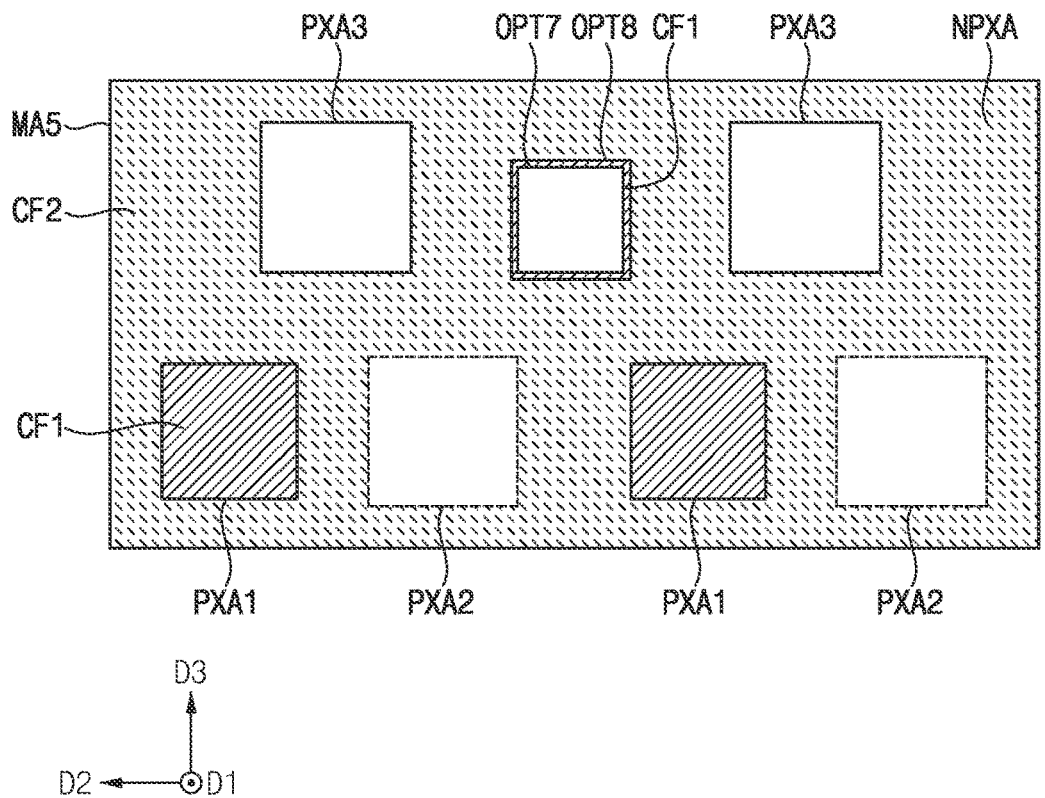

FIGS. 22A and 22B may otherwise be referred to as FIG. 22. FIGS. 23A and 23B may otherwise be referred to as FIG. 23. FIG. 22 is an enlarged plan view of a fourth measurement area MA4 and a fifth measurement MA5 area of the second color filter layer CF2 included in the color conversion panel of FIG. 20. FIG. 23 is a plan view illustrating the first color filter layer of FIG. 21 together with the second color filter layer CF2 of FIG. 22.

Referring to FIGS. 22 and 23, the second color filter layer CF2 may be disposed in an entirety of the active area AA. The second color filter layer CF2 may overlap the second pixel areas PXA2 and may not overlap the first pixel areas PXA1 and the third pixel areas PXA3.

In an embodiment, the second color filter layer CF2 may include a fifth opening pattern OPT5 and an eighth opening pattern OPT8. A total planar area of the fifth opening pattern OPT5 and the eighth opening pattern OPT8, may be smaller than a total planar area of the fourth opening pattern OPT4 and the seventh opening pattern OPT7, respectively. The fifth opening pattern OPT5 may be disposed in the fourth measurement area MA4 and may overlap (or be aligned with) the fourth opening pattern OPT4. The eighth opening pattern OPT8 may be disposed in the fifth measurement area MA5 and may overlap (or be aligned with) the seventh opening pattern OPT7. The fifth opening pattern OPT5 and the eighth opening pattern OPT8 may be disposed in the non-pixel area NPXA.

For example, the fifth opening pattern OPT5 may partially expose the first color filter layer CF1. A portion of the first color filter layer CF1 which has the edge defining the fourth opening pattern OPT4 may be exposed by the fifth opening pattern OPT5.

Figure 24A:
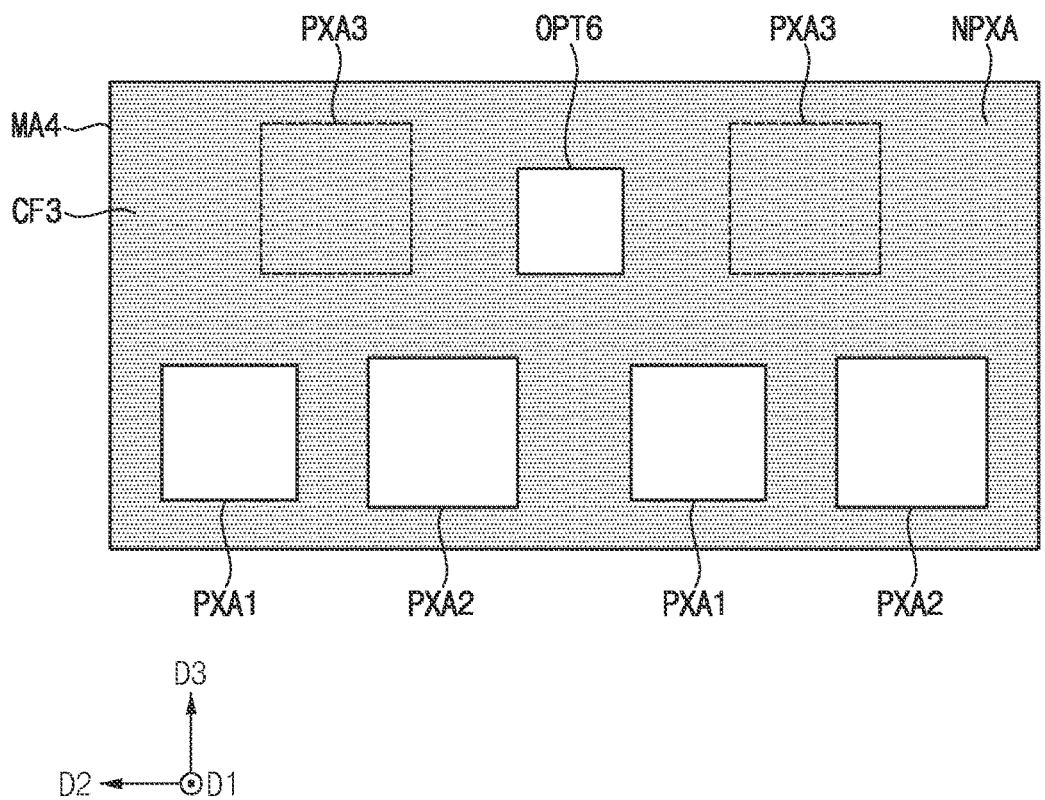
FIGS. 24A and 24B are enlarged plan views of a fourth measurement area and a fifth measurement area of the third color filter layer included in the color conversion panel of FIG. 20, respectively.
Figure 24B:
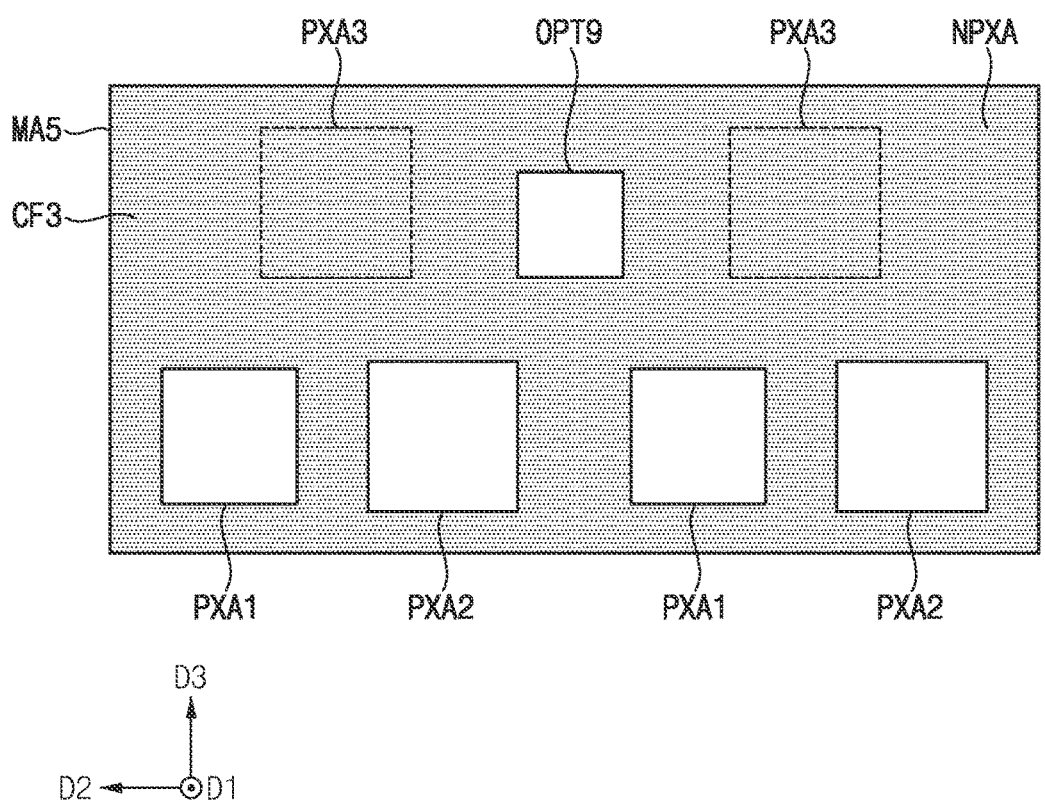
Figure 25A:
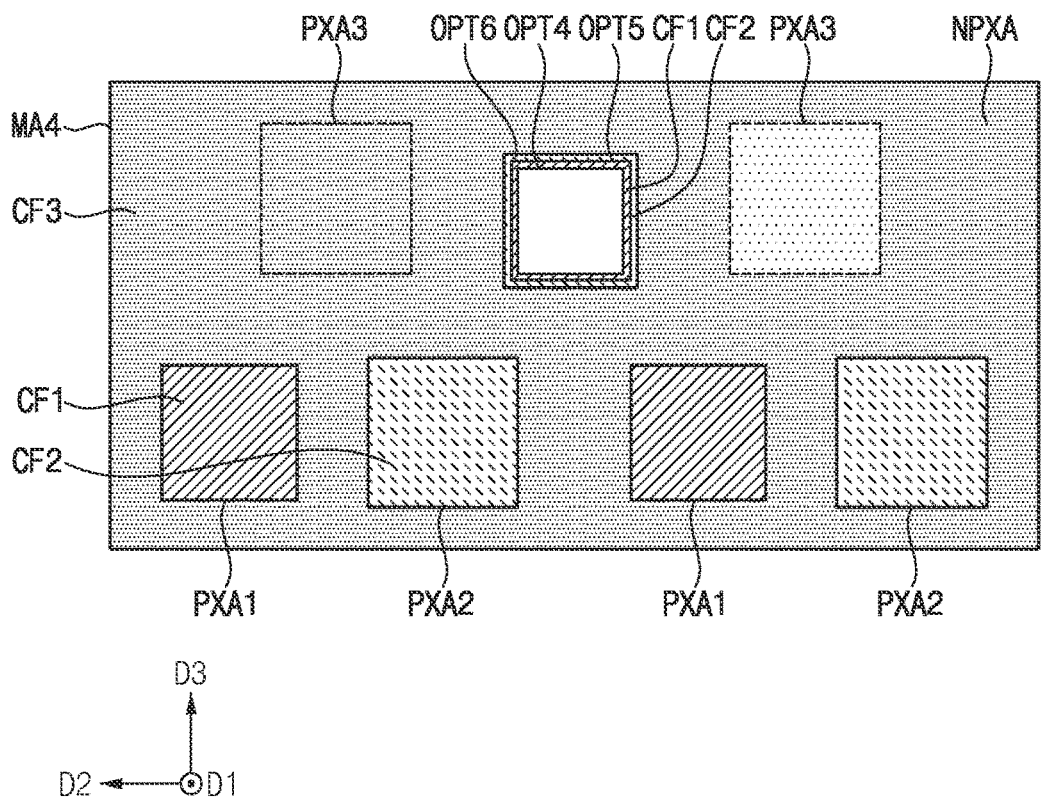
FIGS. 25A and 25B are plan views illustrating the first color filter layer of FIG. 21 together with the second color filter layer of FIG. 22 and the third color filter layer of FIG. 24.
Figure 25B:
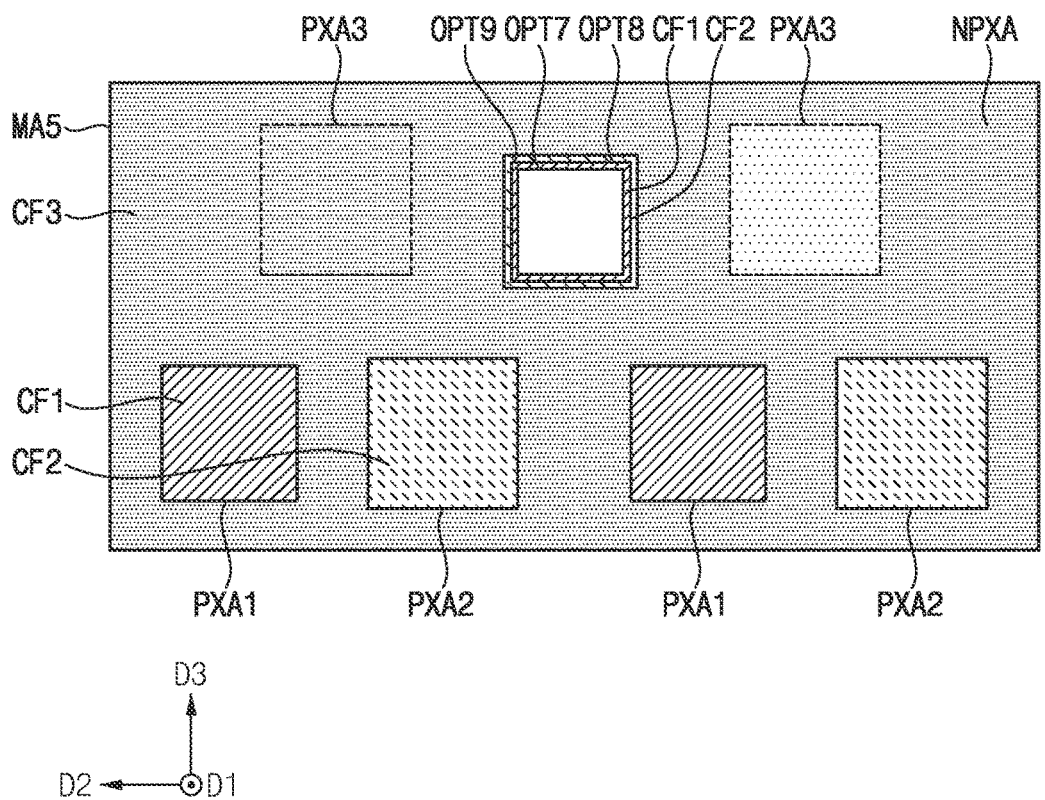

The eighth opening pattern OPT8 may partially expose the first color filter layer CF1. A portion of the first color filter layer CF1 which has the edge defining the seventh opening pattern OPT7 may be exposed by the eighth opening pattern OPT8. However, embodiments according to the present disclosure may not be limited thereto. The portion of the first color filter layer CF1 may be extended along the edge of the second color filter layer CF2 which defines the fifth opening pattern OPT5 and the eighth opening pattern OPT8, FIGS. 24A and 24B may otherwise be referred to as FIG. 24. FIGS. 25A and 25B may otherwise be referred to as FIG. 25. FIG. 24 is an enlarged plan view of a fourth measurement area MA4 and a fifth measurement area MA5 of the third color filter layer CF3 included in the color conversion panel of FIG. 20. FIG. 25 is a plan view illustrating the first color filter layer CF1 of FIG. 21, together with the second color filter layer CF2 of FIG. 22, and the third color filter layer CF3 of FIG. 24.

Referring further to FIGS. 24 and 25, the third color filter layer CF3 may be disposed in an entirety of the active area AA. The third color filter layer CF3 may overlap the third pixel areas PXA3 and may not overlap the first pixel areas PXA1 and the second pixel areas PXA2.

In an embodiment, the third color filter layer CF3 may include a sixth opening pattern OPT6 and a ninth opening pattern OPT9. The sixth opening pattern OPT6 may be disposed in the fourth measurement area MA4 and may overlap the fourth opening pattern OPT4 and the fifth opening pattern OPT5. The ninth opening pattern OPT9 may be disposed in the fifth measurement area MA5 and may overlap the seventh opening pattern OPT7 and the eighth opening pattern OPT8. The sixth opening pattern OPT6 and the ninth opening pattern OPT9 may be disposed in the non-pixel area NPXA. A total planar area of sixth opening pattern OPT6 and the ninth opening pattern OPT9, may be smaller than a total planar area of the fifth opening pattern OPT5 and the eighth opening pattern OPT8 and a total planar area of the fourth opening pattern OPT4 and the seventh opening pattern OPT7, respectively.

The sixth opening pattern OPT6 may partially expose the first color filter layer CF1 and the second color filter layer CF2. A portion of the first color filter layer CF1 which has the edge defining the fourth opening pattern OPT4 and a portion of the second color filter layer CF2 which has the edge defining the fifth opening pattern OPT5, may be exposed by the sixth opening pattern OPT6.

Also, the ninth opening pattern OPT9 may partially expose the first color filter layer CF1 and the second color filter layer CF2. A portion of the first color filter layer CF1 which has the edge defining the seventh opening pattern OPT7 and a portion of the second color filter layer CF2 which has the edge defining the eighth opening pattern OPT8 may be exposed by the ninth opening pattern OPT9. However, the present disclosure is not limited thereto.

Figure 26A:
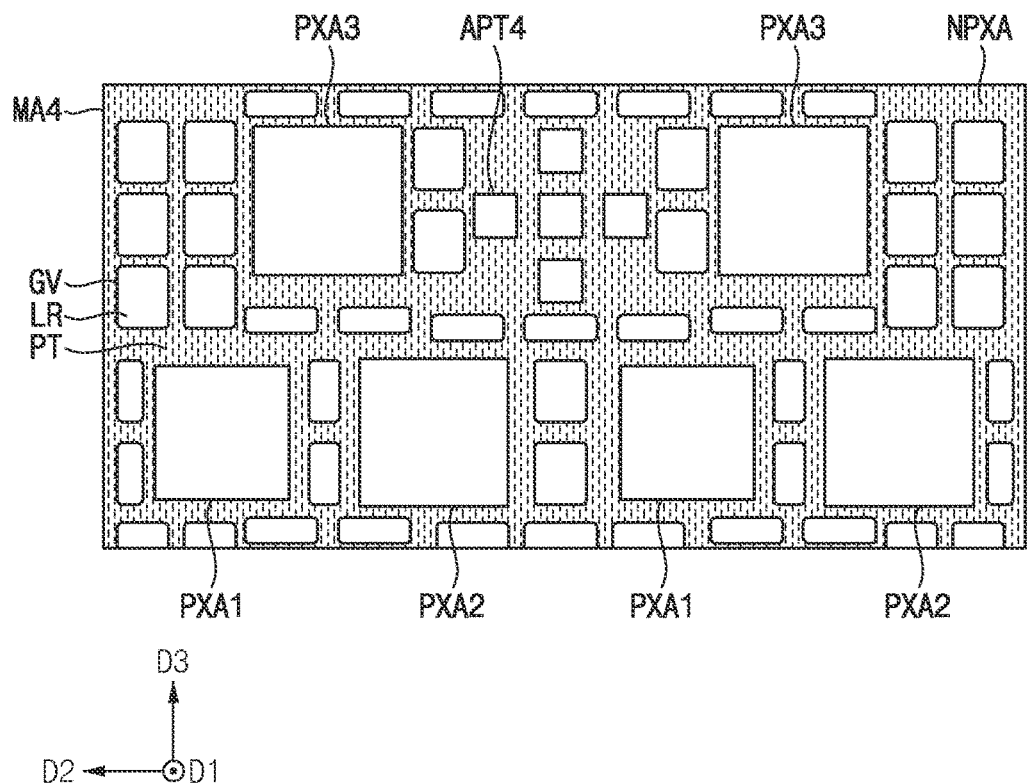
FIGS. 26A and 26B are enlarged plan views of a fourth measurement area and a fifth measurement area of a partition layer included in the color conversion panel of FIG. 20, respectively.
Figure 26B:
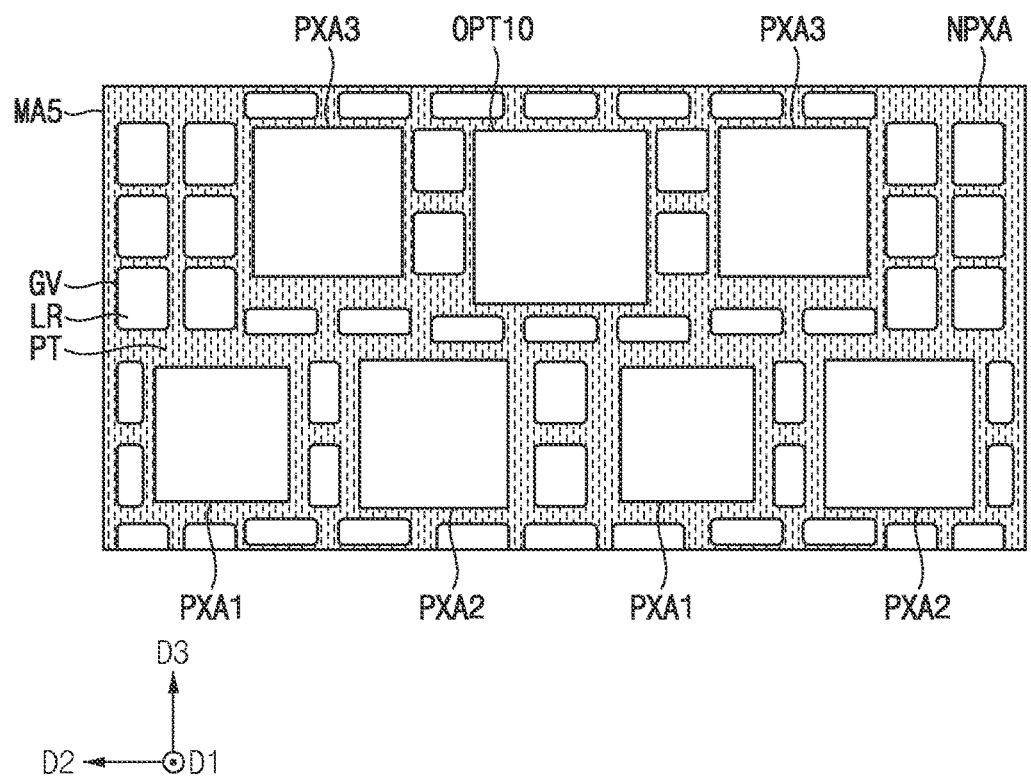
Figure 27A:
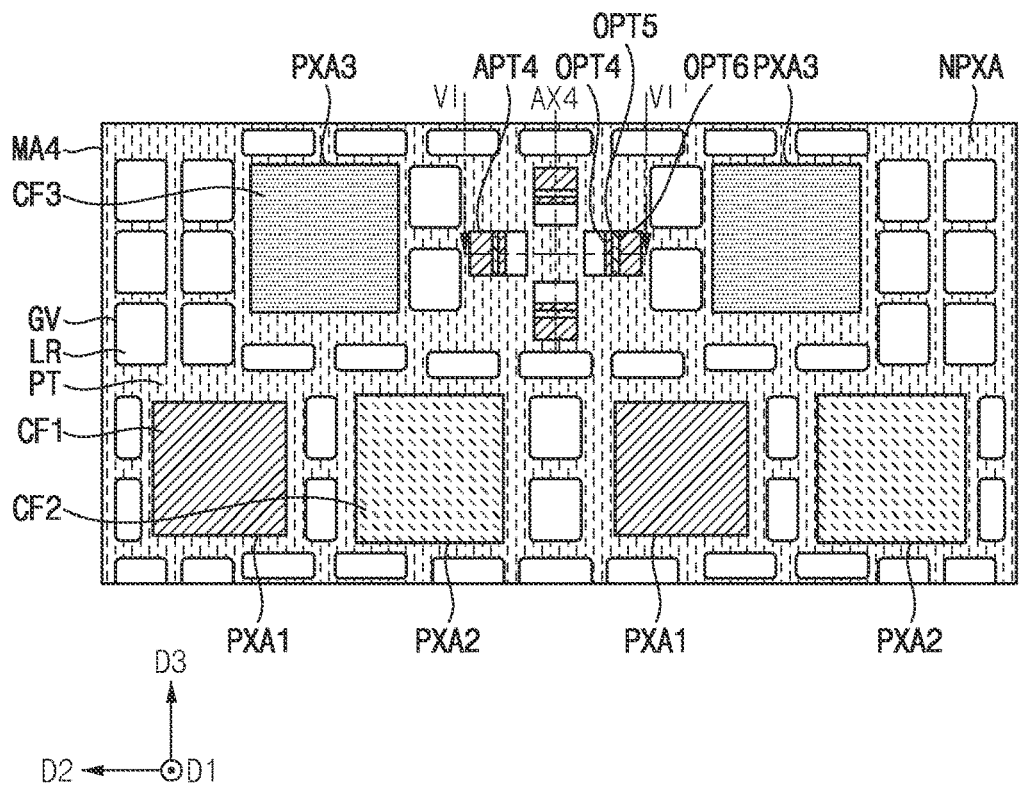
FIGS. 27A and 27B are plan views illustrating the first color filter layer of FIG. 21 together with the second color filter layer of FIG. 22, the third color filter layer of FIG. 24 and the partition layer of FIG. 26.
Figure 27B:
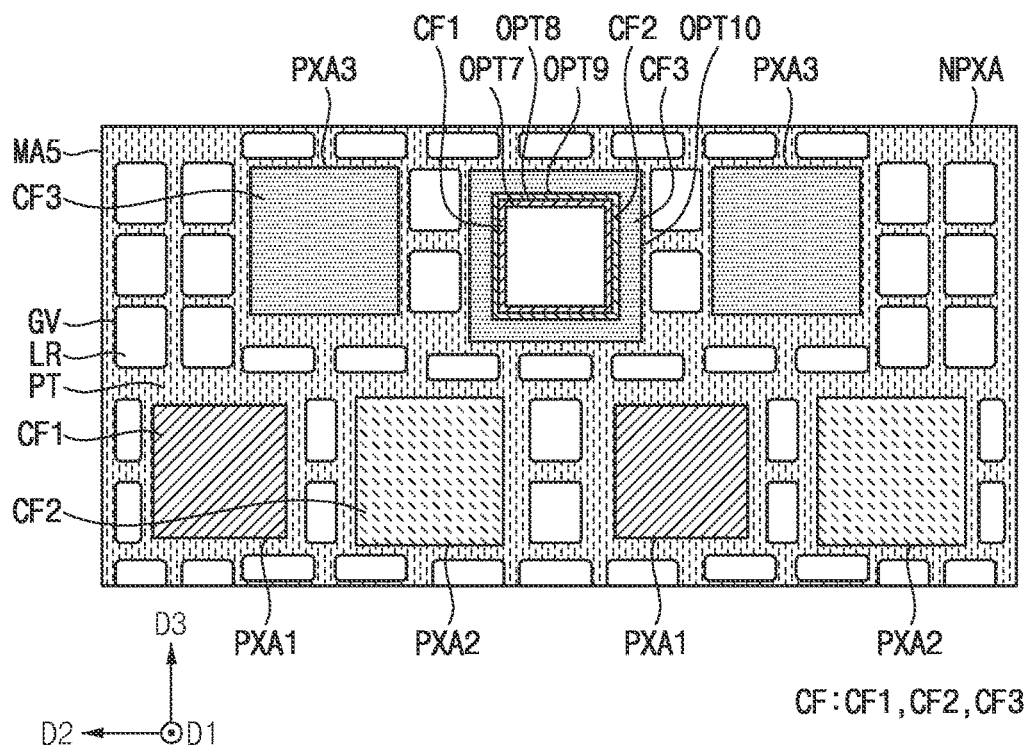

FIGS. 27A and 27B may otherwise be referred to as FIG. 27. FIG. 26 is an enlarged plan view of a fourth measurement area MA4 and a fifth measurement area MA5 of a partition layer PT included in the color conversion panel 104 of FIG. 20. FIG. 27 is a plan view illustrating the first color filter layer CF1 of FIG. 21, the second color filter layer of FIG. 22, the third color filter layer of FIG. 24, and the partition layer of FIG. 26.

Referring further to FIGS. 26 and 27, the low refractive index layer LR may be disposed in the active area AA, on the third color filter layer CF3, and may cover the color filter layer CF.

In an embodiment, the partition layer PT may be disposed on the low refractive index layer LR, and disposed on an entirety of the active area AA. The partition layer PT may include a fourth alignment pattern APT4 and a tenth opening pattern OPT10. The fourth alignment pattern APT4 may be configured as solid portions (e.g., a plurality of fourth solid portions) spaced apart from each other, together with one or more opening defined by the solid portions and extended through a thickness of the partition layer PT (e.g., a fourth alignment opening).

The fourth alignment pattern APT4 may be disposed in the fourth measurement area MA4, and overlap (or be aligned with) the fourth opening pattern OPT4, the fifth opening pattern OPT5, and the sixth opening pattern OPT6. The tenth opening pattern OPT10 may be disposed in the fifth measurement area MA5, and overlap (or be aligned with) the seventh opening pattern OPT7, the eighth opening pattern OPT5, and the ninth opening pattern OPT5.

Taking FIGS. 25 and 26 together, the fourth alignment pattern APT4 may partially expose at least one of the first color filter layer CF1, the second color filter layer CF2, and the third color filter layer CF3. For example, the fourth alignment pattern APT4 may expose all of the first to third color filter layers CF1, CF2, and CF3. However, the present disclosure is not limited thereto.

The tenth opening pattern OPT10 may partially expose at least one of the first color filter layer CF1, the second color filter layer CF2, and the third color filter layer CF3. For example, the tenth opening pattern OPT10 may expose all of the first to third color filter layers CF1, CF2, and CF3. However, the present disclosure is not limited thereto.

Each of the fourth opening pattern OPT4, the fifth opening pattern OPT5, the sixth opening pattern OPT6, and the fourth alignment pattern APT4 may be symmetrical with respect to a fourth axis AX4. The fourth axis AX4 may extend in the third direction D3. However, the present disclosure is not limited thereto, and the fourth axis AX4 may extend in the second direction D2 or a diagonal direction.

Figure 28:
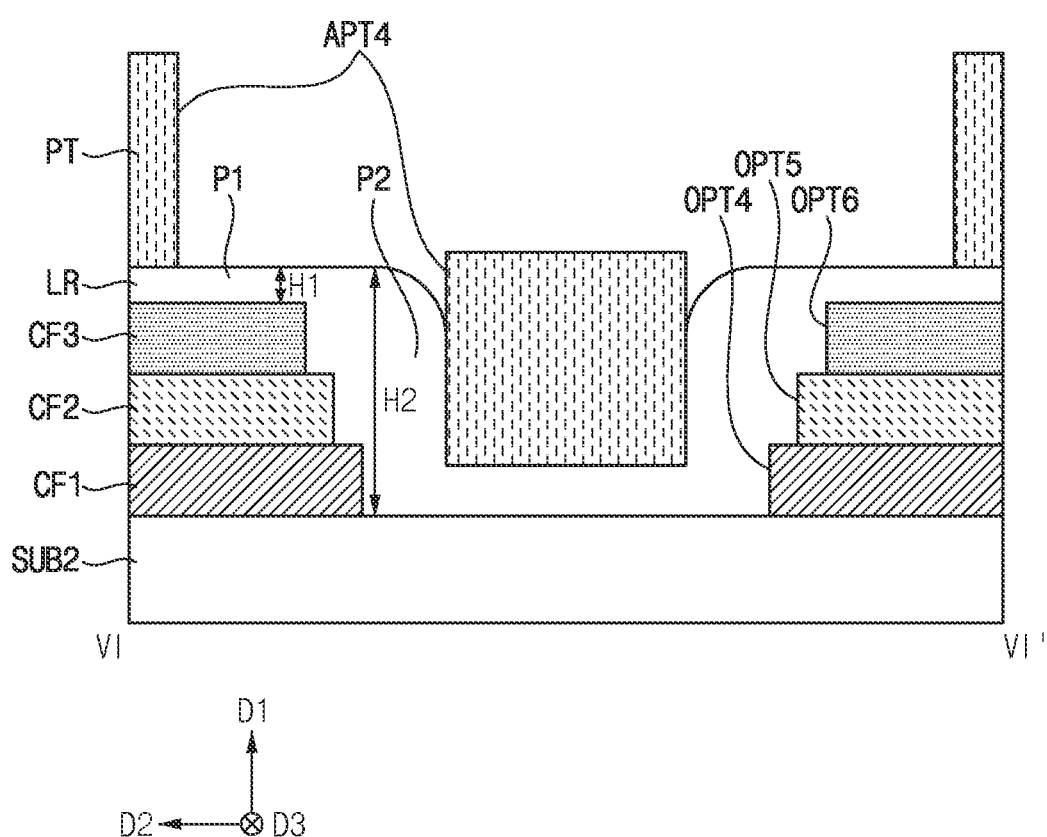
FIG. 28 is a cross-sectional view taken along the line VI-VI' of FIG. 27.

FIG. 28 is a cross-sectional view taken along line VI-VI' of FIG. 27.

Referring further to FIG. 28, the low refractive index layer LR may include a first portion P1 and a second portion P2. The first portion P1 may correspond to a stack of color filter layers CF and the second portion P2 may overlap or correspond to the fourth alignment pattern APT4.

The first portion P1 may overlap at least one of the first color filter layer CF1, the second color filter layer CF2, and the third color filter layer CF3, and may extend to the edges of the color filter layers CF which define the various opening patterns. That is, the first portion P1 may be a portion of the low refractive index layer LR overlapping the first color filter layer CF1, the second color filter layer CF2, or the third color filter layer CF3 which are each exposed to outside the partition layer PT by the fourth alignment pattern APT4. For example, the first portion P1 may overlap edge portions of the first to third color filter layers CF1, CF2, and CF3.

The second portion P2 may not overlap all of the first color filter layer CF1, the second color filter layer CF2, and the third color filter layer CF3. The second portion P2 may extend from the edges of the color filter layers CF which define the various opening patterns, toward a center of the fourth alignment pattern APT4

In an embodiment, a height H1 of the first portion P1 may be less than a height H2 of the second portion P2. The height H1 of the first portion P1 may be reduced, due to the first to third color filter layers CF1, CF2, and CF3 being absent toward a center of the fourth alignment pattern APT4. Accordingly, a height difference between the first part P1 and the second part P2 may occur.

Considering the fifth measurement area MA5 in FIG. 27, where this is no solid portion of the partition layer PT within the aligned openings OPT7, OPT8 and OPT9, the low refractive layer may extend over the edge portions of the color filter layers CF and across the tenth opening pattern OPT10.

Figure 29A:
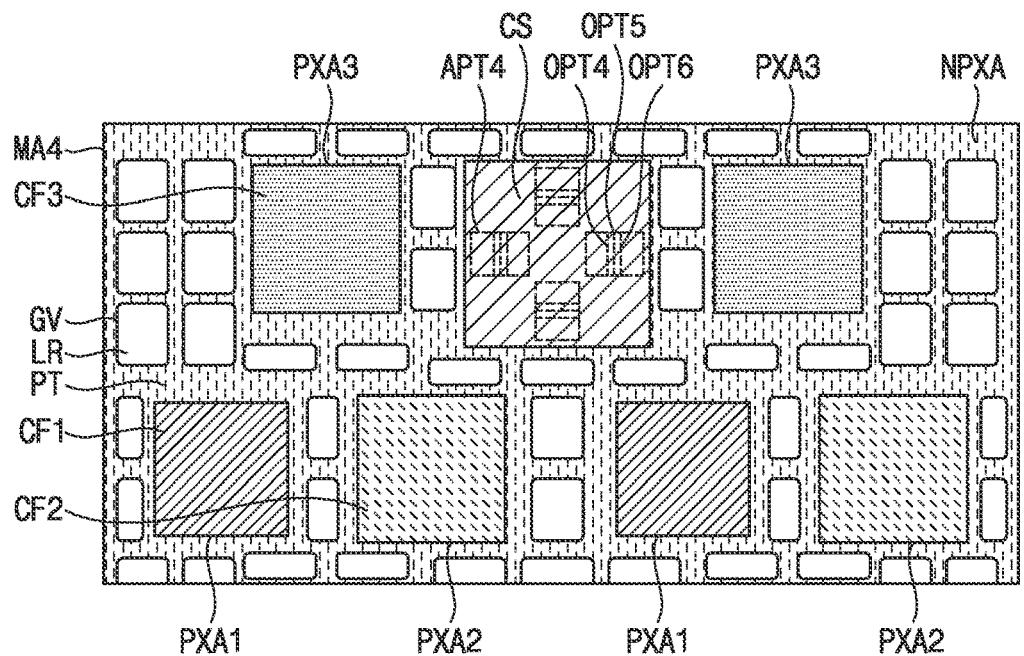
FIGS. 29A and 29B are enlarged plan views of the fourth measurement area and the fifth measurement area of FIG. 20, respectively.
Figure 29B:
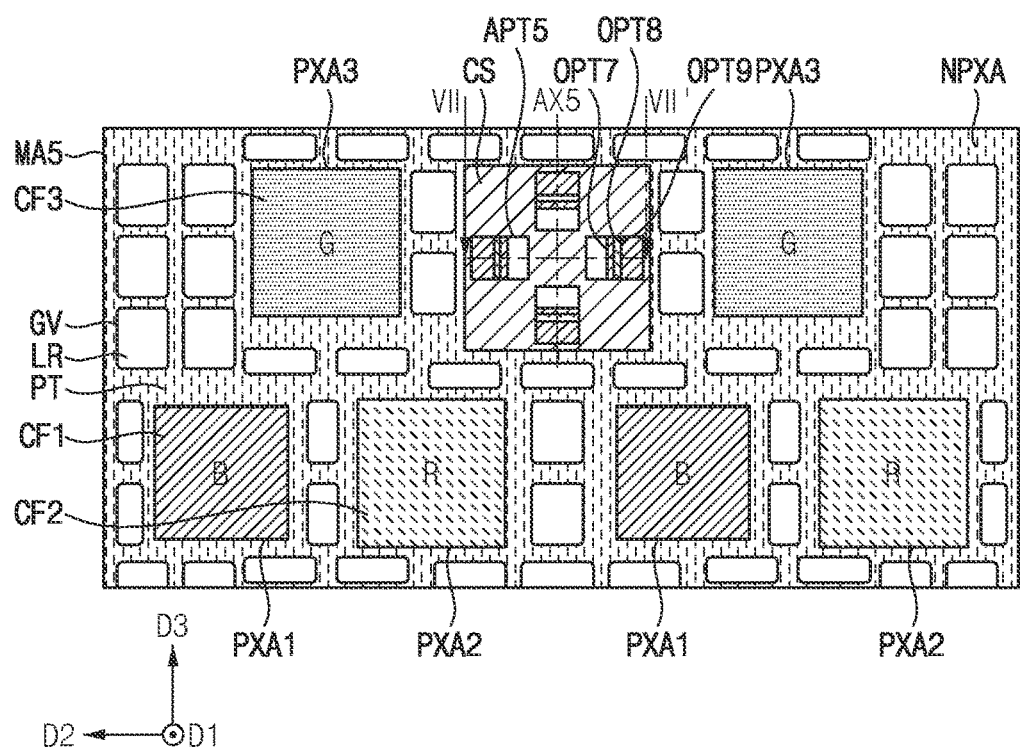

FIGS. 29A and 29B may otherwise be referred to as FIG. 29. FIG. 29 is an enlarged plan view of the fourth measurement area MA4 and the fifth measurement area MA5 of FIG. 20.

For example, FIG. 29 is a plan view illustrating the first color filter layer CF1 of FIG. 21, together with the second color filter layer CF2 of FIG. 22, the third color filter layer CF3 of FIG. 24, the partition layer PT of FIG. 26, and the spacer CS (e.g., a spacer layer).

Referring further to FIG. 29, a spacer CS may be disposed on the partition layer PT. The spacer CS may be disposed in the non-pixel area NPXA. The spacer CS may be disposed in the fourth measurement area MA4, overlap the fourth alignment pattern APT4, and cover the fourth alignment pattern APT4.

In an embodiment, the spacer CS may include a fifth alignment pattern APT5. The fifth alignment pattern APT5 may be disposed in the fifth measurement area MA5, and overlap the seventh opening pattern OPT7, the eighth opening pattern OPT8, the ninth opening pattern OPT9, and the tenth opening pattern OPT10.

The fifth alignment pattern APT5 may partially expose at least one of the first color filter layer CF1, the second color filter layer CF2, and the third color filter layer CF3. For example, the fifth alignment pattern APT5 may expose all of the first to third color filter layers CF1, CF2, and CF3. However, the present disclosure is not limited thereto.

The seventh opening pattern OPT7, the eighth opening pattern OPT8, the ninth opening pattern OPT9, and the fifth alignment pattern APT5 may be symmetrical with respect to a fifth axis AX5. have. The fifth axis AX5 may extend in the third direction D3. However, the present disclosure is not limited thereto, and the fifth axis AX5 may extend in the second direction D2 or a diagonal direction.

Figure 30:
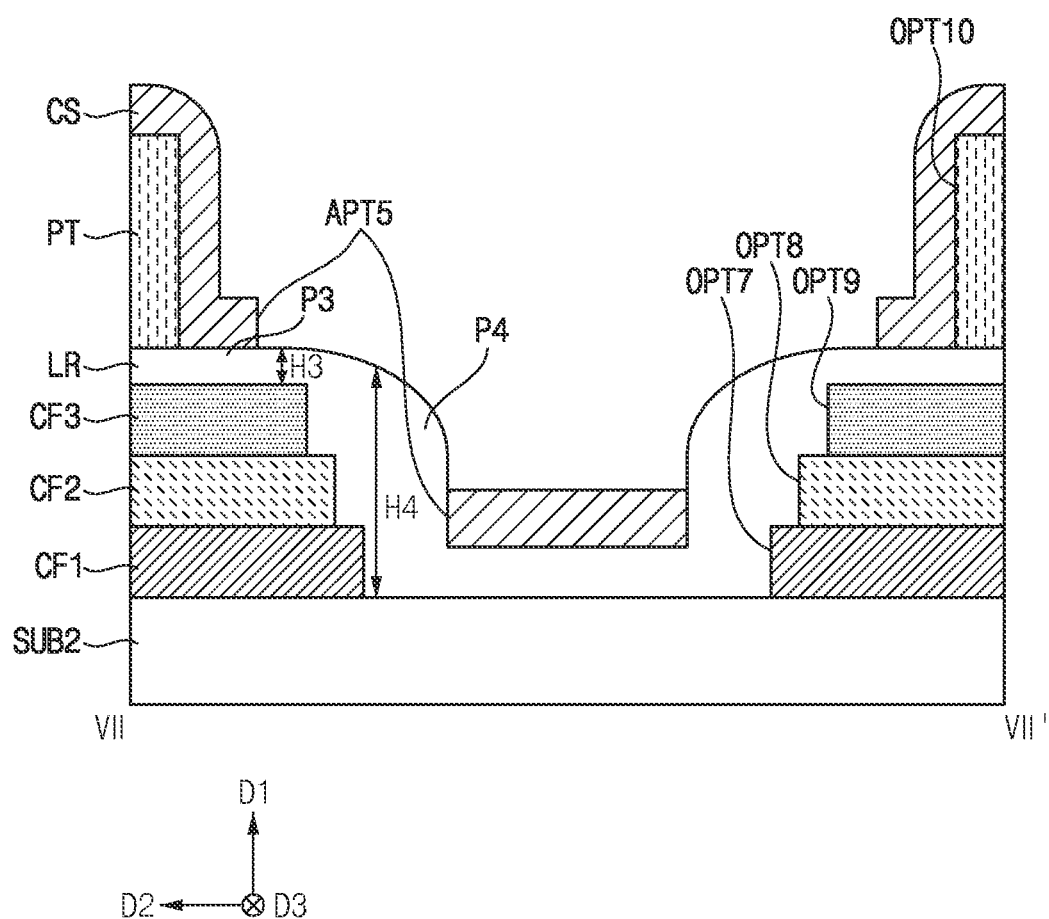
FIG. 30 is a cross-sectional view taken along line VII-VII' of FIG. 29.

FIG. 30 is a cross-sectional view taken along line VII-VII' of FIG. 29.

Referring further to FIG. 30, the low refractive index layer LR may include a third portion P3 and a fourth portion P4. The third portion P3 and the fourth portion P4 may overlap the fifth alignment pattern APT5.

The third portion P3 may overlap at least one of the first color filter layer CF1, the second color filter layer CF2, and the third color filter layer CF3. That is, the third portion P3 may be a portion of the low refractive index layer LR overlapping the first color filter layer CF1, the second color filter layer CF2, or the third color filter layer CF3 exposed by the fifth alignment pattern APT5. For example, the third portion P3 may overlap the first to third color filter layers CF1, CF2, and CF3.

The fourth portion P4 may not overlap all of the first color filter layer CF1, the second color filter layer CF2, and the third color filter layer CF3.

In an embodiment, a height H3 of the third portion P3 may be less than a height H4 of the fourth portion P4. The height H3 of the third portion P3 may be reduced due to the first to third color filter layers CF1, CF2, and CF3. Accordingly, a height difference between the third portion P3 and the fourth portion P4 may occur.

In an embodiment, as the low refractive index layer LR includes the first to fourth portions P1, P2, P3, and P4, and the height H1 of the first portion P1 is less than the height H2 of the second portion P2, and the height H3 of the third portion P3 is less than the height H4 of the fourth portion P4, fringe phenomenon in displaying an image through the color conversion panel 105 due to the low refractive index layer LR may be prevented. Accordingly, even after the low refractive index layer LR is formed, the first to third color filter layers CF1, CF2, and CF3 under the low refractive index layer LR may be visually recognized. Each of the partition layer PT and the spacer CS may be arranged in positions along the second substrate SUB2, with respect to at least one of the first to third color filter layers CF1, CF2, and CF3 through the opening patterns (e.g., the alignments patterns and the opening patterns) included in the first to third color filter layers CF1, CF2, and CF3, respectively.

FIGS. 31 to 35 are plan views illustrating examples of the fourth measurement area MA4 of FIG. 27.

In color conversion panels described with reference to FIGS. 31 to 35, a portion overlapping with the color conversion panel 105 described with reference to FIGS. 20 to 30 may be omitted.

Figure 31:
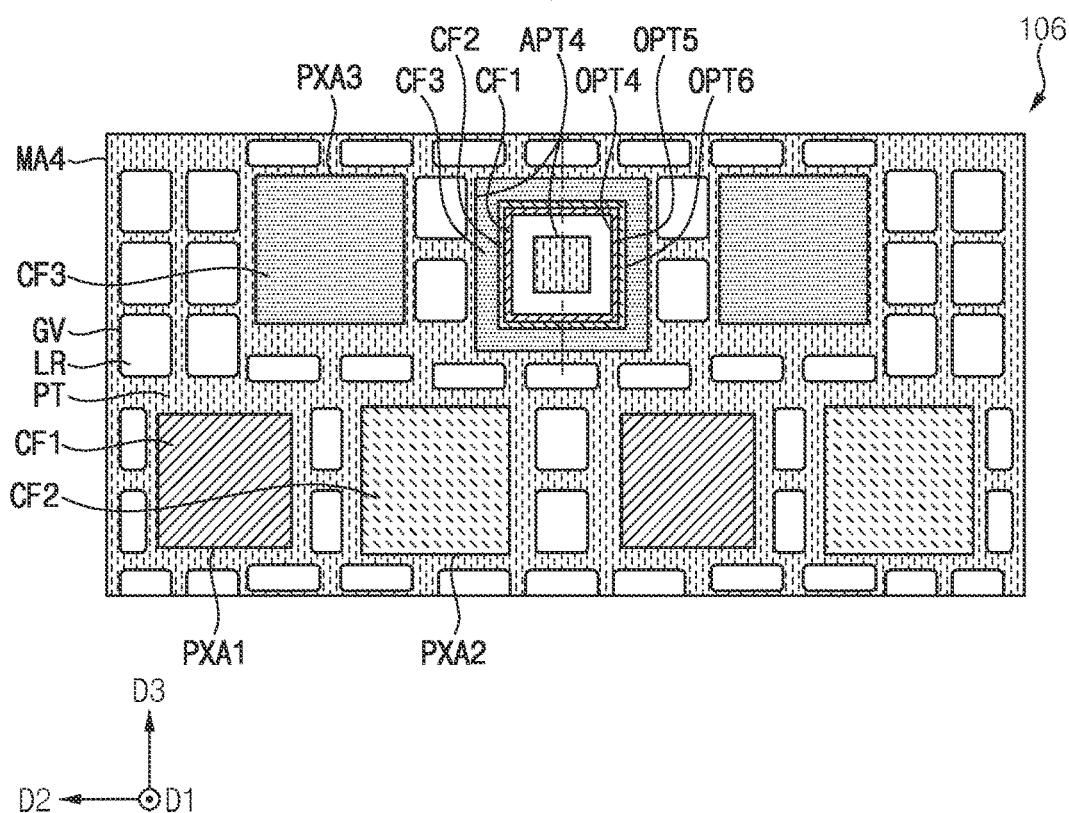
FIGS. 31 to 35 are plan views illustrating another example of the fourth measurement area of FIG. 27.

Referring to FIG. 31, a color conversion panel 106 may include a first color filter layer CF1, a second color filter layer CF2, a third color filter layer CF3, a low refractive index layer LR, and a partition layer PT. The partition layer PT may be measured by the fourth measurement area MA4 included in each of the stitch areas (e.g., the stitch areas STA1 and STA2 of FIG. 20).

The first color filter layer CF1 may include a fourth opening pattern OPT4 disposed in the non-pixel area NPXA of the fourth measurement area MA4. The second color filter layer CF2 may include a fifth opening pattern OPT5 overlapping the fourth opening pattern OPT4. The third color filter layer CF3 may include a sixth opening pattern OPT6 overlapping the fourth opening pattern OPT4 and the fifth opening pattern OPT5. The partition layer PT may include a fourth alignment pattern APT4 overlapping the fourth to sixth opening patterns OPT4, OPT5, and OPT6.

Each of the fourth opening pattern OPT4, the fifth opening pattern OPT5, the sixth opening pattern OPT6, and the fourth alignment pattern APT4 may be symmetrical with respect to an axis. The axis may extend in the third direction D3. However, the present disclosure is not limited thereto, and the axis may extend in the second direction D2 or a diagonal direction.

For example, the fourth alignment pattern APT4 may have a frame shape opening symmetrical with respect to the axis. Accordingly, the partition layer PT may include an island pattern as a solid portion disposed in the frame shape opening of the fourth opening pattern OPT4, due to the fourth alignment pattern APT4.

The fourth alignment pattern APT4 may partially expose at least one of the first color filter layer CF1, the second color filter layer CF2, and the third color filter layer CF3. For example, the fourth alignment pattern APT4 may expose all of the first to third color filter layers CF1, CF2, and CF3. However, the present disclosure is not limited thereto.

Although the fourth measurement area MA4 has been described as a reference, when the fifth measurement area MA5 is measured, a spacer (e.g., the spacer CS of FIG. 29) may be measured using the same patterns. That is, the spacer CS in the fifth measurement area MA5 may have a frame shape opening symmetrical with respect to the axis, together with an island pattern as a solid portion disposed in the frame shape opening.

Figure 32:
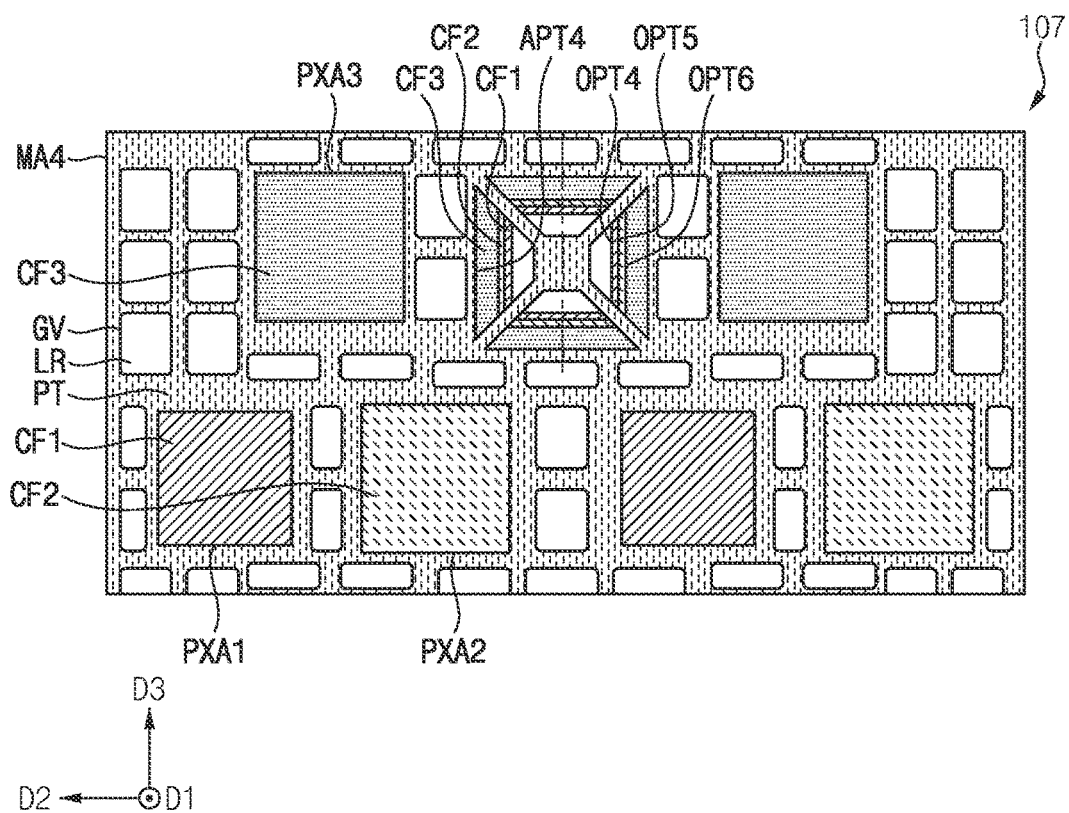

Referring to FIG. 32, a color conversion panel 107 may include a first color filter layer CF1, a second color filter layer CF2, a third color filter layer CF3, a low refractive index layer, and a partition layer PT.

Each of the fourth opening pattern OPT4, the fifth opening pattern OPT5, the sixth opening pattern OPT6, and the fourth alignment pattern APT4 may be symmetric with respect to an axis passing through a center of the fourth alignment pattern APT4. The axis may extend in the third direction D3. However, the present disclosure is not limited thereto, and the axis may extend in the second direction D2 or a diagonal direction.

For example, the fourth alignment pattern APT4 may have sub-alignment patterns each having a triangular shape. Accordingly, an opening portion of the fourth alignment pattern APT4 may cross at the center of the fourth alignment pattern APT4 and define an X-shaped shape symmetrical with respect to the axis.

The fourth alignment pattern APT4 may partially expose at least one of the first color filter layer CF1, the second color filter layer CF2, and the third color filter layer CF3. For example, the fourth alignment pattern APT4 may expose all of the first to third color filter layers CF1, CF2, and CF3. However, the present disclosure is not limited thereto.

Although the fourth measurement area MA4 has been described as a reference, when the fifth measurement area MA5 is measured, the spacer CS may be measured using the same patterns as the partition layer PT in FIG. 32.

Figure 33:
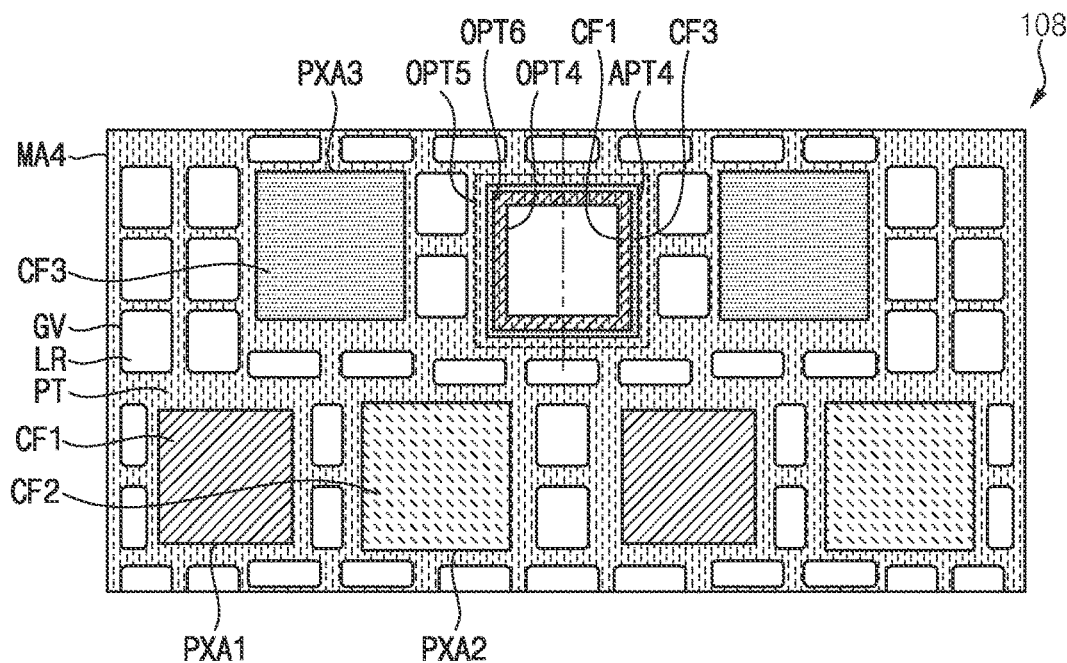

Referring to FIG. 33, the color conversion panel 108 may include a first color filter layer CF1, a second color filter layer CF2, a third color filter layer CF3, a low refractive index layer, and a partition layer PT.

Each of the fourth opening pattern OPT4, the fifth opening pattern OPT5, the sixth opening pattern OPT6, and the fourth alignment pattern APT4 may be symmetric with respect to an axis passing through a center of the fourth alignment pattern APT4. The axis may extend in the third direction D3. However, the present disclosure is not limited thereto, and the axis may extend in the second direction D2 or a diagonal direction.

The fifth opening pattern OPT5 may have a greater area than the sixth opening pattern OPT6. Accordingly, the second color filter layer CF2 may not be exposed by the sixth opening pattern OPT6.

The fourth alignment pattern APT4 may partially expose at least one of the first color filter layer CF1, the second color filter layer CF2, and the third color filter layer CF3. For example, the fourth alignment pattern APT4 may expose the first and third color filter layers CF1 and CF3, and the second color filter layer CF2 may not be exposed. However, the present disclosure is not limited thereto.

Although the fourth measurement area MA4 has been described as a reference, when the fifth measurement area MA5 is measured, the spacer CS may be measured using the same patterns as the partition layer PT in FIG. 33.

Figure 34:
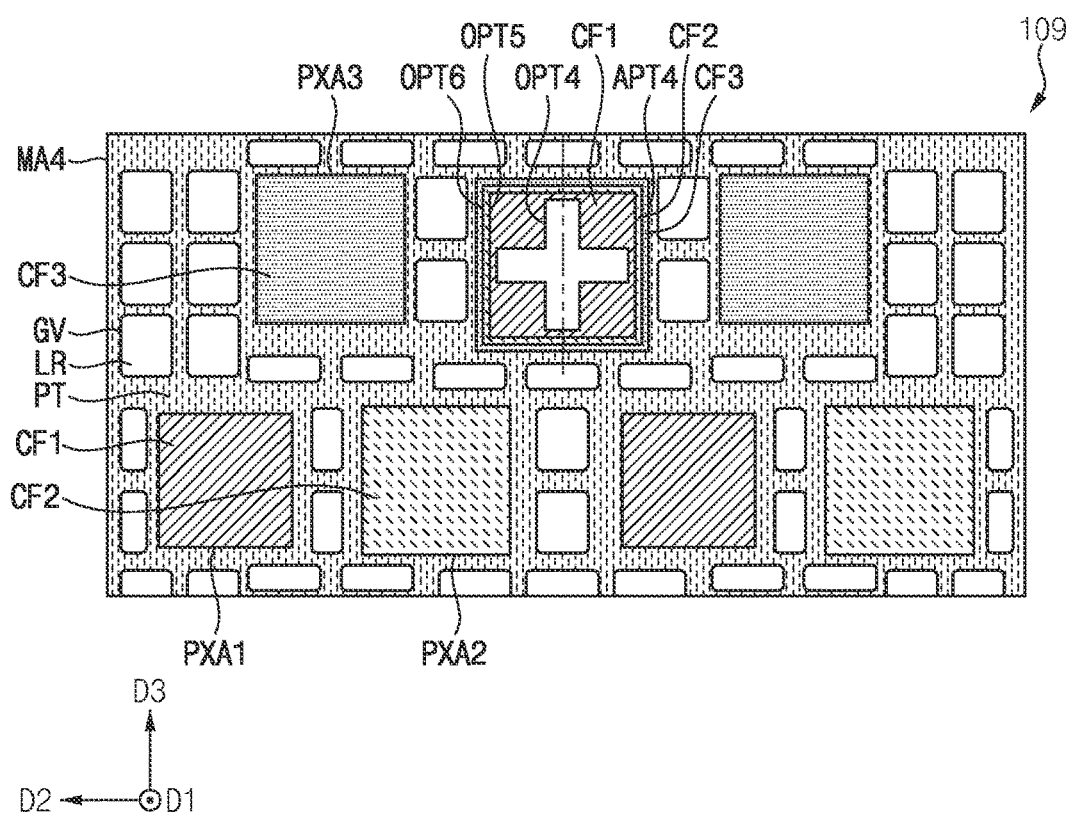

Referring to FIG. 34, a color conversion panel 109 may include a first color filter layer CF1, a second color filter layer CF2, a third color filter layer CF3, a low refractive index layer, and a partition layer PT.

Each of the fourth opening pattern OPT4, the fifth opening pattern OPT5, the sixth opening pattern OPT6, and the fourth alignment pattern APT4 may be symmetric with respect to an axis passing through a center of the fourth alignment pattern APT4. The axis may extend in the third direction D3. However, the present disclosure is not limited thereto, and the axis may extend in the second direction D2 or a diagonal direction.

The fourth alignment pattern APT4 may partially expose at least one of the first color filter layer CF1, the second color filter layer CF2, and the third color filter layer CF3. For example, the fourth alignment pattern APT4 may expose all of the first to third color filter layers CF1, CF2, and CF3. However, the present disclosure is not limited thereto.

The fourth opening pattern OPT4 may have a cross shape opening. Accordingly, the first color filter layer CF1 may be exposed in a relatively large area. Accordingly, the color conversion panel 109 can relatively effectively prevent external light reflection.

Although the fourth measurement area MA4 has been described as a reference, when the fifth measurement area MA5 is measured, the spacer CS may be measured using the same patterns as the partition layer PT in FIG. 34.

Figure 35:
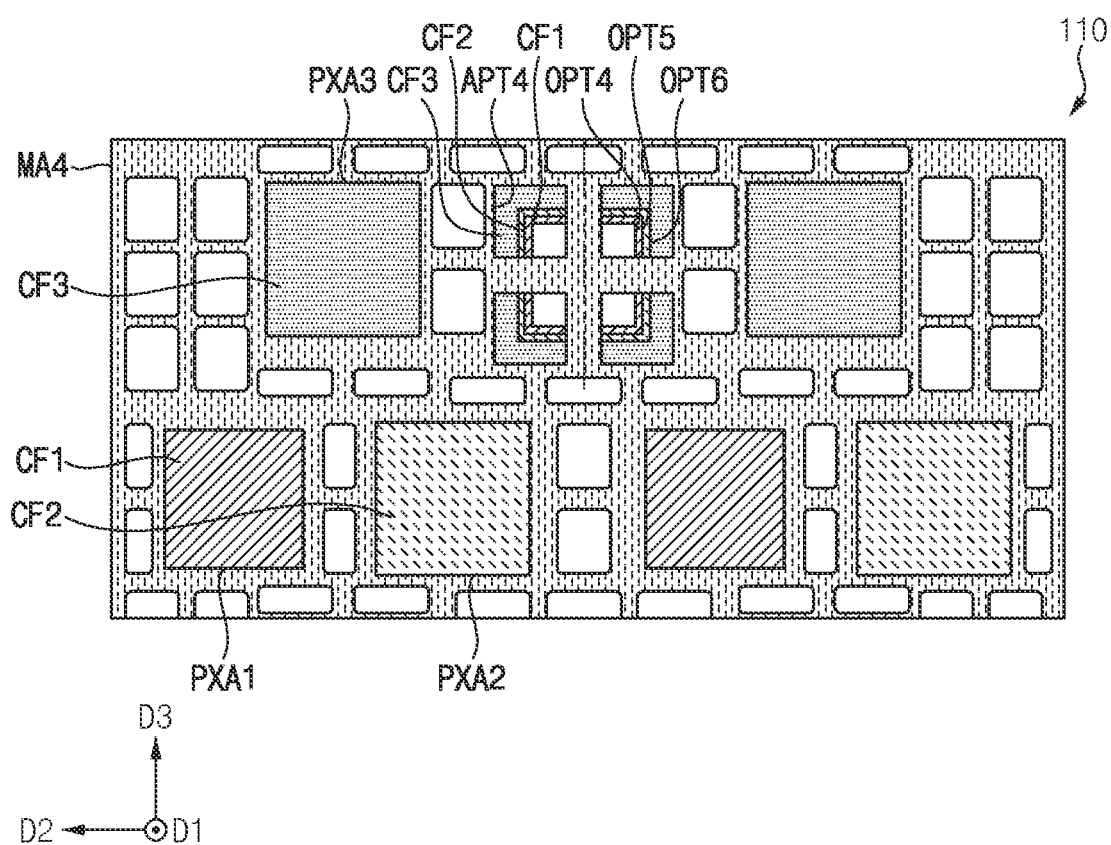

Referring to FIG. 35, a color conversion panel 110 may include a first color filter layer CF1, a second color filter layer CF2, a third color filter layer CF3, a low refractive index layer, and a partition layer PT.

Each of the fourth opening pattern OPT4, the fifth opening pattern OPT5, the sixth opening pattern OPT6, and the fourth alignment pattern APT4 may be symmetric with respect to an axis passing through a center of the fourth alignment pattern APT4. The axis may extend in the third direction D3. However, the present disclosure is not limited thereto, and the axis may extend in the second direction D2 or a diagonal direction.

The fourth alignment pattern APT4 may include sub-alignment patterns that have a rectangular shape and are symmetrical with respect to the axis. Accordingly, a cross-shaped pattern overlapping the fourth alignment pattern APT4 may be defined on the partition layer PT.

The fourth alignment pattern APT4 may partially expose at least one of the first color filter layer CF1, the second color filter layer CF2, and the third color filter layer CF3. For example, the fourth alignment pattern APT4 may expose all of the first to third color filter layers CF1, CF2, and CF3. However, the present disclosure is not limited thereto.

Although the fourth measurement area MA4 has been described as a reference, when the fifth measurement area MA5 is measured, the spacer may be measured using the same patterns.

Figure 36A:
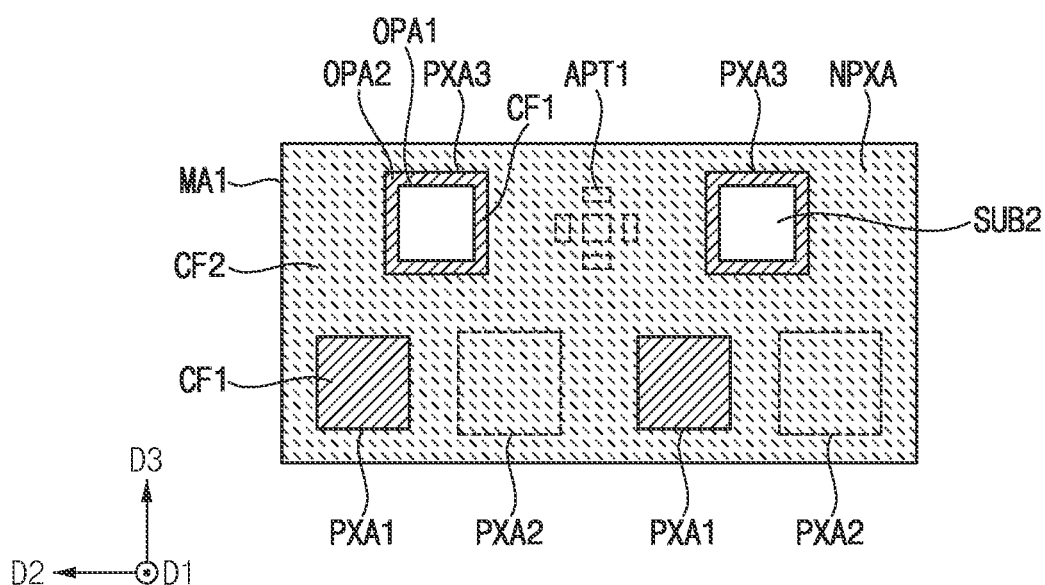
FIGS. 36A, 36B and 36C are plan views illustrating another example of FIG. 9.
Figure 36B:
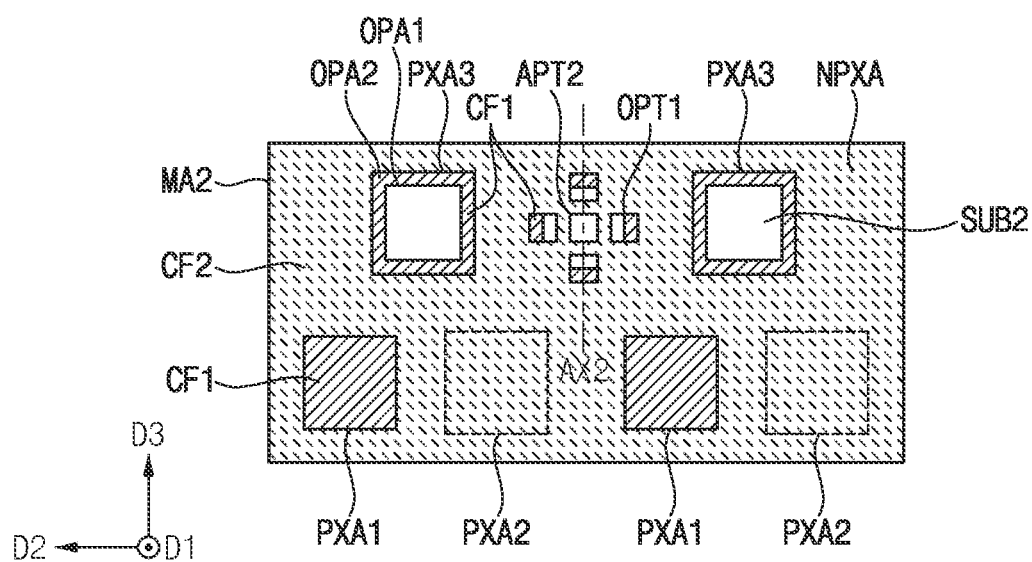
Figure 36C:
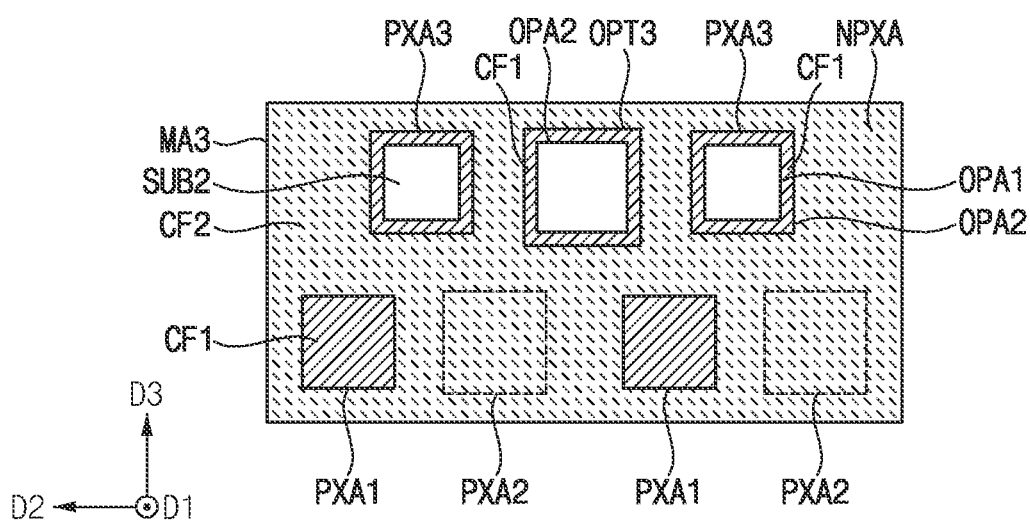

FIGS. 36A, 36B and 36C may otherwise be referred to as FIG. 36. FIG. 36 is a plan view illustrating another example of FIG. 9.

Among the embodiments described with reference to FIG. 36, portions overlapping with those of the embodiment described with reference to FIG. 9 may be omitted.

Referring to FIG. 36, the first color filter layer CF1 may be disposed in an entirety of the active area AA on the second substrate SUB2. The first color filter layer CF1 may overlap the first pixel areas PXA1 and may not overlap the second pixel areas PXA2 and the third pixel areas PXA3. That is, openings overlapping the second pixel areas PXA2 and the third pixel areas PXA3 may be included in the first color filter layer CF1.

The second color filter layer CF2 may be disposed in an entirety of the active area AA on the first color filter layer CF1. The second color filter layer CF2 may overlap the second pixel areas PXA2 and may not overlap the first pixel areas PXA1 and the third pixel areas PXA3. That is, openings overlapping the first pixel areas PXA1 and the third pixel areas PXA3 may be included in the second color filter layer CF2.

In an embodiment, first opening areas OPA1 respectively overlapping the third pixel areas PXA3 may be defined in the first color filter layer CF1. Similarly, second opening areas OPA2 respectively overlapping the third pixel areas PXA3 may be defined in the second color filter layer CF2.

An area of each of the second opening areas OPA2 may be greater than an area of each of the first opening areas OPA1. Accordingly, the first color filter layer CF1 adjacent to the first opening areas OPA1 may be exposed through the second opening areas OPA2.

In an embodiment, a plurality of color filter layers are on the substrate, including the first color filter layer defining in the non-pixel area a first alignment pattern APT1, and a first opening (OPT1) spaced from the first alignment pattern, the first pixel area and the second pixel area, a second color filter layer defining in the non-pixel area, a second alignment pattern APT2 which overlaps the first opening (OPT1), and a third color filter defining in the non-pixel area, a third alignment pattern APT3 which overlaps the second opening (OP2) of the first color filter layer and overlaps the third opening (OPT3) of the second color filter layer.

In an embodiment, within the non-pixel area, the second alignment pattern APT2 includes a solid portion of the second color filter layer within the first opening (OPT1) of the first color filter layer (FIG. 10), and the solid portion of the second color filter layer in the first opening of the first color filter layer is coplanar with the first color filter layer, and the third alignment pattern APT3 includes a solid portion of the third color filter layer within the second opening (OPT2) of the first color filter layer (FIG. 13) and the solid portion of the third color filter layer in the second opening of the first color filter layer is coplanar with the first color filter layer.

Referring to FIGS. 5, 9 and 12, a total planar area of the first alignment pattern APT1 includes a first axis AX1 including a center of the total planar area of the first alignment pattern, a total planar area of the second alignment pattern ATP2 includes a second axis AX2 including a center of the total planar area of the second alignment pattern, a total planar area of the third alignment pattern APT3 include a third axis AX3 including a center of the total planar area of the third alignment pattern, and each of the second opening (OPT2) of the first color filter layer, the third opening (OPT3) of the second color filter layer, and the third alignment pattern APT3 of the third color filter layer, is symmetrical with respect to the third axis AX3.

In an embodiment, the first color filter layer defines in the non-pixel area, a first partition layer measurement opening (OPT4) spaced from the first pixel area and the second pixel area, the second color filter layer defines in the non-pixel area, a second partition layer measurement opening (OPT5) corresponding to the first partition layer measurement opening, the third color filter layer defines in the non-pixel area, a third partition layer measurement opening (OPT6) corresponding to the first and second partition layer measurement openings, and the partition layer defines in the non-pixel area, a partition layer measurement alignment pattern (APT4). The partition layer measurement alignment pattern (APT4) of the partition layer overlaps the first partition layer measurement opening (OPT4) in the first color filter layer and the second partition layer measurement opening (OPT5) in the second color filter layer, and visually exposes at least one of the first color filter layer and the second color filter layer to outside the partition layer.

Referring to FIG. 28, at the partition layer measurement alignment pattern (APT4) of the partition layer, the low refractive index layer includes a first portion P1 which is outside the first partition layer measurement opening (OPT4) in the first color filter layer and the second partition layer measurement opening (OPT5) in the second color filter layer, and a second portion P2 which is within the first partition layer measurement opening (OPT4) in the first color filter layer and in the second partition layer measurement opening (OPT5) in the second color filter layer.

Referring to FIGS. 29 and 30, the first color filter layer further defines in the non-pixel area, a first spacer layer measurement opening (OPT7), the second color filter layer further defines in the non-pixel area, a second spacer layer measurement opening (OPT5), the third color filter layer further defines in the non-pixel area, and a third spacer layer measurement opening (OPT5), the partition layer further defines in the non-pixel area, a fourth spacer layer measurement opening (OPT10). The first to fourth spacer layer measurement openings (OPT7 to OP10) overlap each other and are spaced from the first to third pixel areas. The spacer includes a spacer layer measurement alignment pattern (APT5) which overlaps the first to fourth spacer layer openings, and visually exposes at least one of the first color filter layer, and the second color filter layer and the third color filter layer, to outside the spacer layer (CS and SCS).

Referring to FIGS. 27 and 29, a total planar area of the partition layer measurement alignment pattern (APT4) includes a first axis (AX4) including a center of the total planar area of the partition layer measurement alignment pattern, each of the first to third partition layer measurement openings (OPT4 to OPT6) and the partition layer measurement alignment pattern (APT4) is symmetrical with respect to the first axis, a total planar area of the spacer layer measurement alignment pattern (APT5) includes a second axis (AX5) including a center of the total planar area of the spacer layer measurement alignment pattern, and each of the first to fourth spacer layer measurement openings (OPT7 to OPT10) and the spacer layer measurement alignment pattern (APT5) is symmetrical with respect to the second axis.

The color conversion panel and the display device 10 which has the color conversion panel, according to one or more embodiment, may be applied to a display device 10 included in a computer, a notebook, a mobile phone, a smartphone, a smart pad, a PMP, a PDA, an MP3 player, or the like.

Although embodiments of the color conversion panel and the display device have been described with reference to the drawings, the illustrated embodiments are examples, and may be modified and changed by a person having ordinary knowledge in the relevant technical field without departing from the technical spirit described in the following claims.

What is claimed is:
1. A color conversion panel comprising:
   a substrate including:
      a display area including a color conversion layer, and
      within the display area, a first pixel area, a second pixel area, and a non-pixel area which is between the first pixel area and the second pixel area; and a plurality of color filter layers on the substrate, including:
  a first color filter layer in the first pixel area,
    the first color filter layer defining in the non-pixel area:
      a first alignment pattern, and
      a first opening spaced apart from the first alignment pattern, the first pixel area and the second pixel area;
  a second color filter layer on the first color filter layer, in the second pixel area and covering the first alignment pattern of the first color filter layer; and
    the second color filter layer defining in the non-pixel area, a second alignment pattern which overlaps the first opening of the first color filter layer and exposes a portion of the first color filter layer at the first opening, to outside the second color filter layer.

2. The color conversion panel of claim 1, wherein within the non-pixel area:
  the second alignment pattern includes a solid portion of the second color filter layer within the first opening of the first color filter layer, and
  the solid portion of the second color filter layer in the first opening of the first color filter layer is coplanar with the first color filter layer.

3. The color conversion panel of claim 1, wherein the plurality of color filter layers on the substrate further includes a third color filter layer, on the second color filter layer.

4. The color conversion panel of claim 3, wherein
the display area further includes a third pixel area, the non-pixel area extending between the first pixel area, the second pixel area and the third pixel area, and
the first color filter layer further defines within the non-pixel area, a second opening spaced apart from the first alignment pattern and the first to third pixel areas,
the second color filter layer further defines within the non-pixel area, a third opening which overlaps the second opening of the first color filter layer and exposes a portion of the first color filter layer at the second opening, to outside the second color filter layer,
the third color filter layer is in the third pixel area and covers the second alignment pattern of the second color filter layer, and
the third color filter layer defines in the non-pixel area a third alignment pattern which overlaps the second opening of the first color filter layer, overlaps the third opening of the second color filter layer, and exposes a portion of the first color filter layer at the second opening, to outside the third color filter layer.

5. The color conversion panel of claim 4, wherein
the third alignment pattern includes a solid portion of the third color filter layer within the second opening of the first color filter layer and
the solid portion of the third color filter layer in the second opening of the first color filter layer is coplanar with the first color filter layer.

6. The color conversion panel of claim 4, further comprising:
  a partition layer on the third color filter layer and covering the third alignment pattern of the third color filter layer.

7. The color conversion panel of claim 6, further comprising:
  a spacer layer on the partition layer, and
  a spacer of the spacer layer in the non-pixel area.

8. The color conversion panel of claim 7, wherein the spacer includes a quadrangular shape or a frame shape solid portion of the spacer layer which defines a quadrangular shape opening.

9. The color conversion panel of claim 4, wherein
a total planar area of the first alignment pattern includes a first axis including a center of the total planar area of the first alignment pattern,
the first alignment pattern is symmetrical with respect to the first axis,
a total planar area of the second alignment pattern includes a second axis including a center of the total planar area of the second alignment pattern,
each of the first opening of the first color filter layer and the second alignment pattern of the second color filter layer, is symmetrical with respect to the second axis,
a total planar area of the third alignment pattern includes a third axis including a center of the total planar area of the third alignment pattern, and
each of the second opening of the first color filter layer, the third opening of the second color filter layer, and the third alignment pattern of the third color filter layer, is symmetrical with respect to the third axis.

10. A color conversion panel comprising:
a substrate including:
  a display area including a color conversion layer, and
  within the display area, a first pixel area, a second pixel area, and a non-pixel area which is between the first pixel area and the second pixel area; and
a plurality of color filter layers on the substrate, including:
  a first color filter layer in the first pixel area;
  the first color filter layer defining in the non-pixel area, a first partition layer measurement opening spaced apart from the first pixel area and the second pixel area;
  a second color filter layer in the second pixel area; and
  the second color filter layer defining in the non-pixel area, a second partition layer measurement opening corresponding to the first partition layer measurement opening;
a low refractive index layer on the second color filter layer and through which the plurality of color filter layers are visible, the low refractive index layer having a refractive index lower than a refractive index of the color conversion layer; and
a partition layer on the low refractive index layer, the partition layer defining in the non-pixel area, a partition layer measurement alignment pattern,
wherein the partition layer measurement alignment pattern of the partition layer overlaps the first partition layer measurement opening in the first color filter layer and the second partition layer measurement opening in the second color filter layer, and visually exposes at least one of the first color filter layer and the second color filter layer to outside the partition layer.

11. The color conversion panel of claim 10, wherein at the partition layer measurement alignment pattern of the partition layer, the low refractive index layer includes:
  a first portion which is outside the first partition layer measurement opening in the first color filter layer and the second partition layer measurement opening in the second color filter layer, and
  a second portion which is within the first partition layer measurement opening in the first color filter layer and in the second partition layer measurement opening in the second color filter layer, and
  with respect to the substrate, a height of the first portion is less than a height of the second portion.

12. The color conversion panel of claim 10, further comprising:
a third color filter layer between the second color filter layer and the low refractive index layer.

13. The color conversion panel of claim 12, wherein
the display area further includes third pixel area, the non-pixel area extending between the first pixel area, the second pixel area and the third pixel area,
the third color filter layer is in the third pixel area,
the third color filter layer defines in the non-pixel area, a third partition layer measurement opening corresponding to the first and second partition layer measurement openings and to the partition layer measurement alignment pattern of the partition layer, and
the partition layer measurement alignment pattern of the partition layer visually exposes at least one of the first color filter layer, the second color filter layer and the third color filter layer to outside the partition layer.

14. The color conversion panel of claim 13, further comprising:
a spacer layer on the partition layer, and
a spacer of the spacer layer covering the partition layer measurement alignment pattern of the partition layer.

15. The color conversion panel of claim 14, wherein
the first color filter layer further defines in the non-pixel area, a first spacer layer measurement opening,
the second color filter layer further defines in the non-pixel area, a second spacer layer measurement opening,
the third color filter layer further defines in the non-pixel area, a third spacer layer measurement opening,
the partition layer further defines in the non-pixel area, a fourth spacer layer measurement opening,
the first to fourth spacer layer measurement openings overlapping each other and spaced from the first to third pixel areas, and
the spacer includes a spacer layer measurement alignment pattern which overlaps the first to fourth spacer layer openings, and visually exposes at least one of the first color filter layer, and the second color filter layer and the third color filter layer, to outside the spacer layer.

16. The color conversion panel of claim 15, wherein at the spacer layer measurement alignment pattern, the low refractive index layer includes:
a third portion which is outside the first to fourth spacer layer measurement openings,
a fourth portion which is within the first to fourth spacer layer measurement openings overlapping each other, and
with respect to the substrate, a height of the third portion is less than a height of the fourth portion.

17. The color conversion panel of claim 15, wherein
a total planar area of the partition layer measurement alignment pattern includes a first axis including a center of the total planar area of the partition layer measurement alignment pattern,
each of the first to third partition layer measurement openings and the partition layer measurement alignment pattern is symmetrical with respect to the first axis,
a total planar area of the spacer layer measurement alignment pattern includes a second axis including a center of the total planar area of the spacer layer measurement alignment pattern, and
each of the first to fourth spacer layer measurement openings and the spacer layer measurement alignment pattern is symmetrical with respect to the second axis.

18. A display device comprising:
a display panel including a display area, and
a color conversion panel on the display panel, the color conversion panel including:
a color conversion layer in the display area,
within the display area, a first pixel area, a second pixel area, a third pixel area and a non-pixel area which is between the first to third pixel areas; and
a plurality of color filter layers on the display panel, including:
a first color filter layer in the first pixel area;
the first color filter layer defining in the non-pixel area, a first alignment pattern, a first opening and second opening, spaced apart from each other and from the first pixel area and the second pixel area;
a second color filter layer closer to the display panel than the first color filter layer, in the second pixel area, and covering the first alignment pattern;
the second color filter layer defining in the non-pixel area,
a second alignment pattern which overlaps the first opening and exposes the first color filter layer to outside the second color filter layer, and
a third opening which overlaps the second opening and exposes the first color filter layer to outside the second color filter layer;
a third color filter layer closer to the display panel than both the first and second color filter layers, in the third pixel area and covering the second alignment pattern; and
the third color filter layer defining in the non-pixel area, a third alignment pattern overlapping the second opening and the third opening, and exposing the first color filter layer to outside the third color filter layer.

19. The display device of claim 18, wherein the display panel includes a light emitting diode disposed in each of the first to third pixel areas.

20. The display device of claim 18, wherein
the color conversion layer of the color conversion panel is closer to the display panel than the plurality of color filter layers, and
the color conversion layer includes:
a transmission pattern, a first color conversion pattern and a second color conversion pattern,
the transmission pattern corresponding to the first pixel area,
the first color conversion pattern corresponding to the second pixel area, and
the second color conversion pattern corresponding to the third pixel area.

* * * * *